US007243292B1

(12) United States Patent
Näslund et al.

(10) Patent No.: US 7,243,292 B1
(45) Date of Patent: Jul. 10, 2007

(54) ERROR CORRECTION USING FINITE FIELDS OF ODD CHARACTERISTICS ON BINARY HARDWARE

(75) Inventors: Mats Näslund, Vällingby (SE); Rolf Blom, Järfälla (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 297 days.

(21) Appl. No.: 10/271,945

(22) Filed: Oct. 17, 2002

(51) Int. Cl.
*H03M 13/00* (2006.01)

(52) U.S. Cl. ....................... 714/781; 714/782; 714/784

(58) Field of Classification Search ......... 714/781–785
See application file for complete search history.

(56) References Cited

U.S. PATENT DOCUMENTS 4,354,228 A * 10/1982 Moore et al. ................. 712/13
4,891,781 A * 1/1990 Omura ....................... 708/670
5,712,861 A * 1/1998 Inoue et al. ................ 714/752
6,349,318 B1 * 2/2002 Vanstone et al. ........... 708/492

OTHER PUBLICATIONS

Stephen b. Wicker, Error control Systems for Digital Communication and Storage, Prentice-Hall, 1995, pp. 108-119 and 176-191.*

* cited by examiner

*Primary Examiner*—Joseph D. Torres

(57) ABSTRACT

Binary data representing a code word of an error-correcting code is used for calculating a syndrome, wherein a given portion of the binary data comprises k groups of data bits and represents a field element of the finite field GF($p^k$), p being an odd prime number, the field element comprising k coefficients in accordance with a polynomial basis representation, each group of data bits of the given portion representing a corresponding one of the k coefficients. The given portion, is stored in a first general purpose register and is processed such that the k groups of data bits of the given portion are processed in parallel; determining whether the syndrome is equal to zero; and detecting and correcting errors in the binary data if the syndrome is not equal to zero.

30 Claims, 29 Drawing Sheets

FIG. 4 $p=2^m-1$ case

FIG. 5 $p=2^m-1$ case

Exemplary DLOG Table for GF($3^2$)
$p=2^m-1$, $m=2$, $g(t)=t$, $p(t)=t^2+t+2$

1000

| x=DLOG(a(t)) in binary (1003) | a(t) in binary (1001) |
|---|---|
| -- | 000000 |
| 000 | 000001 |
| 100 | 000010 |
| -- | 000011 |
| -- | 000100 |
| -- | 000101 |
| -- | 000110 |
| -- | 000111 |
| 001 | 001000 |
| 111 | 001001 |
| 110 | 001010 |
| 001 | 001011 |
| -- | 001100 |
| -- | 001101 |
| -- | 001110 |
| -- | 001111 |
| 101 | 010000 |
| 010 | 010001 |
| 011 | 010010 |
| • | • |
| • | • |
| • | • |
| -- | 111111 |

guard bits 1005

| a(t) | x |
|---|---|
| 0 | -- |
| 1 | 0 |
| 2 | 4 |
| 0 | -- |
| -- | -- |
| -- | -- |
| -- | -- |
| -- | -- |
| t | 1 |
| t+1 | 7 |
| t+2 | 6 |
| t | 1 |
| -- | -- |
| -- | -- |
| -- | -- |
| -- | -- |
| 2t | 5 |
| 2t+1 | 2 |
| 2t+2 | 3 |
| • | • |
| • | • |
| • | • |
| -- | -- |

FIG. 10B

Exemplary ANTILOG Table for $GF(3^2)$
$p=2^m-1$, $m=2$, $g(t)=t$, $p(t)=t^2+t+2$

1100

| a(t)=ANTILOG(X) in binary (1103) | x in binary (1101) |
|---|---|
| 000001 | 000 |
| 001000 | 001 |
| 010001 | 010 |
| 010010 | 011 |
| 000010 | 100 |
| 010000 | 101 |
| 001010 | 110 |
| 001001 | 111 |

guard bits 1105

| a(t) | x |
|---|---|
| 1 | 0 |
| t | 1 |
| 2t+1 | 2 |
| 2t+2 | 3 |
| 2 | 4 |
| 2t | 5 |
| t+2 | 6 |
| t+1 | 7 |

FIG. 11B

FIG. 14 $p=2^m+1$ case

FIG. 15 p=$2^m$+1 case

2200

ERROR CORRECTION USING FINITE FIELDS OF ODD CHARACTERISTICS ON BINARY HARDWARE

CROSS REFERENCE TO RELATED APPLICATIONS

The present application is related to U.S. patent application entitled "Efficient arithmetic in finite fields of odd characteristic on binary hardware", Ser. No. 10/271,730, and to U.S. patent application entitled "Cryptography using finite fields of odd characteristic on binary hardware", Ser. No. 10/271,947, both filed even date herewith, the disclosures of which are incorporated herein by reference in their entirety.

BACKGROUND

1. Field of the Invention

The present invention relates to methods and apparatuses for efficiently carrying out computations in finite fields of odd prime characteristic on binary hardware. The invention is particularly useful for carrying out such computations in cryptography and in error correction, but is not limited to such uses.

2. Background Information

Some Basic Aspects of Finite Fields

A finite field (also called a Galois field) is a finite algebraic structure, possessing two well-defined operations: an "addition" and a "multiplication". A finite field with N elements exists if and only if N is the power of a prime number, i.e. $N=p^n$ for some prime p=2, 3, 5, . . . such as discussed in R. Lidl and H. Niederriter, *Introduction to Finite Fields and Their Applications*, Cambridge University Press, Cambridge, Revised ed., 1994. This field is unique up to an isomorphism and is normally denoted $GF(p^n)$. For a prime p, the ground field GF(p) is simply the integers under addition and multiplication modulo p. In general, if F is a field of $q=p^k$ elements (i.e. $F=GF(p^k)$), the extension field of degree l can be defined, denoted as F[t]/(f(t)), where f(t) is a polynomial of degree l, irreducible over F. This extension field may also be referred to as $GF(p^{lk})$. This then gives (the unique) finite field of $q^l$ elements. In other words, this is the field of $p^{lk}=p^n$ elements. The number p is called the characteristic of the field. The well-known fact that the two fields of the same size are isomorphic does not necessarily mean that the mapping between the fields is trivial. However, constructions of such mappings are not necessary for the present invention and, in any event, are within the purview of one of ordinary skill in the art and are discussed in textbooks, such as *Introduction to Finite Fields and Their Applications* referred to above.

There are two predominant ways to represent a finite field. One representation is the normal basis representation well known to those of ordinary skill in the art and such as described in *Introduction to Finite Fields and Their Applications* referred to above. The main advantage with a normal basis is that it facilitates multiplying elements by themselves, i.e. squaring-type operations. The normal basis representation is not discussed further here. Some computational aspects associated with normal basis representations are discussed in U.S. Pat. No. 4,587,627 (Computational method and apparatus for finite field arithmetic), U.S. Pat. No. 4,567,600 (Method and apparatus for maintaining the privacy of digital messages conveyed by public transmission), and U.S. Pat. No. 5,854,759 (Method and apparatus for efficient finite field basis conversion), the entire contents of each of which are incorporated herein by reference.

Another representation is known as the polynomial basis representation. In this representation, field elements of $GF(p^k)$ may be thought of as polynomials of degree at most k−1 whose coefficients are field elements of the ground field GF(p), i.e., integers in the set (0, . . . , p−1). A typical element, γ, in the field can therefore be expressed as $$\gamma=\gamma_{k-1}t^{k-1}+\ldots+\gamma_1 t+\gamma_0, \tag{1}$$

for some integers $\gamma_i$ where $0\leqq\gamma_i\leqq p-1$, and where t is a formal variable. The field element γ may also be viewed as the k-dimensional vector $(\gamma_{k-1}, \ldots, \gamma_1, \gamma_0)$, and the polynomial basis representation as referred to herein is intended to encompass this view. Another aspect of the polynomial basis representation is the choice of a polynomial h(t) of degree k and irreducible over GF(p) that is utilized in multiplication of field elements. This will be discussed in greater detail below. Because any two fields of the same size are isomorphic, it does not matter which irreducible h(t) is chosen. From system point of view, h(t) is a system parameter that is agreed upon for the particular use in mind.

As noted above, an extension field of degree l over the field $F=GF(p^k)$ can be denoted as F[t]/(f(t)) or as $GF(p^{lk})$. An element of the extension field can be viewed as a polynomial of degree at most l−1 whose coefficients are elements of $GF(p^k)$. In other words, an element of the extension field may be viewed as a polynomial with other polynomials as field coefficients. An element γ of the extension field can be written as $$\gamma=\gamma_{l-1}t^{l-1}+\ldots+\gamma_1 t+\gamma_0, \tag{2}$$

where each $\gamma_j$ is a polynomial of degree at most k−1 having coefficients in the set (0, . . . , p−1). Thus, the polynomials $\gamma_j$ can be written as $$\gamma_j=\gamma_{k-1,j}u^{k-1}+\ldots+\gamma_{1,j}u+\gamma_{0,j} \tag{3}$$

where another formal variable, u, has been chosen for these polynomials to avoid confusing them with the extension-field polynomial, whose formal variable is t. This extension-field formulation using a polynomial basis representation will be used to describe the present invention.

The sum of two elements α, β in $GF(p^k)$ is defined by simply adding the corresponding polynomials (or, equivalently, vectors):

$$\alpha+\beta=(\alpha_{k-1}+\beta_{k-1})t^{k-1}+\ldots+(\alpha_1+\beta_1)t+(\alpha_0+\beta_0), \tag{4}$$

where each (integer) coefficient $(\alpha_i+\beta_i)$ is computed modulo p. The complexity (in terms of the number of modulo-p operations) of adding two elements by directly using the definition in equation 4 above is equal to k. For example, for the finite field $GF(3^2)$ where p=3, a field element α=(2, 1) in vector notation can be written as the polynomial α=2t+1, and a field element β=(2, 2) in vector notation can be written as the polynomial β=2t+2. The sum of these field elements is (α+β)=(2+2)t+(1+2) where each coefficient is evaluated modulo 3 (mod 3). Thus, the sum reduces to (α+β)=t because 4 mod 3=1 and 3 mod 3=0. In vector notation, the sum is (1, 0).

The product of two field elements is defined by forming their product modulo h(t), where h(t) is a polynomial of degree k and irreducible (i.e., cannot be factored) over GF(p):

$$\alpha\cdot\beta=\delta_{2k-2}t^{2k-2}+\delta_{2k-3}t^{2k-3}+\ldots+\delta_1 t+\delta_0 \bmod h(t) \tag{5}$$

where $\delta_i=\Sigma_j\alpha_j\beta_{i-j}$ mod p. Here "mod h(t)" means taking the remainder when dividing by h(t), using standard polynomial division. This leaves the result with a degree strictly less that that of h(t), i.e. less than k, as desired. The complexity of multiplying two elements according to this definition is clearly on the order of $k^2$. Alternatively, using the Karatsuba algorithm known to those of ordinary skill in the art, multiplication can (asymptotically in k) be performed with roughly $k^{1.6}$ operations, but this algorithm involves more administration of the computations. The Karatsuba algorithm is, therefore, only beneficial for large values of k, for example, k>100, as noted in §4.4.3 of D. Knuth, *Seminumerical Algorithms*, Vol. 2 of *The Art of Computer Programming*, 2nd ed, Addison-Wesley, Reading, Mass., 1981.

As an example, to multiply the field elements $\alpha=(2, 1)$ and $\beta=(2, 2)$ of finite field $GF(3^2)$, a polynomial h(t) of degree k=2 and irreducible over GF(3) must be chosen, and the polynomials 2t+1 and 2t+2 are then multiplied modulo h(t). An appropriate irreducible polynomial is $h(t)=t^2+t+2$. Then, $\alpha\cdot\beta=(4t^2+6t+2) \bmod h(t)=4(t^2+t+2)+2t-6=2t$ (because 2 mod 3=2 and 6 mod 3=0). Thus, $\alpha\cdot\beta=2t$ or (2, 0) in vector notation.

For an extension field (also referred to as a composite field), the formulas for addition and multiplication are the same. However, it is recognized that all coefficient-wise operations are carried out over the ground field, which may itself involve polynomial arithmetic.

Subtraction in a finite field can be done by simply noting that in the field GF(p), the negative of an element x is p−x. Thus, an element x can be replaced with p−x to obtain the negative, and then normal coefficient-wise addition may be carried out to obtain the subtraction. Division can be carried out by multiplying by the inverse as known to those skilled in the art.

Conventional Utilization of Finite Fields

The use of finite fields is central to many applications. In particular, for communication purposes, finite fields are very useful. For example, by embedding messages into a finite field, one can transmit messages so that errors introduced by the transmission medium can be corrected at the receiver end. This is the principle behind error correcting codes. In addition, finite fields can be used to achieve protection (confidentiality, integrity, origin authentication, and non-repudiation) for messages by means of encryption, message authentication, and digital signatures.

To be useful, these coding and encryption operations involving finite fields must be as efficient as possible, especially if the computations are done on a lightweight platform such as a mobile phone or other handheld device. For instance, many cryptographic methods use the following exponentiation operation $$\exp_g(x) = \underbrace{g \cdot g \ \dots \ g}_{(x\ \text{times})} = g^x \tag{6}$$

where g is an element in the multiplicative group of a finite field, x is an integer and "·" denotes multiplication in the finite field. The reason for using the $\exp_g(x)$ function is that $\exp_g(x)$ can be computed with only approximately $(\log_2 x)^3$ field multiplications in the ground field, but no efficient (i.e. polynomial-time in $\log_2 x$) algorithm exists for the inverse transformation—finding x from $\exp_g(x)$. The latter is known as the discrete logarithm problem. In other words, $\exp_g(x)$ is a strong candidate for a so-called one-way function—a function easy to compute, but hard to invert. The discrete logarithm problem is well known to those of ordinary skill in the art and is discussed, for example, in *Handbook of Applied Cryptography* by A. Menezes, P. van Oorschot, and S. A. Vanstone, CRC Press, Boca Raton, Fla., 1997.

However, on a computationally weak platform, even $(\log_2 x)^3$ multiplications may be computationally excessive, and for currently recommended field sizes (e.g., key size) such computations might in many situations take about 30 seconds, for example. A conventional way to improve performance is to restrict the computations to binary finite fields (fields of characteristic two). Restricting computations to binary finite fields improves performance because most available hardware is binary in nature (e.g., CPUs, etc.). Therefore, field operations can be composed of elementary binary operations, such as bitwise XORs, which are directly and efficiently supported by the hardware.

In addition, methods have been devised to improve efficiency by carrying out computations using a binary extension field whose extension degree is a composite number (non-prime), as disclosed in E. De Win, A. Bosselaers, S. Vanderberghe, P De Gersem, and J. Vandewalle, "A fast Software Implementation for Arithmetic Operations in $GF(2^n)$", Advances in Cryptology, Proceedings of Asiacrypt '96, LNCS 1163, Springer-Verlag, Berlin, 1996, pp. 65–76 (hereinafter "De Win et al."). In the De Win et al. method, a standard binary hardware architecture is assumed to be able to perform operations (normal arithmetic and bit-operations) on k bit quantities (i.e., the word length is k bits). It is further noted that for an even characteristic (binary) field where p=2, forming remainders modulo 2 can be done by a simple bit operation.

When n is not a prime number, the finite field $GF(2^n)$ is viewed as a "non-trivial" extension of degree l over $GF(2^k)$, where n=lk, and l,k>1. Thus, an element in the field can be written as $$\gamma=\gamma_{l-1}t^{l-1}+ \dots +\gamma_1 t+\gamma_0, \tag{7}$$

where each $\gamma_i$ is an element of $GF(2^k)$. Adding field elements $\alpha$ and $\beta$ in this representation can be done by carrying out the operation $$\alpha+\beta=(\alpha_{l-1}+\beta_{l-1})t^{l-1}+ \dots +(\alpha_1+\beta_1)t+(\alpha_0+\beta_0). \tag{8}$$

Since $\alpha_i$, $\beta_i$ are elements of $GF(2^k)$, their sum, $\alpha_1+\beta_1$ can be computed as the bitwise XOR between the $\alpha_i$ and $\beta_i$. Thus, if k is small enough to fit in a hardware register (typically $k\leqq 32$), k additions can be performed in parallel using only one operation in hardware, and a factor of k is gained in the speed of executing the addition.

Multiplication using the De Win et al. method is carried out noting that the multiplicative group of $GF(2^k)$ (or any other finite field) is always cyclic, meaning that there is an element g in $GF(2^k)$ so that any non-zero element, $\alpha_j$, in the field can be written as $\alpha_j=g^x$ for some integer $0\leqq x<2^k-1$ (i.e., x is the discrete logarithm of $\alpha_j$, and g is known as the generator). If k is moderately large (e.g., $k\leqq 16$), the generator g can be found by exhaustive search. Also, in this case (e.g., $k\leqq 16$), a table, ANTILOG{x}, of $g^x$ for all x where $0\leqq x<2^k-1$ can be formed. In addition, a table for the discrete logarithms, DLOG{$\alpha_j$}, for all non-zero $\alpha_J$ in the field $GF(2^k)$ can also be formed. That is, $$\text{ANTILOG}\{\text{DLOG}\{\alpha_J\}\}=\alpha_j \tag{9}$$

and $$\text{DLOG}\{\text{ANTILOG}\{x\}\}=x \tag{10}$$

for all such $\alpha_j$ and x. The product of $\alpha$ and $\beta$ in $GF(p^n)$ is computed in accordance with the equation $$\alpha\cdot\beta=\delta_{2l-2}t^{2l-2}+\delta_{2l-3}t^{2l-3}+\ldots+\delta_1 t+\delta_0 \bmod f(t) \quad (11)$$

where $\delta_i=\Sigma_j\alpha_j\beta_{i-j}$ is computed as a sum of products, and all operations take place in the field $GF(2^k)$. Given that $g^x g^y=g^{x+y}$, each term $\alpha_j\beta_{i-j}$ can be computed by three table look-ups in the above-noted pre-computed tables in accordance with the equation $$\alpha_j\beta_{i-j}=\text{ANTILOG}\{\text{DLOG}\{\alpha_j\}+\text{DLOG}\{\beta_{i-j}\} \bmod (2^k-1)\}. \quad (12)$$

The memory requirement is about $k\cdot 2^{k-2}$ bytes, and the number of operations to perform the multiplication is on the order of $l^2=(n/k)^2$. A factor of $k^2$ is thus gained in speed. The approach requires pre-computation of the tables and requires memory to store those tables. If k is moderate (e.g., $k\leqq 16$), it is feasible to use this method using on the order of $2^k$ pre-computation operations.

In contrast, for finite fields of odd characteristic p where p is an odd prime, the situation is more complicated than for binary finite fields because the basic operations needed for odd-characteristic finite fields are not modulo-2 operations (bit-operations) but, rather, modulo-p operations. The De Win et al. addition method as described therein, for example, is not applicable to finite fields of odd characteristic (p=3, 5, 7, . . . ), and no similar method for finite fields of odd characteristic has been reported to the knowledge of Applicants. Carrying out odd-characteristic finite-field computations in a conventional manner involves modular arithmetic, which requires long divisions. Most hardware supports modular arithmetic, but only on a word-oriented level. Thus, the above-noted optimizations for computations involving binary finite fields are not realized for computations involving odd-characteristic finite fields.

For the above noted reasons, binary finite fields have been the most widely used finite fields in error correction and cryptography. However, Applicants note that restricting such computations to binary fields can have drawbacks. For example, algorithms for inverting the $\exp_g(x)$ function noted above are more efficient if the field has characteristic two (a binary field) than if the field has a characteristic that is odd. Thus, the cryptographic strength of the function $\exp_g(x)$ may be expected to be less for binary fields than for general odd-characteristic finite fields. Indeed, it has recently been suggested that implementing cryptography using finite fields of odd characteristic and composite degree can provide enhanced cryptographic security compared to other cryptographic approaches involving finite fields, and that the gains in cryptographic security can be expected to outweigh the computational costs of such computations (see K. Rubin and A. Silverberg, "Supersingular Abelian Varieties in Cryptology", Crypto 2002, Lecture Notes in Computer Science, Vol. 2442, ed. M. Jung, Springer-Verlag, Berlin, pp. 336–353, 2002). In addition, in the case of binary fields of composite degree where the optimizations described in the De Win et al. article referred to above are applicable, attacks on elliptic curve cryptosystems over such fields have been recently found as described in N. P. Gaudry, F. Hess, and N. P. Smart "Constructive and Destructive Facets of Weil Descent on Elliptic Curves", Technical Report CSTR-00-016, Department of Computer Science, University of Bristol, October 2000, and in N. P. Smart, "How secure are elliptic curves over composite extension fields?", Technical Report CSTR-00-017, Department of Computer Science, University of Bristol, November 2000. Thus, it is advisable to avoid such binary fields of composite degree for encryption. These attacks are much less effective if the finite field has odd characteristic (even if the degree is non-prime), so they are not a relevant threat in that case. However, as noted above, utilizing conventional computational methods involving odd-characteristic finite fields requires sacrificing the computational optimizations that would otherwise be gained using a binary finite field structure.

SUMMARY OF THE INVENTION

Applicants have recognized a need for a computational approach that enables speeding up computations involving basic finite field operations (e.g., addition, multiplication, etc.) for non-binary finite fields even if the available hardware is binary in nature and that reduces need for special modulo-p hardware. In addition, Applicants have recognized a need for a computational approach for non-binary finite fields that utilizes register space more efficiently than conventional methods. For example, it is possible to perform conventional modulo-p arithmetic using a 32-bit CPU, but if p is small (e.g., p=3 or p=7) it is inefficient to devote 32 bits of register space for the operations since the involved quantities (field element coefficients) will only have 2 or 3 significant bits. Applicants have recognized that it would be desirable to make more efficient use of the available register space given that the numbers involved are quite small. The present invention fulfils these and other needs and provides advantages as will become apparent to those of ordinary skill in the art upon reading the detailed description in conjunction with the accompanying drawings.

It should be emphasized that the terms "comprises" and "comprising", when used in this specification, are taken to specify the presence of stated features, integers, steps or components; but the use of these terms does not preclude the presence or addition of one or more other features, integers, steps, components or groups thereof.

In one exemplary aspect of the invention, there is provided an error-correction apparatus comprising an input device (e.g., an input/output device) and a processing unit configured to execute a plurality of operations on binary data intended to represent an allowed code word of an error-correcting code to detect and correct errors in the binary data. A portion of the binary data comprises k groups of data bits and represents a field element of a base field $GF(p^k)$, the field element of the base field $GF(p^k)$ having k base coefficients in accordance with a polynomial basis representation. The value p is an odd prime number. Each group of data bits represents a corresponding one of the k coefficients. The portion of the binary data is stored in a register and is processed by the processing unit such that the k groups of data bits are processed in parallel during at least some of said plurality of operations.

In another exemplary aspect of the present invention, there is provided a method of error-correction. The method comprises receiving binary data intended to represent an allowed code word of an error-correction code and calculating a syndrome based upon the binary data, wherein a given portion of the binary data comprises k groups of data bits and represents a field element of the finite field $GF(p^k)$. The value p is an odd prime number, and the field element comprises k coefficients in accordance with a polynomial basis representation, each group of data bits of the given portion representing a corresponding one of the k coefficients. The given portion of the binary data is stored in a first register and is processed such that the k groups of data bits of the given portion are processed in parallel. The method further comprises determining whether the syndrome is equal to zero. The method also comprises detecting and correcting errors in the binary data if the syndrome is not equal to zero. The detecting and correcting can be carried out by processing an error-containing portion of the binary data such that k groups of data bits of the error-containing portion of the binary data are processed in parallel. In another aspect of the present invention, there is provided an apparatus comprising a memory and a processing unit coupled to the memory for executing the steps of the method. In another aspect of the present invention, there is provided a computer-readable carrier adapted to program a computer to execute the steps of the method. Exemplary forms of a computer-readable carrier include solid-state memory, magnetic disk, optical disk or modulated wave containing an appropriate set of computer instructions that would cause a processor to carry out the above-noted steps. A modulated wave can be, for example, a radio frequency modulated wave, an audio frequency modulated wave, an optical frequency modulated wave, or a modulated binary bit stream that can be downloaded via a network connection or modem.

As used herein, the terminology "in accordance with a polynomial basis representation" is intended to include any representation mathematically equivalent to a polynomial basis representation including, for example, a vector representation.

BRIEF DESCRIPTION OF THE DRAWINGS

FIG. 10A is a schematic illustration of a DLOG look-up table for use in the method illustrated in FIG. 9 according to an exemplary aspect of the present invention.

FIG. 10B is an indexing table that reflects the finite-field elements a(t) and corresponding generator powers n corresponding to the binary information illustrated in FIG. 10A.

FIG. 11A is a schematic illustration of an ANTILOG look-up table for use in the method illustrated in FIG. 9 according to an exemplary aspect of the present invention.

FIG. 11B is an indexing table that reflects the finite-field elements a(t) and corresponding generator powers n corresponding to the binary information illustrated in FIG. 11A.

DETAILED DESCRIPTION OF THE INVENTION

Figure 1:
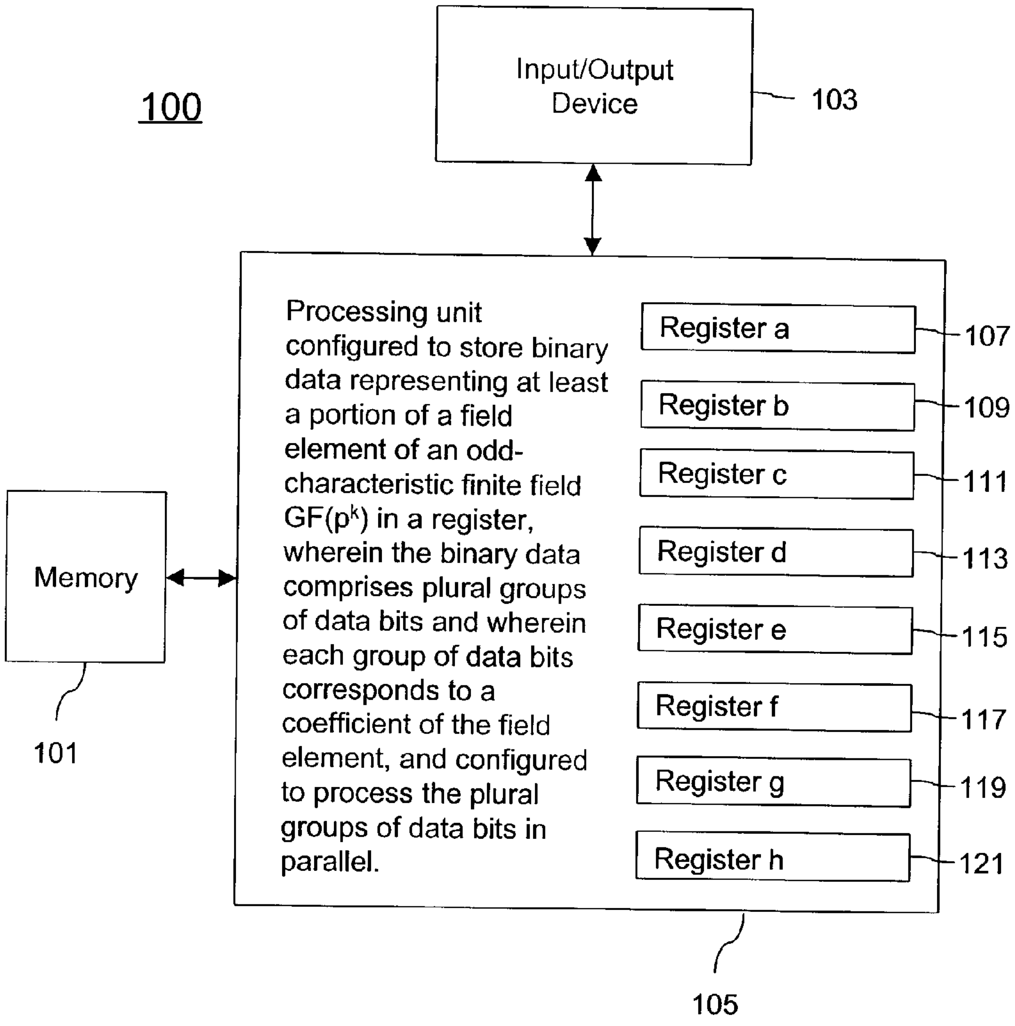
FIG. 1 is a block diagram illustrating a system for carrying out computations involving field elements of an odd-characteristic finite field according to an exemplary aspect of the present invention.

The present invention provides approaches for efficiently carrying out arithmetic and logical operations involving elements of the finite field $GF(p^{lk})$ (an extension field) where p is an odd prime number. As will be discussed in detail below, one aspect of the present invention addresses how data representing elements of the field $GF(p^k)$ are stored in binary hardware and how arithmetic operations are then carried out efficiently. As referred to herein, the finite field $GF(p^k)$ should be understood to mean an odd-characteristic finite field wherein the characteristic p is an odd prime number.

Various aspects of the invention will be described below in greater detail in connection with a number of exemplary embodiments. To facilitate an understanding of the invention, many aspects of the invention are described in terms of actions to be performed by elements of a computer system. Further, it will be recognized that in each of the embodiments, the various actions could be performed by specialized circuits (e.g., discrete logic gates interconnected to perform a specialized function), by program instructions being executed by one or more processors, or by a combination of both. Moreover, the invention can additionally be considered to be embodied entirely within any form of computer-readable carrier such as solid-state memory, magnetic disk, optical disk or modulated wave containing an appropriate set of computer instructions that would cause a processor to carry out the techniques described herein. A modulated wave can be, for example, a radio frequency modulated wave, an audio frequency modulated wave, an optical frequency modulated wave, or a modulated binary bit stream that can be downloaded via a network connection or modem. Thus, the various aspects of the invention may be embodied in many different forms, and all such forms are contemplated to be within the scope of the invention. For each of the various aspects of the invention, any such form of embodiment may be referred to herein as "logic configured to" perform a described action, or alternatively as "logic that" performs a described action.

Before addressing aspects of the invention pertaining to computations involving elements of $GF(p^k)$ themselves, algorithms that relate arithmetic operations in the field $GF(p^k)$ to arithmetic operations in the extension field $GF(p^{lk})$ will first be described.

Given a polynomial f(t) of degree 1, irreducible over $GF(p^k)$, and given that $\alpha(=\Sigma_i\beta_i x^i,\ \alpha_i$ in $GF(p^k))$ and $\beta(=\Sigma_i\beta_i x^1,\ \beta_1$ in $GF(p^k))$ are elements of $GF(p^{lk})$ to be operated on at a high level, algorithms for addition, SUM(α, β), and multiplication, PRODUCT(α, β), in $GF(p^{lk})$ are provided below. The notation GF_p_k_<op>($\alpha_i$, $\beta_j$) in these algorithms denotes a procedure carrying out the operation <op> (add, multiply, etc.) on field elements $\alpha_i$ and $\beta_J$ in the field $GF(p^k)$.

First, an addition algorithm, denoted SUM(α, β), that relates the addition of elements α and β of the extension field $GF(p^k)$ to computations to be carried out in the field $GF(p^k)$ is given below.

```
SUM(α, β):
for i=0 to 1−1 do
    δ1=GF_p_k_ADD(α1, βi)
end
return δl−1 t^(l−1) + δl−2 t^(l−2) + . . . + δ1 t + δ0
```

where GF_p_k_ADD will be described in detail below.

In addition, a multiplication algorithm, denoted PRODUCT(α, β), that relates the multiplication of elements α and β of the extension field $GF(p^{lk})$ to computations to be carried out in the field $GF(p^k)$ is now described. Here it is assumed that necessary initializations of DLOG and ANTILOG tables have already been made. Forms of the DLOG and ANTILOG tables will be described below. In addition, exemplary DLOG and ANTILOG tables are given in FIGS. 10A and 11A for a simple illustration for $GF(3^2)$ to be described later.

```
PRODUCT(α, β):
    for i=0 to 2l−2 do
        δ1=0
        for j=max(0,i−l+1) to min(i, l−1) do
            δ1=GF_p_k_ADD(δi, GF_p_k_MUL(αj, β1−j))
        end
    end
return REDUCE(δ2l−2 t^(2l−2) + δ2l−3 t^(2l−3) + . . . + δ1 t + δ0, f(t))
```

where GF_p_k_MUL and REDUCE(δ, f) (the latter computing z(t) mod f(t)) will be described in detail below.

It should be noted that the above multiplication algorithm is merely one example of possible multiplication algorithms. For large values of l (e.g., l>100), faster performance may be obtained by using Karatsuba's method instead of the simple PRODUCT algorithm above. Karatsuba's method is known to those of ordinary skill in the art and is described, for example, in *Seminumerical Algorithms* referred to above.

Finally, a reduction operation "mod f(t)" necessary for completing the multiplication algorithm, PRODUCT(α, β), can be done with a well-known algorithm given below and denoted as REDUCE(δ, f). This algorithm can also make use of the present inventive approach for efficient arithmetic in the field $GF(p^k)$ to be described. For computational efficiency, f(t) can be chosen to be "sparse", meaning that f(t) has only a few non-zero coefficients (e.g., 3 non-zero coefficients). In this case, f(t) has form $f(t)=f_l t^l+f_j t^j+f_0$ for some j between l and 0. It should be noted, however, that it is not necessary in general for f(t) to have such a sparse. For any value of l, an irreducible polynomial f(t) of degree l can be readily found by methods known to those of ordinary skill in the art. A general approach for determining an irreducible polynomial f(t) may be found in *Seminumerical Algorithms* referred to above, for example. With these comments in mind, the reduction algorithm, denoted REDUCE(δ, f), is as follows.

REDUCE(δ, f)
tmp1=GF_p_k_MUL(GF_p_k_INVERSE($f_l$), $f_0$)
tmp2=GF_p_k_MUL(GF_p_k_INVERSE($f_l$), $f_j$)
for i=2l−2 downto 1 do
  $\delta_{i-l}$=GF_p_k_SUB($\delta_{1-l}$, GF_p_k_MUL(tmp1, $\delta_i$))
  $\delta_{i-l+J}$=GF_p_k_SUB($\delta_{1-l+j}$, GF_p_k_MUL(tmp2, $\delta_i$))
end
return $\delta_{l-1}t^{l-1}+\delta_{l-2}t^{l-2}+ \ldots +\delta_1 t+\delta_0$.

The REDUCE algorithm above is just a normal polynomial division algorithm adapted for the special form of f(t) given above. It should be noted that tmp1 and tmp2 can be pre-computed because they are fixed once the representation is given, that is, once f(t) is defined. The function GF_p_k_SUB refers to field subtraction in the field GF($p^k$), and the function GF_p_k_INVERSE refers to multiplicative inverse computation, both of which are easily implemented given algorithms for GF_p_k_ADD and GF_p_k_MUL and both of which will be described below.

An exemplary apparatus 100 for executing the above-noted algorithms and for implementing other aspects of the invention will now be described with reference to the block diagram of FIG. 1. The apparatus 100 comprises a memory 101 and a processing unit 105 coupled to the memory 101. The apparatus 100 can also comprise an input/output device 103. The processing unit 105 comprises a plurality of registers 107–121, which are controlled by logic circuits (not shown) within the processing unit 105. The processing unit 105 can communicate with the input/output device 103 and the memory 101 via electrical connections (e.g., electrical buses) represented by the arrows shown in FIG. 1. It is also possible for the processing unit 105 to communicate with external registers (not shown) located outside the processing unit 105.

The processing unit 105 can be, for example, any conventional type of processing unit, such as a Pentium-class processor or other CPU typically found in personal computers, or it may be a special purpose processor, such as may be found in wireless phones or other handheld devices. It is common for conventional processors used in personal computers to have eight general purpose registers, such as illustrated by the eight registers 107–121 in FIG. 1 (also denoted as registers a–h). The registers 107 can be, for example, 8-bit registers, 16-bit registers, 32-bit registers, 64-bit registers, etc. Present generation processors for conventional personal computers commonly have 32-bit registers.

The memory 101 can be, for example, any suitable memory capable of storing computer programs, such as a magnetic disk, a CD ROM, a magneto-optical disk, a flash memory, or other types of memory. In addition to storing computer programs, the memory 101 can also be used to store intermediate or final computational results generated by the processing unit 105 and can also be used to store look-up tables to be utilized during computations.

The input/output device 103 can be, for example, any suitable device for passing data to and/or from the processing unit 105, such as a hard-wired modem or network interface, a wireless modem, a second memory, an analog-to-digital/digital-to-analog (AD/DA) converter, or other similar types of devices. Separate input and output devices can be utilized in place of a combined input/output device if desired. In addition, the input/output device 103 can be configured to perform guard-bit insertion and guard-bit removal. Guard-bit insertion and guard-bit removal are described later in relation to FIGS. 8A and 8B, for example.

In one aspect, the memory 101 can store one or more computer programs, and the processing unit 105 can access the memory 101 to execute steps of the computer program(s). These computer programs can include, for example, programs representing the algorithms noted above and programs implementing other aspects of the invention as described below.

In addition, although a single processing system 100 having a single processing unit 105 is shown in FIG. 1, it should be understood that the processing system 100 can comprise multiple processing units 105. Moreover, it is possible to embody the present invention using multiple processing systems instead of a single processing system 100.

The remainder of the detailed description will focus on describing the inventive approaches for storing binary data representing field elements of GF($p^k$) in hardware registers and for executing operations on such binary data in a manner to enhance the speed of arithmetic computations involving field elements of GF($p^k$). In this regard, descriptions of the algorithms GF_p_k_ADD and GF_p_k_MUL, which provide for adding and multiplying field elements of the field GF($p^k$), will be described. In addition, other apparatuses for implementing the approaches will also be described.

According to one aspect of the invention, the apparatus 100 illustrated in FIG. 1 can be used to carry out computations involving field elements of an odd-characteristic finite field GF($p^k$) in a manner that enhances computational efficiency compared to conventional approaches for carrying out computations involving field elements of odd-characteristic finite fields. In particular, the processing unit 105 is configured (e.g., programmed) to store binary data representing at least a portion of a field element of an odd-characteristic finite field GF($p^k$) in a register, such as register 107 shown in FIG. 1, wherein p is an odd prime number and wherein the field element comprises k coefficients in accordance with a polynomial basis representation. The processing unit 105 and the register can be viewed as means for storing binary data representing at least a portion of a field element of GF($p^k$). The binary data comprise plural groups of data bits, wherein each group of data bits represents an associated one of the k coefficients. Thus, binary data representing multiple coefficients of a field element of the odd-characteristic finite field GF($p^k$) are packed into a single hardware register according to an aspect of the present invention. In contrast, conventional approaches for carrying out computations involving field elements of odd-characteristic finite fields merely place binary data representing a single coefficient of an odd-characteristic finite field into a single hardware register.

In addition, the processing unit 105 is also configured to execute at least one operation on the contents of the above-noted register 107 such that the plural groups of data bits are processed in parallel. For example, one or more operations can include a shift operation, an addition operation, a binary subtraction operation, a logical AND operation, and a NOT operation (logical negation) to name a few. In this regard, the processing unit 105 can be viewed as means for executing at least one operation on the binary data such that the plural groups of data bits are processed in parallel. Thus, by storing binary data representing multiple coefficients of a field element of GF($p^k$) in a single hardware register and by processing the plural groups of data bits in parallel, the speed of computations according to the present invention can be greatly increased compared to conventional methods for computations involving field elements of odd-characteristic finite fields. For example, if all k coefficients of a field element of $GF(p^k)$ are represented in a single hardware register, such as register 107 shown in FIG. 1, the speed of processing the binary data representing the field element can be increased by a factor of k for addition and $k^2$ for multiplication over conventional methods.

Multiple coefficients of a field element of $GF(p^k)$ can be stored in a single hardware register using two exemplary approaches according to the present invention. These approaches are referred to herein as the single-guard-bit representation and the multiple-guard-bit representation, respectively, each of which has different advantages as will be described below. In describing each of these representations, it is assumed that the hardware architecture is capable of performing basic arithmetic and logical operations on w-bit words, e.g., the hardware registers can be w-bit registers for some $w \geqq k(m+1)$ where binary data representing an entire field element is to be stored in a single register. In conventional terms, this means that the hardware architecture can perform arithmetic and logical operations on binary encoded integers in the range $(0 \ldots 2^w-1)$. In principle, larger values of w are preferable because more information can thereby be processed per operation. Bit positions are numbered from right to left wherein the least significant bit is indexed by "0", the next bit by "1", the next bit by "2", and so on, up to most significant bit (the word size), which is indexed by "w−1".

Figure 2A:
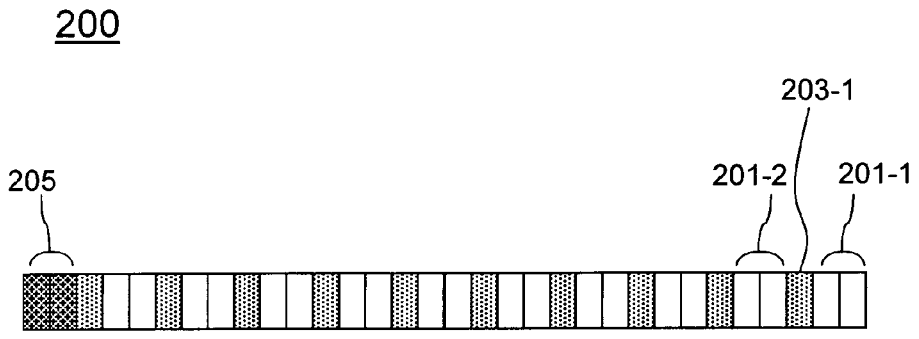
FIG. 2A is a schematic illustration of a hardware register with a data storage scheme configured in a single-guard-bit representation according to an exemplary aspect of the present invention for the example of $GF(3^{10})$.
Figure 2B:
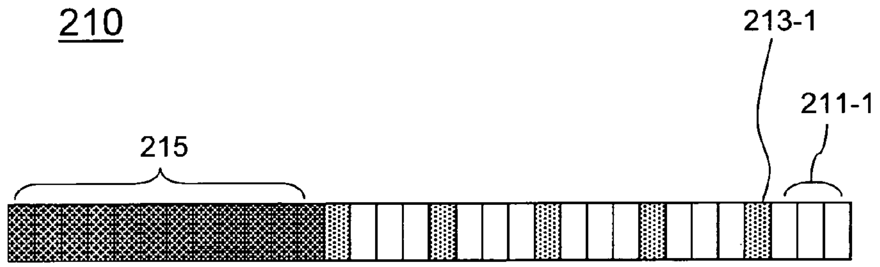
FIG. 2B is another schematic illustration of a hardware register with a data storage scheme configured in a single-guard-bit representation according to an exemplary aspect of the present invention for the example of $GF(7^5)$.

Examples of the single-guard-bit representation are shown in FIGS. 2A and 2B for 32-bit hardware registers. FIG. 2A is a schematic illustration of a hardware register 200 with a data storage scheme for storing binary data representing a field element $\alpha_1=(\alpha_{9,i}, \ldots, \alpha_{1,i}, \alpha_{0,i})$ of $GF(3^{10})$.

In the example of FIG. 2A, ten groups of bit positions 201-*r* (unshaded bit positions, wherein 'r' is the bit position number) are allocated to store ten groups of data bits representing the field coefficients a9,i , . . . , a1,i, a0,i. Two bit positions are allocated for storing the binary data representing each coefficient aj,i (which is sufficient since aj,i£3<22). A group of data bits representing the coefficient a0,i are stored in bit positions zero and one (from the right). Another group of data bits representing the coefficient a1,i are stored in bit positions three and four, and so on. In addition, ten bit positions 203-*r* are allocated to store "guard bits" (lightly shaded regions), which are initially assigned binary values of 0. In the example of FIG. 2A, bit positions two, five, eight, etc. are allocated for guard bits. The guard-bit positions (also referred to as separating-bit positions) serve to separate binary data representing the field coefficients and to accept any carry bit from an immediately preceding group of bit positions 201-*r*. For example, when arithmetic and logical operations are carried out, a carry bit from the group of bit positions 201-1 is prevented from carrying over into the adjacent group of bit positions 201-2 and, instead, carries over into the guard-bit position 203-1. Also, in the Example of FIG. 2A, the two most significant bit positions 205 in the register 200 are unused (darkly shaded regions). Generally, unused bit positions are located at the most significant bit locations. However, unused bit positions can also be located at the least significant bit locations. If the unused bit positions are located at the most significant bit locations, it is not necessary to assign any particular values to the unused bit positions. Otherwise, the unused bit positions must initially be assigned values of zero.

In the example of FIG. 2A for $GF(3^{10})$, the ground field is GF(3), and the following mapping between integer values of each coefficient and corresponding binary data is applicable (the quantities in parentheses are binary data): 0~(0, 0); 1~(0, 1); 2~(1, 0); 3~(1, 1) where 3 also corresponds to 0 (because 3 mod 3=0). Thus, in one aspect of the present invention, a dual representation is provided wherein two different numbers in GF(p) (3 and 0 in this example, where p=3) represent a same value (zero). In $GF(3^k)$, two binary bits are used to represent each coefficient of a field element. In general for $GF(p^k)$, the number of bits used to represent a coefficient of a field element depends on the value of p. Where p is given by $p=2^m-1$, m binary bits (not including guard bits) are used to represent each coefficient of a field element.

Another example of the single-guard-bit representation is shown in FIG. 2B. FIG. 2B is a schematic illustration of a hardware register 210 with a data storage scheme for storing a field element ai=(a4,i, . . . , a1,i, a0,i) of GF(75). In the example of FIG. 2B, five groups of bit positions 211-*r* (unshaded bit positions, wherein r is the bit position number) are allocated to store binary data representing the field coefficients a4,i, a1,i, a0,i. In this example, p=7=2m−1. Therefore, m=3, and three bits (not including guard bits) are allocated to store the binary data representing each coefficient aj,i. Binary data representing coefficient a0,i are stored in bit positions zero, one and two (from the right). Binary data representing coefficient a1, i are stored in bit positions four, five and six, and so on.

In the example of FIG. 2B for $GF(7^5)$, the ground field is GF(7), and the following mapping between integer values of each coefficient and corresponding binary data is applicable (the quantities in parentheses are the binary data): 0~(0, 0, 0); 1~(0, 0, 1); 2~(0, 1, 0); 3~(0, 1, 1); 4~(1, 0, 0); 5~(1, 0, 1); 6~(1, 1, 0); and 7~(1, 1, 1) where 7 also corresponds to 0 (because 7 mod 7=0). Thus, the present invention provides a dual representation wherein two different numbers in the field GF(p) (7 and 0 in this example, where p=7) represent a same value (zero).

In addition, in the example of FIG. 2B, five bit positions 213-*r* are allocated to store guard bits (lightly shaded regions), which are initially assigned binary values of 0. In addition, bit positions three, seven, eight, eleven, etc. are allocated for guard bits. Also, in the Example of FIG. 2B, the twelve most significant bit positions 215 in the register 210 are unused (darkly shaded regions).

Figure 2C:
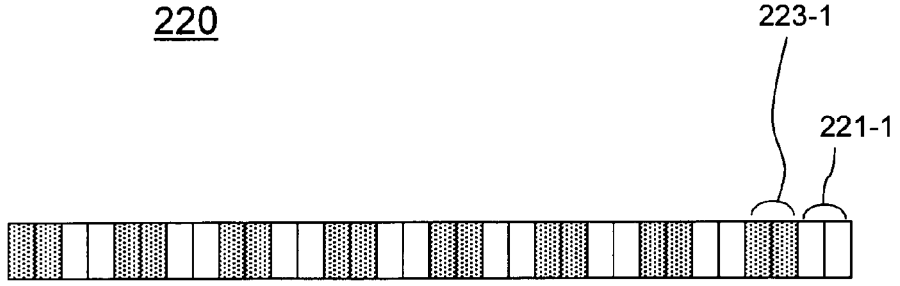
FIG. 2C is a schematic illustration of a hardware register with a data storage scheme configured in a multiple-guard-bit representation according to an exemplary aspect of the present invention for the example of $GF(3^8)$.

An example of the multiple-guard-bit representation is shown in FIG. 2C. FIG. 2C is a schematic illustration of a hardware register 220 with a data storage scheme for storing a field element $\alpha_i=(\alpha_{7,i}, \ldots, \alpha_{1,i}, \alpha_{0,i})$ of $GF(3^8)$. In the example of FIG. 2C, eight groups of bit positions 221-*r* (unshaded bit positions) are allocated to store binary data representing the field coefficients $\alpha_{7,i}, \ldots, \alpha_{1,i}, \alpha_{0,i}$, and adjacent groups of bit positions 221-*r* are separate by a group of two guard bit positions 213-*r* (lightly shaded bit positions). In this example, $p=3=2^m-1$. Therefore, m=2, and two bits (not including guard bits) are allocated to store the binary data representing each coefficient $\alpha_{j,1}$. Binary data representing coefficient $\alpha_{0,i}$ are stored in bit positions zero and one (from the right). Binary data representing coefficient $\alpha_{1,i}$ are stored in bit positions four and five and six, and so on. Eight groups of bit positions 223-*r* are allocated to store two guard bits each (lightly shaded regions), which are initially assigned binary values of 0. In the example of FIG.

2C, bit positions two, three, six, seven, eight, ten, eleven, etc. are allocated for guard bits. There are no unused bit positions in this example.

It is typically desirable to store binary data representing an entire field element of $GF(p^k)$ in a single hardware register 107. However, in cases where a field element is sufficiently large such that its binary representation exceeds the storage capacity of a single register, it is desirable to store binary data representing at least a portion of the field element in the register 107. The arithmetic and logical operations noted above can be carried out by coordinating the operations in multiple registers that together store binary data representing a single field element of $GF(p^k)$. For example, if two registers are used to store binary data representing a single field element of $GF(p^k)$, a right shift by m bits over all the binary data can be carried out by coordinating the two registers such that the least significant bit in left hand register is shifted to the most-significant-bit side of the right-hand register. (The terminology "right-hand" and "left-hand" are used merely to distinguish the registers in the sense that a left-most-bit position in a register corresponds to the most-significant-bit position. The terminology is not intended to suggest that one register is necessarily physically positioned to the left of another register). It should be noted, however, that where two registers are used to store binary data representing a field element, if unused bit spaces are present in the most-significant-bit positions of the right-hand register, a right-shift operation must be implemented to skip over the unused bit spaces.

Figure 3:
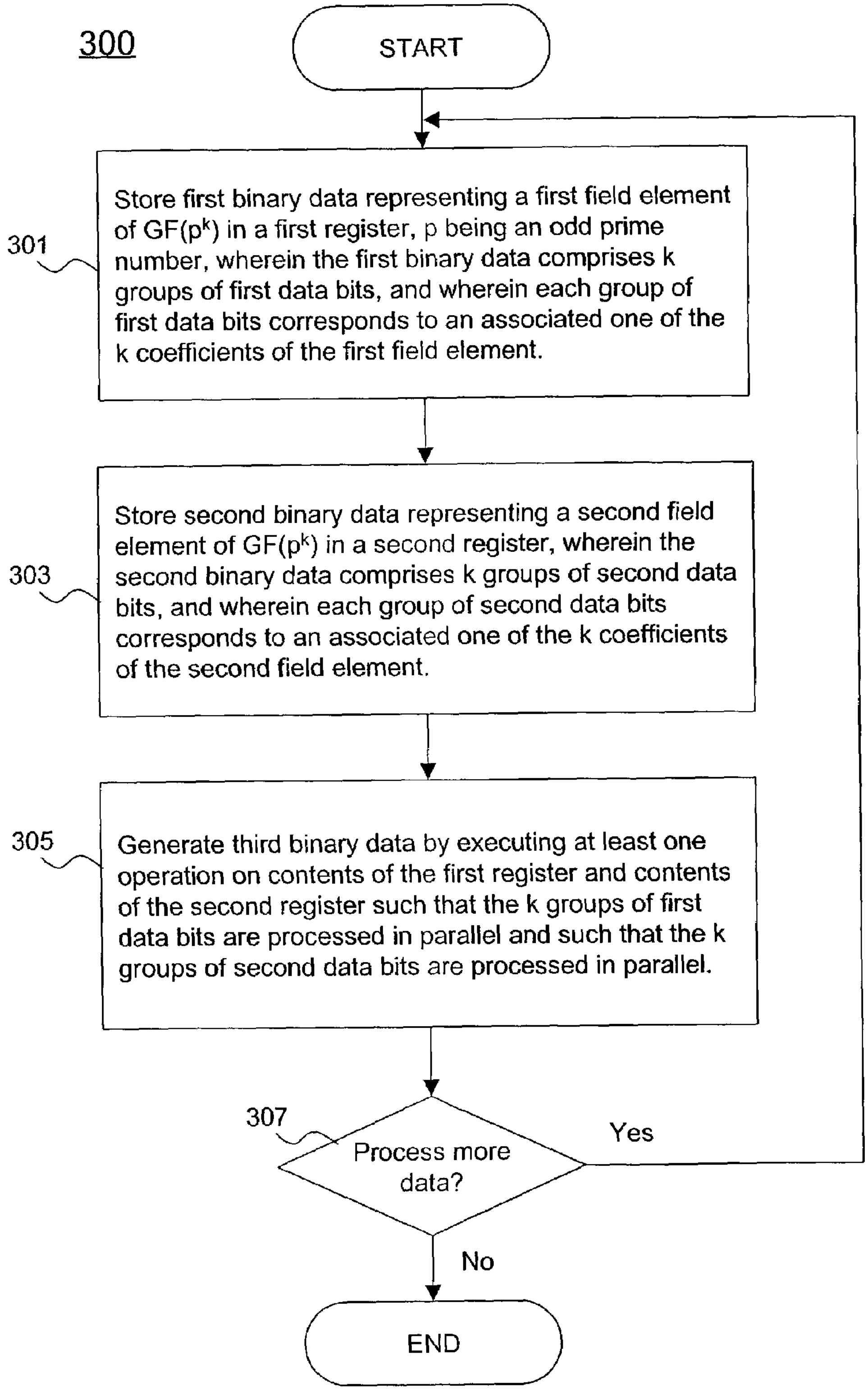
FIG. 3 is a flow diagram illustrating a method of processing binary data representing field elements of an odd-characteristic finite field according to an exemplary aspect of the present invention.

According to another exemplary aspect of the present invention, the system 100 illustrated in FIG. 1 can be configured to execute the steps shown in the flow diagram illustrated in FIG. 3. FIG. 3 illustrates an approach 300 comprising a plurality of steps that can be executed by the processing unit 105 shown in FIG. 1. As shown at step 301 shown in FIG. 3, the processing unit 105 stores first binary data representing a first field element of $GF(p^k)$ in a first register (e.g., register 109), p being an odd prime number, wherein the first binary data comprises k groups of first data bits, and wherein each group of first data bits corresponds to an associated one of the k coefficients of the first field element. Similarly, as shown at step 303, the processing unit 105 stores second binary data representing a second field element of $GF(p^k)$ in a second register (e.g., register 111), wherein the second binary data comprises k groups of second data bits, and wherein each group of second data bits corresponds to an associated one of the k coefficients of the second field element. Further, as shown at step 305 the processing unit 105 then generates third binary data by executing at least one operation on contents of the first register and contents of the second register such that the k groups of first data bits are processed in parallel and such that the k groups of second data bits are processed in parallel. For example, the operation or operations referred to in step 305 can include an addition operation, a subtraction operation, a shift operation, a logical AND operation, and a NOT operation just to name a few. Combinations of such operations may be carried out, for example, to generate third binary data that represents a third field element equal to the sum of the first and second field elements or a third field element equal to the product of the first and second field elements as will be described in detail below.

The k groups of first data bits can be structured in the first register 109 such that at least one first guard bit is positioned adjacent to the most significant bit of each group of first data bits, each group of first data bits being separated from an adjacent group of first data bits by a corresponding at least one first guard bit. The k groups of second data bits can be structured in the second register 111 such that at least one second guard bit is positioned adjacent to the most significant bit of each group of second data bits, each group of second data bits being separated from an adjacent group of second data bits by a corresponding at least one second guard bit. In addition, the third binary data can comprise k groups of third data bits stored and structured in a third register (e.g., register 113) such that at least one third guard bit is positioned adjacent to the most significant bit of each group of third data bits, each group of third data bits being separated from an adjacent group of third data bits by a corresponding at least one third guard bit. In this regard, the third field element comprises k third coefficients in accordance with the polynomial-basis representation, and each group of third data bits represents an associated one of the k third coefficients. (In the discussion above, "first", "second" and "third" are used as labels.)

The processing unit 105 and a first register (e.g., register 109) can be viewed as means for storing first binary data representing a first field element of $GF(p^k)$. The processing unit 105 and a second register (e.g., register 111) can be view as means for storing second binary data representing a second field element of $GF(p^k)$. The processing unit 105 and a third register (e.g., register 113) can be viewed as means for storing third binary data representing a third field element of $GF(p^k)$. The processing unit 105 can be viewed as means for executing at least one operation on the first binary data and the second binary data such that the k groups of first data bits are processed in parallel and such that the k groups of second data bits are processed in parallel.

At step 307, it is determined whether or not more data should be processed. If more data should be processed, the flow then proceeds back to step 301. If the additional processing involves processing binary data that have already been stored in a manner consistent with steps 301 and/or 303 as a result of another calculation, steps 301 and/or 303 can be skipped as appropriate. If it is determined at step 307 not to process more data, the algorithm ends.

Exemplary approaches for executing step 305 shown in FIG. 3 will now be described. Step 305 can be implemented, for example, using an algorithm GF_p_k_ADD or an algorithm GF_p_k_MUL, which will be described below. GF_p_k_ADD and GF_p_k_MUL were referred to above in the discussion of the algorithms SUM(α, β), PRODUCT(α, β), and REDUCE(δ, f). As will be described below, certain aspects of algorithms for both GF_p_k_ADD and GF_p_k_MUL depend upon the functional form of the characteristic value p and upon whether the single-guard-bit representation or the multiple-guard-bit representation is used. In particular, certain aspects of these algorithms depend on whether p is written as $p=2^m-1$, $p=2^m+1$ or $p=2^m\pm d$ for some integer m and some small integer d. The integer d is to chosen such that $d<2^m-1$. However, choosing d to be smaller, e.g. $d\leqq p/6$, has some advantages as will be described below. Accordingly, exemplary forms for GF_p_k_ADD and exemplary forms for GF_p_k_MUL will be described below with reference to the functional form of the characteristic value p and with reference to whether the single-guard-bit representation or the multiple-guard-bit representation is used.

In view of the comments above, a question arises as to which form of GF_p_k_ADD or which form of GF_p_k_MUL should be used where a given odd prime p can be written in more than one functional form. For example, p=5 can be written as $p=2^m+1$ for m=2, and p=5 can also be written as $p=2^m-d$ for m=3 and d=3). Generally, it is preferable to utilize the approach for $p=2^m-1$ over approaches for the other two functional forms. In addition, it is preferable to use the approach for $p=2^m+1$ over the approach for $p=2^m+d$ with $d>1$. In general, for $p=2^m+d$, it is desirable to choose d odd and as close to 1 as possible. Given a value of p, a good (m, d)-pair can be found by trying all $m=1, 2, \ldots, (2 \log_2(p))$, and for each such m, selecting d to satisfy $p=2^m\pm d$, until a small d is found.

Addition Using Single-Guard-Bit Representation, $p=2^m-1$

A form of GF_p_k_ADD for the single-guard-bit representation where $p=2^m-1$ will now be described, and it will be shown how one full addition of two field elements in $GF(p^k)$ (i.e., k additions pertaining to the k coefficients of each field element), including the associated modular reduction, can be performed with a small, fixed number of operations (and without modular reductions which require long divisions) on a hardware architecture having at least $w=k(m+1)$ bit word size. For example, for a 32-bit architecture, full additions in $GF(3^{10})$ can be performed using only five instructions.

In the single-guard-bit representation, first binary data representing a first field element $\alpha_1=(\alpha_{k-1,i}, \ldots, \alpha_{1,i}, \alpha_{0,i})$ of $GF(p^k)$ is stored in a first single hardware register (e.g., register 107 shown in FIG. 1) by storing binary data representing $\alpha_{0,1}$ in bit positions 0 through m−1, binary data representing $\alpha_{1,i}$, in bit positions m+1 through 2m, etc., such that a group of data bits representing one field coefficient is separated by one bit position from an adjacent group of data bits representing another field coefficient. Second binary data representing a second field element $\beta_J$ is stored similarly in a second single hardware register (e.g., register 109). Bit positions v(m+1)−1 where v=1, 2, . . . , k are allocated to separate the binary data representing the coefficients $\alpha_{0,1}$, $\alpha_{1,1}$, etc. These positions are referred to as guard-bit positions or separating-bit positions and are initially assigned values of “0”. Examples of storing binary data according to the single-guard-bit representation for a w=32-bit architecture are shown in FIGS. 2A and 2B described previously for elements of the fields $GF(3^{10})$ and $GF(7^5)$, respectively. For example, in FIG. 2A for $GF(3^{10})$, two bit positions are reserved for each $\alpha_{J,i}$, (which is sufficient since $\alpha_{J,i}\leqq 3<2^2$).

With first and second binary data representing first and second field elements of $GF(p^k)$ stored in first and second registers, respectively, operations can be carried out to determine the sum of the first and second field elements. The contents of the first and second registers may be referred to as a and b, respectively. Let M2 be a binary quantity whose only “1” bits are in positions j(m+1)−1, j=1, 2, . . . , k, and “0” elsewhere (i.e., $M2=2^m+2^{m+1}+\ldots+2^{k(m+1)-1}$), and let M1 be a binary quantity given by M1=NOT(M2) (bitwise negation). The sum of the first and second field elements can be determined by carrying out the operations given in Equation 13

$$c=((a+b)\&M1)+(((a+b)\&M2)>>m) \qquad (13)$$

where “&” denotes bitwise logical AND, “>>” denotes right shift, “+” denotes addition with carry, and c refers to the register contents comprising third binary data that represents a third field element equal to the sum of the first and second field elements. The operations reflected in equation 13 can be executed in any manner that is desired. For example, the intermediate quantity (a+b) can be stored in a given register, and the given register can then be overwritten with the final result given by the quantity c, such that the operation (a+b) is performed only once. The binary quantities M1 and M2 may be thought of as mask quantities because, when combined with the quantity (a+b) via the respective logical AND operations as shown in Equation 13, the binary quantities M1 and M2 mask out (set to zero) bits in certain bit positions in the quantities ((a+b) & M1) and ((a+b) & M2). The binary quantity M1 masks out bits in the quantity ((a+b) & M1) corresponding to guard-bit positions. The binary quantity M2 masks out bits in the quantity ((a+b) & M2) corresponding to non-guard-bit positions.

In carrying out Equation 13 with guard bits at positions m, 2m+1, etc., no carry bit will propagate from an m-bit segment corresponding to some $\alpha_{j,i}$ (or $\beta_{j,i}$), into the segment representing $\alpha_{J+1,i}$ (or $\beta_{j+1,i}$). Thus, the field-element sum is really computed component-wise, modulo p, on $\alpha_i$ and $\beta_i$. The mask operation by M1 ensures the result will have the correct representation with zeros in the guard-bit positions. In the above discussion, M2 is determined first, and then M1 is defined in terms of M2. However, it would be equivalent to first determine M1 as a binary quantity having values of zero at bit positions corresponding to bit positions of first guard bits stored in the first register and having values of one elsewhere and to then determine M2 as M2=NOT(M1).

Figure 4:
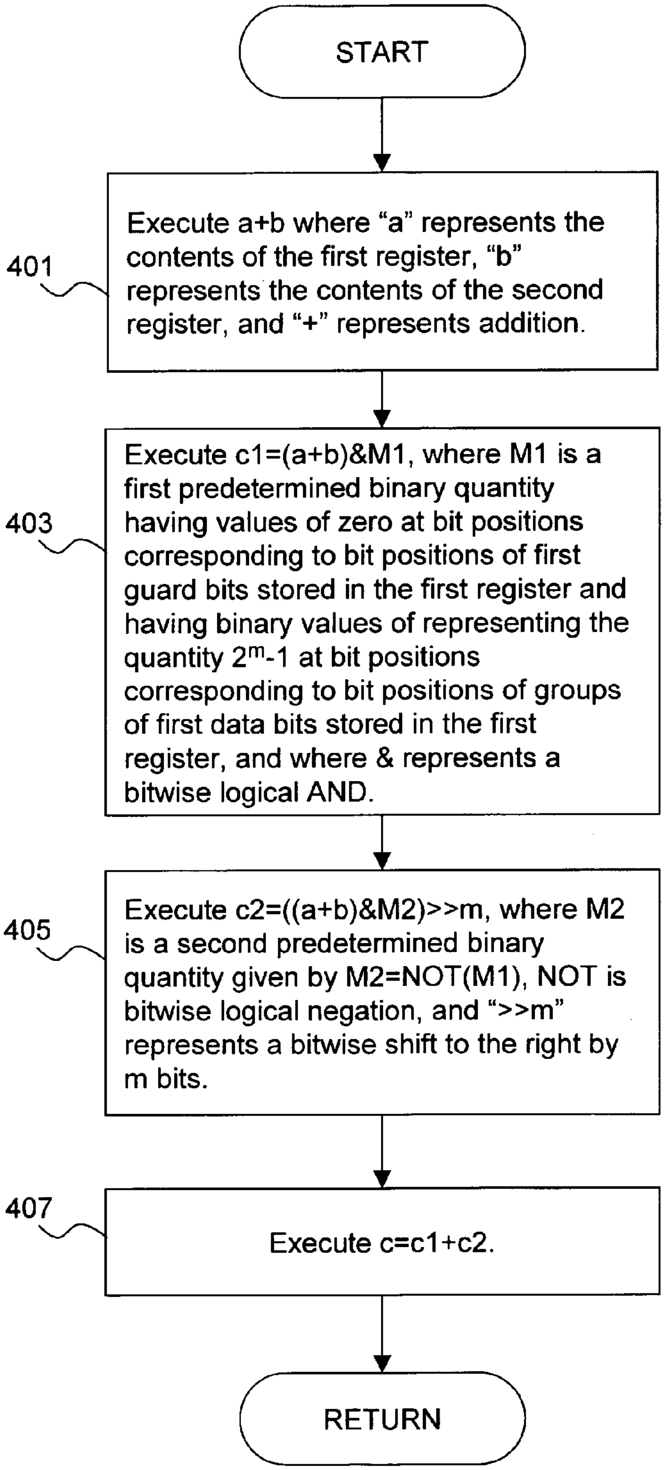
FIG. 4 is a flow diagram illustrating a method of processing binary data in order to determine the sum of two field elements where $p=2^m-1$ in accordance with the method illustrated in FIG. 3 according to an exemplary aspect of the present invention.

An example of this form of GF_p_k_ADD where $p=2^m-1$ is shown in the flow diagram of FIG. 4. The operations shown in FIG. 4 can be executed by a system such as system 100 shown in FIG. 1. It is assumed that steps 301 and 303 shown in FIG. 3 have already been executed by the processor 105 such that first binary data representing a first field element of $GF(p^k)$ are stored in a first register (e.g., register 107 shown in FIG. 1) and such that second binary data representing a second field element are stored in a second register (e.g., register 109). The steps illustrated in FIG. 4 then represent an exemplary implementation of step 305 shown in FIG. 3.

As indicated at step 401, the processing unit 105 adds the contents, a, of the first register 107, and the contents, b, of the second register 109. The addition may involve a carry into a given next most significant bit where necessary. The result of the addition can be stored in another register 111. As indicated at step 403, the processing unit 105 then executes a logical AND operation between the quantity (a+b) stored in register 111 and a first predetermined binary quantity M1 stored in one of the registers (e.g., register 113). The quantity M1 has values of zero at bit positions corresponding to bit positions of first guard bits stored in the first register 107 and has values of one at bit positions corresponding to bit positions of the groups of first data bits stored in the first register. The result of this operation can be referred to as first intermediate data c1 and is stored in one of registers (e.g., register 115).

As indicated at step 405, the processing unit executes a logical AND operation between the quantity (a+b) store in register 111 and a second predetermined binary quantity M2 where M2 is given by M2=NOT(M1). The NOT operation is bitwise logical negation. The result of this operation is stored in one of registers (e.g., register 117). Also indicated at step 405, the processing unit 105 then executes a right shift by m bits on the quantity given by ((a+b)&M2). The result of this operation can be stored in the same register 117 or in a different register. The result of this operation may be referred to as second intermediate data c2 as shown in step 405. At step 407 the processor executes addition between the first intermediate binary data c1 and the second intermediate binary data c2 to generate the third binary data, represented by c, which can be stored in one of the registers (e.g., register 119). According to this approach, the third binary data c represents the sum of the first field element and the second field element.

The algorithms according to FIGS. 3 and 4 have been described in terms of a specified sequence of steps to facilitate the description. However, it is not necessary to carry the steps indicated in FIGS. 3 and 4 in the exact order illustrated. Those of ordinary skill in the art will recognize that the order of steps can be varied and that some of the steps can be carried out simultaneously. For example, steps 301 and 303 shown in FIG. 3 can be carried out simultaneously, and steps 403 and 405 shown in FIG. 4 can be carried out simultaneously.

Additional insight into aspects of the exemplary form for GF_p_k_ADD, described above can be gained by considering the following special case for k=1. In the description above, the number "0" has two representations: both 0 itself and also $p=2^m-1$. It is only necessary to take this duality into account during input and output operations. Given that p=0 mod p, there is no mathematical problem with this dual representation. Integers in this dual representation can be added modulo p in accordance with the following equation $$(a+b)\bmod p=((a+b)\bmod 2^m)+((a+b)\operatorname{div} 2^m) \quad (14)$$

where div $2^m$ refers to a function that returns the floor of a quotient where the divisor is $2^m$. Stated differently, the sum of a and b (in the dual representation) is a+b if $a+b<2^m$; otherwise, the sum is $((a+b)\bmod 2^m)+1$. These two cases (depending on whether the sum is less than $2^m$ or not) can thus jointly be treated by the formula $(a+b)\bmod p=[(a+b)\bmod 2^m]+[(a+b)\operatorname{div} 2^m]$. Observe that $(a+b)\leqq 2(2^m-1)=2^{m+1}-2$ and that the mod and div operations can be efficiently implemented as bit operations (logical AND, shift) since the module and the divisor are each powers of 2. Thus, given a hardware architecture that can perform operations on (at least) m+1 bit quantities and given the dual representations for a and b, the quantity (a+b) mod p (in the dual representation) can be determined in accordance with Equation 15:

$$c=((a+b)\&(2^m-1))+(((a+b)\&2^m)>>m) \quad (15).$$

Because $a+b<2^{m+1}-2$, no overflow results from carrying out Equation 15 if $w\geqq m+1$, where w is the register size. Thus, instead of one addition and one modular reduction (a long division) by p, five simple operations are performed where the quantities $2^m$ and $2^m-1$ are fixed and can be considered constant bit-masks. In the discussion above, it was assumed that k=1 to facilitate the discussion. Of course, the present invention is to be carried out using a value of k that is greater than one. Nevertheless, the discussion for k=1 provides insight into the form of GF_p_k_ADD and the choices of the binary quantities M1 and M2 according to the present invention for use where k is greater than one.

In addition, the dual representation, in which the number "0" is represented as both 0 itself and also as $p=2^m-1$, facilitates determining the sum of two field elements according to the approach described above. As noted above, instead of using one addition and one modular reduction (a long division) by p to determine the sum of two field elements, the dual representation allows using five simple operations on binary data representing the two field elements to determine their sum.

With regard to the extension field $GF(p^{lk})$, as noted above in the discussion regarding SUM(α, β) and PRODUCT(α, β), each element of the extension field is represented as a vector (polynomial) of length l, where each component (coefficient) is an element of $GF(p^k)$ and can be stored according to the single guard-bit representation as described above. Adding two elements in the extension field $GF(p^{lk})$ can now be done using 5l operations instead of lk operations as would be required using conventional approaches. Thus, even for relatively small values of k, a significant increase in computational speed can be achieved.

In addition, as will be described later, the above-described exemplary form or GF_p_k_ADD is also applicable to binary data stored according to the multiple-guard-bit representation for $p=2^m-1$.

EXAMPLE 1

Figure 5:
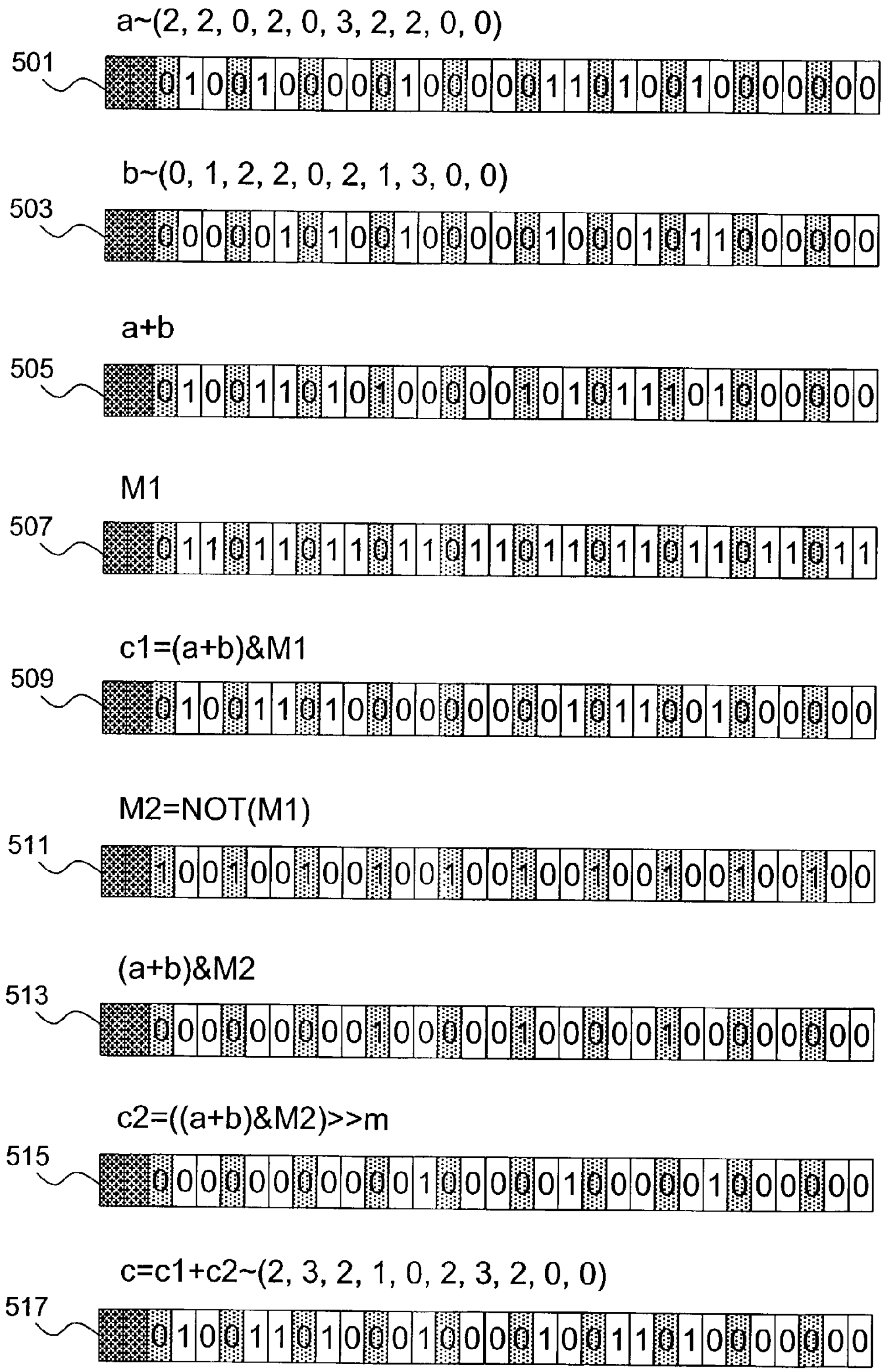
FIG. 5 is a schematic illustration of register contents for an example of addition in $GF(3^{10})$ in accordance with the method illustrated in FIG. 4.

A numerical example illustrating the approach shown in FIGS. 3 and 4 will now be described with reference to FIG. 5. The operations described below can be carried out using a system such as system 100 shown in FIG. 1, which has been previously described. FIG. 5 illustrates register contents resulting from carrying out the operations as described above with regard to FIGS. 3 and 4. In FIG. 5, reference numerals 501–517 refer to 32-bit registers, and the binary data stored within the registers 501–517 are configured according to a single guard-bit representation. In addition, in this example the binary data represents field elements of the finite field $GF(3^{10})$, and the characteristic p is given by $p=2^m-1=3$. Accordingly, M=2, and 2 bits of register space are allocated for each coefficient of the finite field element. A single guard bit (lightly shaded bit locations) separates adjacent binary data representing adjacent coefficients of the finite field element. In addition, in this example there are two unused bits of register space (darkly shaded bit locations) at the most significant bit positions of each register 501–517.

In this example, first binary data, a, representing a first field element (2, 2, 0, 2, 0, 3, 2, 2, 0, 0) (in vector notation) and second binary data, b, representing a second field element (0, 1, 2, 2, 0, 2, 1, 3, 0, 0) (in vector notation) are stored in first and second registers 501 and 503, respectively (steps 301 and 303). Each coefficient of the field elements is itself an element of the ground field GF(3), and each coefficient is represented by binary data according to the following associations: 0~(0, 0); 1~(0, 1); 2~(1, 0); 3~(1, 1). A dual representation is provided wherein two different numbers in GF(p) (3 and 0 in this example, where p=3) represent a same value (zero). Thus, binary data given by (1, 1), which corresponds to 3, also represents 0 (because 3 mod 3=0). Each guard-bit position in registers 501 and 503 is initially assigned a value of zero.

The register contents a and b stored in registers 501 and 503, respectively, are then added via addition (corresponding to step 401). The result (a+b) is stored in a third register 505. The contents (a+b) of register 505 are then combined via a logical AND operation with the contents of register 507, in which the quantity M1 has been stored), and the result c1=(a+b)&M1 is stored in register 509 (corresponding to step 403). In addition, the quantity M2=NOT (M1) is stored in register 511. The contents (a+b) of register 505 and the contents M2 of register 511 are then combined via a logical AND operation, and the result (a+b)&M2 is stored in register 513 (corresponding to step 405). The contents (a+b)&M2 of register 513 are then right shifted by m=2 bits, and the result is stored in register 515 (corresponding to step 405). The contents c1 of register 509 and the contents c2 of register 515 are then added via addition, and the result is stored in register 517. The result is given by (2, 3, 2, 1, 0, 2, 3, 2, 0, 0) (in vector notation) and is equivalent to (2, 0, 2, 1, 0, 2, 0, 2, 0, 0) as expected.

In the above example, carries are generated into three guard-bit positions (bit positions eight, fourteen and twenty) as shown in register 505 upon adding the first binary data, a, and the second binary data, b. The guard-bit positions prevent the carry bits from affecting the values of the adjacent group of data bits. Accordingly, in this example, the guard-bit positions (lightly shaded bit positions) allow carrying out operations on ten groups of data bits in parallel, where the ten groups of data bits represent the ten field coefficients.

As a matter of convenience in describing the above operations, the binary results of various steps as shown in FIG. 5 have been described as being stored in separately identified registers. However, those of ordinary skill in the art will recognize that various steps can be carried out by reusing registers in a manner that over-writes previously stored binary data from an earlier step. For example, the first and second intermediate binary data c1 and c2 shown in registers 509 and 515 can instead be stored in registers 501 and 503 by over-writing the previously stored binary a and b to utilize register space more efficiently. This completes the discussion of Example 1.

Figure 6:
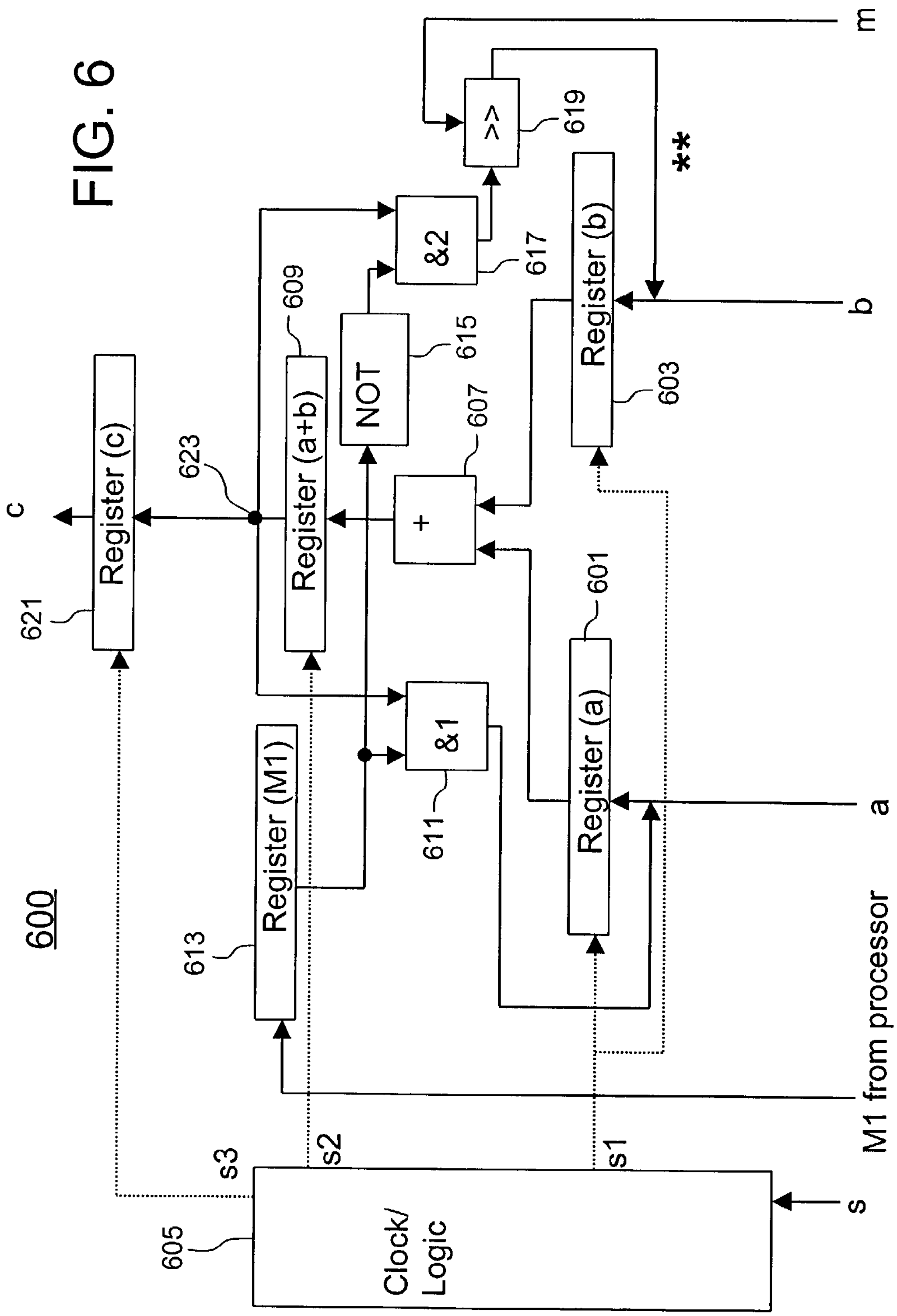
FIG. 6 is a functional block diagram of a hardware apparatus for carrying out computations involving field elements of an odd-characteristic finite field where $p=2^m-1$ according to an exemplary aspect of the present invention.

In another aspect of the invention relating to computations involving field elements of an odd-characteristic finite field where $p=2^m-1$, a hardware apparatus can be provided for carrying out operations for the exemplary form of GF_p_k_ADD illustrated in FIG. 4. FIG. 6 is a functional block diagram of such an exemplary hardware apparatus. In particular, the apparatus 600 illustrated in FIG. 6 provides another approach for generating third binary data, denoted as c in FIGS. 4 and 6, that can represent the sum of a first field element and a second field element of $GF(p^k)$. In FIG. 6, solid lines represent electrical connections for the flow of data, and dotted lines represent electrical connections for the flow of control signals. Solid lines that cross are not connected unless a black dot is present at the intersection of the lines, such as connection 623. The apparatus 600 is described here in the discussion pertaining to the single-guard-bit representation, but the apparatus 600 is equally applicable to a multiple-guard-bit representation, which is described later.

Figure 12:
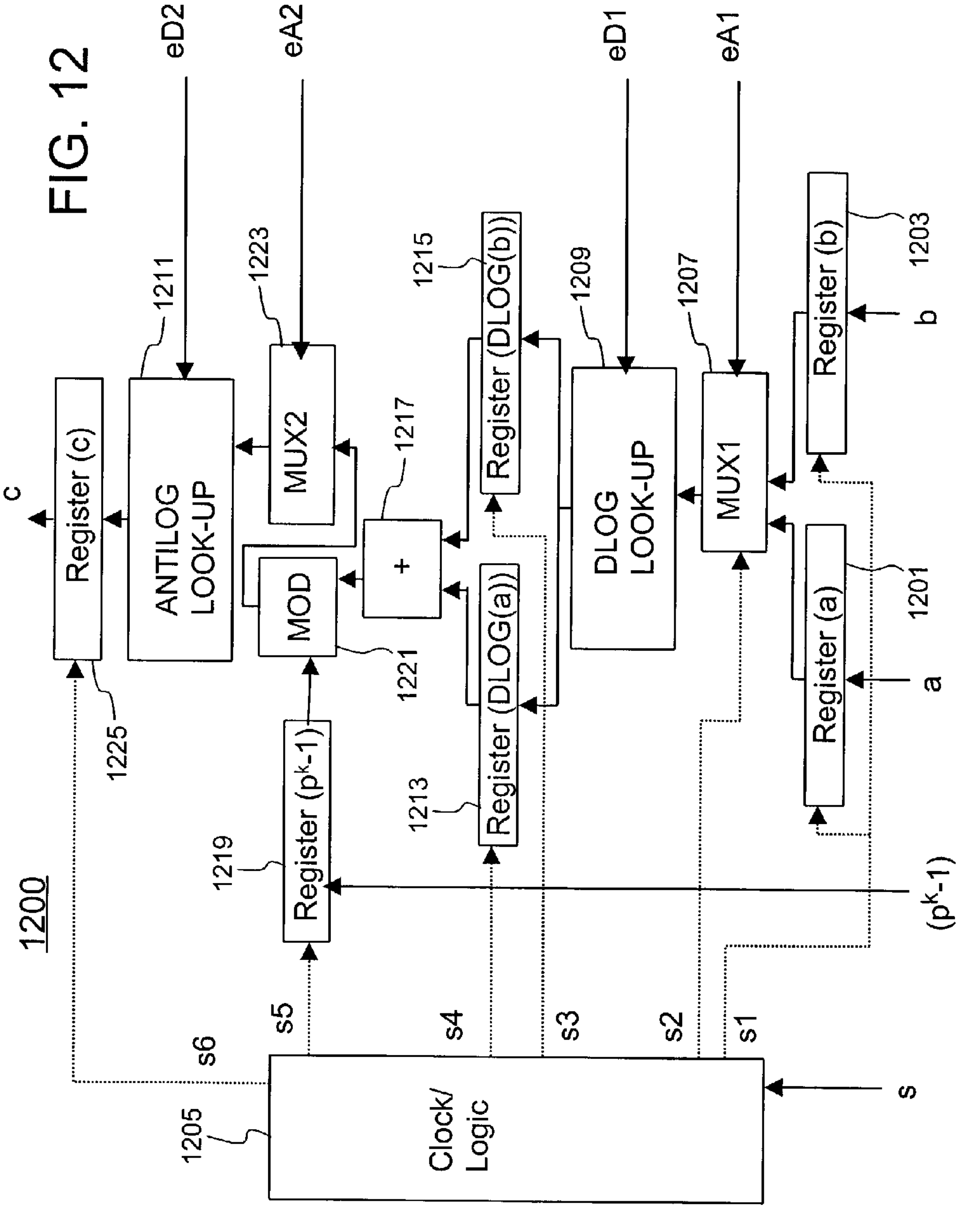
FIG. 12 is a functional block diagram illustrating a hardware apparatus for carrying out multiplication of field elements of an odd-characteristic finite field according to an exemplary aspect of the present invention.

The apparatus 600 comprises a first register 601 and a second register 603 for holding first binary data (register contents "a") and second binary data (register contents "b"), respectively. The first binary data and the second binary data represent field elements of the finite field $GF(p^k)$. Here, it is assumed that the first and second binary data in the first and second registers 601 and 603 are already configured with zeros at guard-bit locations such as illustrated, for example, as in FIG. 2A. The apparatus 600 also comprises a combinatorial logic and clock device (clock/logic) 605, an addition gate (+) 607 (also referred to as an adder), a register 609 for holding the sum of register contents a and b, a first logical AND gate (&1) 611, a mask register 613 for generating and holding a first predetermined binary quantity M1 upon input m, a NOT gate (NOT) 615, and a second logical AND gate (&2) 617. In addition, the apparatus 600 comprises a right shift gate (>>) 619 and an output register 621 for holding a result "c". Right shift gates are known to those of ordinary skill in the art, and such gates shift the values therein to the right by a selected number of bits and enter a corresponding number of zeros into the most significant bit positions. The clock/logic unit 605 can also have an output terminal (not shown) for providing a signal to be input to another hardware apparatus to initiate computations in another hardware apparatus when computations in the apparatus 600 are complete. For example, another hardware apparatus can be another apparatus 600 or a multiplier apparatus 1200 such as illustrated in FIG. 12 to be described later.

The operation of the apparatus 600 illustrated in FIG. 6 will now be described. First binary data representing a first field element and second binary data representing a second field element of $GF(p^k)$ are input on lines labeled a and b to the first register 601 and the second register 603, respectively. It is assumed that the first and second binary data are already configured with zeros at guard-bit positions (e.g., by a processor that is not shown). Binary data representing the quantity m is also provided to the right-shift gate (>>) 619. Mask register 613 receives a first predetermined binary quantity M1 (a mask quantity) from a processor (not shown), where M1 is a quantity with values as described previously. Alternatively, mask register 613 can also comprise a circuit that generates the quantity M1 upon input of binary data representing the quantity m. Making such a circuit is within the purview of one of ordinary skill in the art.

Computation is initiated by a start signal on the input line labeled s. The first and second binary data, the binary data representing the quantity m, and the start signal can be provided from a processor (not shown) or from another hardware apparatus (not shown), such as a multiplier apparatus as illustrated in FIG. 12 to be described later, via a conventional routing circuit, for example.

When the values of the first binary data and second binary data in the registers 601 and 603 are stable, a signal s1 locks those values into the registers 601 and 603, respectively. The adder 607 then adds the values provided at its two inputs from register 601 and 603. When the output of the adder 607 is stable, the output from adder 607 is locked into register 609 by a signal on the line labeled s2. The time required for a given value to become stable in a given register can be conventionally determined by one of ordinary skill in the art in view of the circuitry design, and a locking signal (e.g., on line s1 or line s2) can be timed to occur after this time. At this point, the register 609 holds binary data representing corresponding to the quantity a+b shown in step 401 of FIG. 4.

The binary data in register 609 are then directed from register 609 to the AND gate 611. The AND gate 611 performs a logical AND between the binary data from register 609 and the mask quantity M1 from mask register 613. The result of this logical AND operation is equivalent to the quantity c1 illustrated at step 403 of FIG. 4. The output from the first AND gate 611 is then directed back to the input of the first register 601, and another signal on the line labeled s1 then locks the corresponding values into the first register 601 at the appropriate time. In this regard, it will be understood that a signal on the line s1 can be timed appropriately such that it is unnecessary to provide a multiplexer or switch at the point labeled 623 to route data output from register 609. Of course, the apparatus 609 could be provided with a multiplexer or switch at the point 623 for routing data if desired.

While the operations described in the immediately preceding paragraph are being carried out, the following operations are more or less simultaneously carried out. Output from the register 609 is directed to the second AND gate 617, and the first predetermined binary quantity M1 is directed to a logical NOT gate 615. The output from the logical NOT gate 615 is also directed to an input of the second AND gate 617. The data at these the inputs of the second AND gate 617 are then combined via a logical AND operation and are directed to a right-shift gate 619. The right-shift gate 619 executes a right-shift by m bits on the data input from the second AND gate 617 according to the input on the line labeled m. The output of the right-shift gate 619 is then directed to the input of the second register 603.

The result of this group of operations, which is input to the second register 603, corresponds to the quantity c2 referred to in step 405 of FIG. 4.

When the values of the binary data now stored in the first and second registers 601 and 603 are stable, the signal s1 locks these values into the first and second registers 601 and 603. At this point, the adder 607 adds the binary data from the first and second registers 601 and 603 and directs the output to output register 609. The binary data now stored in register 609 is then directed to the output register 621, and a signal on line s3 locks the binary data into the register 621 at the appropriate time. This binary data corresponds to third binary data denoted as c at step 407 of FIG. 4.

Those of ordinary skill in the art will appreciate that many variations of the apparatus 600 are possible according to the present invention. For example, each internal w-bit register 601, 603, 609, 613, and 621 can be replaced with multiple parallel (i.e., coordinated) registers, at least one of which holds binary data representing at least two coefficients of a field element. Further, the first AND gate 611, the adder 607, the second AND gate 617, the NOT gate 615, and the right-shift gate 619 shown in FIG. 6 are accordingly replaced with multiple parallel (i.e., coordinated) copies of each.

In the apparatus 600 as described with reference to FIG. 6, first and second binary data are input to first and second registers 601 and 603, respectively, with zeros already configured at appropriate guard-bit positions. The first and second binary data may be provided in this configuration by a processor (not shown), for example, that inserts zeros at guard-bit positions as appropriate. Thus, the processor (not shown) and the first register 601 can be viewed as means for storing first binary data, and the processor (not shown) and the second register 603 can be viewed as means for storing second binary data. Further, the register 621 and/or the register 609 can be viewed as means for storing third binary data. Moreover, the clock/logic device 605 and any or all of the remaining devices illustrated in FIG. 6 can be viewed as means for executing at least one operation on the first binary data and the second binary data.

By utilizing the apparatus 600 along with a processor (not shown), the apparatus 600 has flexibility to be used with field elements for various choices of p and k for the finite field GF($p^k$), where p is of form $p=2^m-1$. In particular, the quantity m is a variable, and the right-shift gate 619 responds accordingly to the input value of m. In addition, the mask register 613 holds an appropriate form of the first predetermined binary quantity M1 that depends upon the quantity m. The quantity M1 is "predetermined" in the sense that once the quantity m is chosen (which determines the quantity p), the form of the quantity M1 directly follows as described above.

Figure 7:
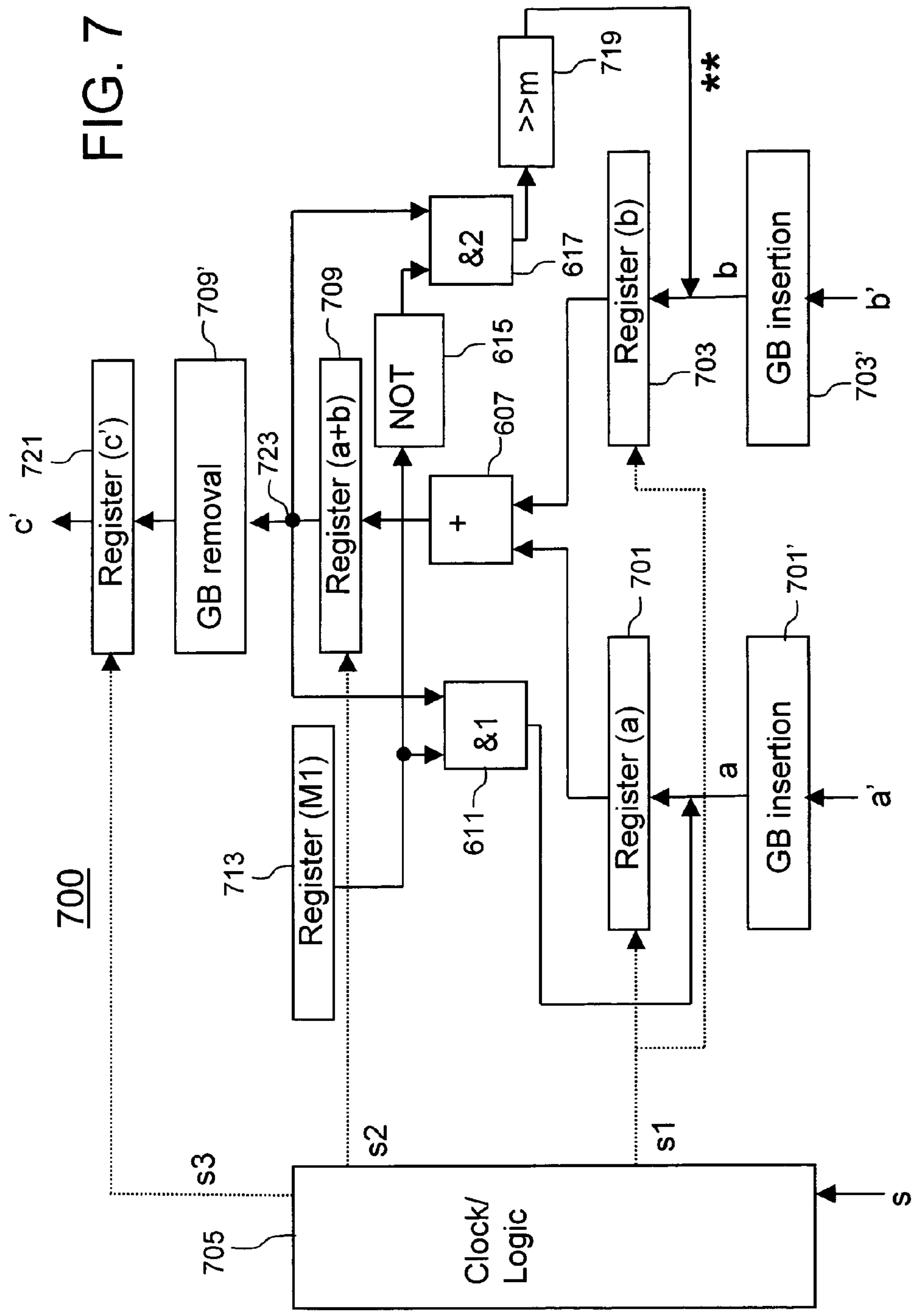
FIG. 7 is another functional block diagram of a hardware apparatus for carrying out computations involving field elements of an odd-characteristic finite field where $p=2^m-1$ according to another exemplary aspect of the present invention.

In another exemplary aspect of the invention, the apparatus 600 can be modified, such as shown by hardware apparatus 700 illustrated in the block diagram of FIG. 7, for a situation in which a dedicated choice of the finite field GF($p^k$) is made and remains unchanged. That is, the quantities m, p, and k, as well as the choice of whether the representation is a single-guard-bit representation or a multiple-guard-bit representation, are fixed, and the hardware apparatus 700 is dedicated to those choices. In this situation, the hardware apparatus 700 can receive initial binary data representing field elements wherein the initial binary data are not configured with zeros in guard-bit positions. Rather, the hardware apparatus 700 itself configures the initial binary data with zeros in appropriate guard-bit positions to generate first and second binary data without the need for a processor to configure the first and second binary data with zeros in guard-bit positions. The hardware apparatus 700 illustrated in FIG. 7 will now be described.

The hardware apparatus 700 illustrated in the functional block diagram of FIG. 7 shares various common features and operational aspects with the apparatus 600 illustrated in FIG. 6, and like features are given like reference numerals in FIGS. 6 and 7. For example, reference numerals 707, 711, 715 and 717 in FIG. 7 correspond to the reference numerals 607, 611, 615 and 617 in FIG. 6. Discussion of aspects of the apparatus 700 that are common to the apparatus 600 will not be duplicated here. Rather, aspects in which the apparatus 700 differs from the apparatus 600 will be discussed.

The apparatus 700 possesses several features not found in the apparatus 600. In particular, the apparatus 700 possesses guard-bit-insertion circuits 701' and 703' (GB insertion) and a guard-bit-removal circuit 709' (GB removal). Exemplary implementations of these circuits will be described in FIGS. 8A and 8B. As shown in FIG. 7, the guard-bit-insertion circuits 701' and 703' are functionally arranged at the input to the hardware apparatus 700, and the guard-bit-removal circuit 709' is functionally arranged between the register 709 and the output register 721. The guard-bit-insertion circuits 701' and 703' operate to receive initial binary data a' and b' (without guard bits) corresponding to first and second field elements of GF($p^k$) and to insert appropriate guard bits into that data. In other words, the guard-bit-insertion circuits 701' and 703' transform the initial binary data a' and b' into first binary data and second binary data having guard bits, in particular, with zeros at guard-bit positions. The guard-bit-removal circuit 709' has the opposite function—namely, to receive third binary data c representing a computational result and having guard bits and to remove those guard bits, thereby forming final binary data c' representing the computational result, but without guard bits.

The apparatus 700 also lacks certain features present in the apparatus 600 because they are not needed in the apparatus 700. In particular, the apparatus 700 lacks an input line for the quantity m into the right-shift gate 719 and into the mask register 713. Such an input line is not necessary given that m is fixed. Rather, the right-shift gate 719 is initialized once with the value of m to execute the appropriate right shift. Similarly, the mask register 713 is initialized once with the appropriate form of M1. Conventional electrical connections can be used for carrying out these initializations and are not shown in FIG. 7. The operation of the apparatus 700 illustrated in FIG. 7 is substantially similar to that described for the apparatus 600 illustrated in FIG. 6 except for the operational distinctions noted above.

In the apparatus 700 as described above, the first register 701 and the guard-bit insertion circuit 701' can be viewed as means for storing first binary data. The second register 703 and the guard bit insertion circuit 703' can be viewed as means for storing second binary data. Further, the register 709 can be viewed as means for storing third binary data. Moreover, the clock/logic device 705 and any or all of the remaining devices illustrated in FIG. 7 can be viewed as means for executing at least one operation on the first binary data and the second binary data.

Figure 8A:
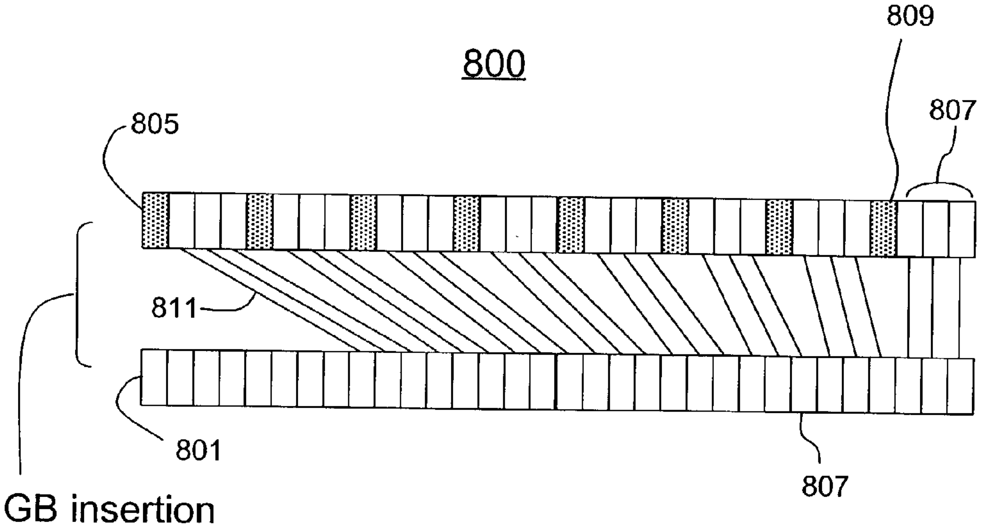
FIG. 8A is a schematic illustration of an exemplary guard-bit insertion circuit for use in conjunction with the apparatus illustrated in FIG. 7 according to an exemplary aspect of the present invention.
Figure 8B:
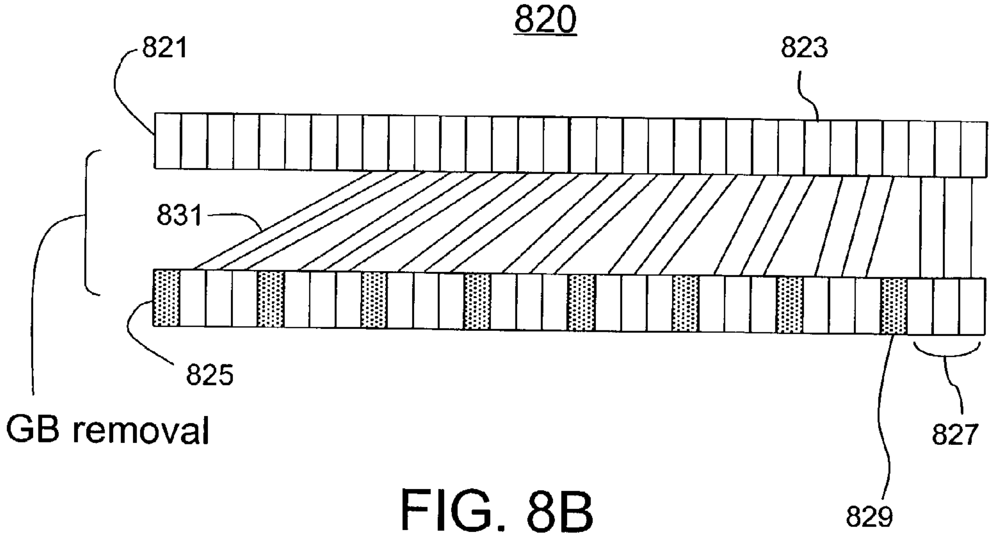
FIG. 8B is a schematic illustration of an exemplary guard-bit removal circuit for use in conjunction with the apparatus illustrated in FIG. 7 according to an exemplary aspect of the present invention.

The guard-bit-insertion circuits 701' and 703' and the guard-bit-removal circuit 709' referred to in FIG. 7 will now be described in greater detail with reference to FIGS. 8A and 8B. The exemplary circuits illustrated in FIGS. 8A and 8B reflect a 32-bit register arrangement configured for the field GF($7^8$); however, the concepts reflected in FIGS. 8A and 8B are generally applicable to registers of others sizes and to other finite fields GF($p^k$). FIG. 8A illustrates an exemplary guard-bit-insertion circuit 800 that can be used for guard-bit-insertion circuits (GB insertion) referred to by reference numerals 701' and 703', respectively, in FIG. 7. As shown in FIG. 8A, the circuit 800 comprises a first register 801 with a plurality of bit positions 803 (e.g., 32 bits). The circuit 800 also comprises a register 805 having plural groups 807 of bit positions intended to store binary data representing field coefficients of a field element of GF($p^k$) and a plurality of guard-bit positions 809 (lightly shaded regions). The circuit 800 also comprises a plurality of electrical connections 811 configured to route data from register 801 to register 805 in a manner that provides a guard-bit position 809 adjacent to the most significant bit position of the preceding group of 3-bit positions 807. The guard-bit positions 809 are electrically grounded to provide zeros for these bit values, but these electrical connections are not shown in the FIG. 8A. Such a circuit can be formed, for example, using conventional lithographic techniques.

In this manner, each 3-bit group 807 of bit positions in register 805 can store binary data representing a coefficient of a field element of GF($7^8$), and each group 807 of bit positions in register 805 is separated from an adjacent group 807 of bit positions by a single guard bit 809. Accordingly, the guard-bit-insertion circuit 800 allows initial binary data representing coefficients of a field element to be transferred in parallel from register 801 to register 805 in a manner that inserts guard bits between groups of data bits representing coefficients of the field element.

Similarly, an exemplary guard-bit-removal circuit 820 is illustrated in FIG. 8B for a 32-bit GF($7^8$) configuration. As illustrated in FIG. 8B the guard-bit-removal circuit 820 is the mirror image of the guard-bit-insertion circuit 800 shown in FIG. 8A. The guard-bit-removal circuit 820 comprises a register 825, a register 821 and a plurality of electrical connections 831. The register 825 comprises plural groups 827 of bit positions and a plurality of guard-bit positions 829, each guard-bit position being located adjacent to the most significant bit of a given group 827 of bit positions. As illustrated in FIG. 8B, the electrical connections 831 are configured such that binary data representing field coefficients of a field element stored in register 825 are transferred to register 821 in a manner that eliminates guard bits between adjacent groups of data bits representing field coefficients. That concludes the discussion of FIGS. 8A and 8B.

Multiplication Using Single-Guard-Bit Representation

According to another aspect of the invention, an exemplary form of GF_p_k_MUL for the single-guard-bit representation will now be described for computing the product of two (non-zero) field elements $\alpha_1$ and $\beta_J$ in GF($p^k$). The case where one field element is zero is trivial and does not need to be described. This discussion is applicable to p written in the functional forms $p=2^m-1$, $p=2^m+1$, $p=2^m-d$ and $p=2^m+d$.

As noted previously in the discussion pertaining to Equations 9–12, a multiplicative group is cyclic, and a field element g, therefore, can be found such that any other non-zero field element can be written as $g^x$ for some integer $x<p^k$. Thus, the discrete logarithms of all field elements, as well as the corresponding anti-logarithms, can be pre-computed once, and table "look-ups" can be used to calculate the product of two field elements. Similarly, with regard to the present invention for binary data "a" representing any $\alpha_j$ according to the single-guard-bit representation (i.e., where guard bits of value zero are placed in bit positions v(m+1)−1 where v=1, 2, . . . , k—that is, every successive m-th bit position), the following relations are applicable:

$$\mathrm{DLOG}\{a\}=x \tag{16}$$

$$\mathrm{ANTILOG}\{x\}=a \tag{17}$$

where $0\leqq x<p^k$ such that $g^x=\alpha_J$. Accordingly, in the single-guard-bit representation, multiplication of field elements of GF($p^k$) can be accomplished in accordance with the relation:

$$c=\mathrm{ANTILOG}\{(\mathrm{DLOG}\{a\}+\mathrm{DLOG}\{b\})\bmod(p^k-1)\} \tag{18}$$

where "a" is first binary data (register contents) stored according to the single-guard-bit representation representing a first field element, "b" is second binary data (register contents) stored according to the single-guard-bit representation representing a second field element, and "c" is third binary data (register contents) representing a third field element equal to the product of the first and second field elements. For example, in terms of the notation used with the algorithms PRODUCT(α,β) and GF_p_k_MUL described previously, "a" can represent a field element $\alpha_j$ of GF($p^k$), and "b" can represent a field element $\beta_{1-J}$ of GF($p^k$). Accordingly, the product of two field elements of GF($p^k$) in the single-guard-bit representation according to the present invention can be computed using only three table look-ups and one modular addition.

According to an exemplary aspect of the present invention, the system 100 illustrated in FIG. 1 can be used to implement the above-noted approach for multiplication of field elements. In particular, the system 100 can be configured such that the processor 105 executes the exemplary series of steps illustrated in FIG. 9 to generate third binary data referred to in step 305 of FIG. 3. It is assumed that steps 301 and 303 shown in FIG. 3 have already been executed by the processor 105 such that first binary data representing a first field element of GF($p^k$) are stored in a first register (e.g., register 107 shown in FIG. 1) and such that second binary data representing a second field element are stored in a second register (e.g., register 109). The steps illustrated in FIG. 9 then represent an exemplary implementation of step 305 shown in FIG. 3. The approach 900 illustrated in the flow diagram of FIG. 9 will now be described.

Figure 9:
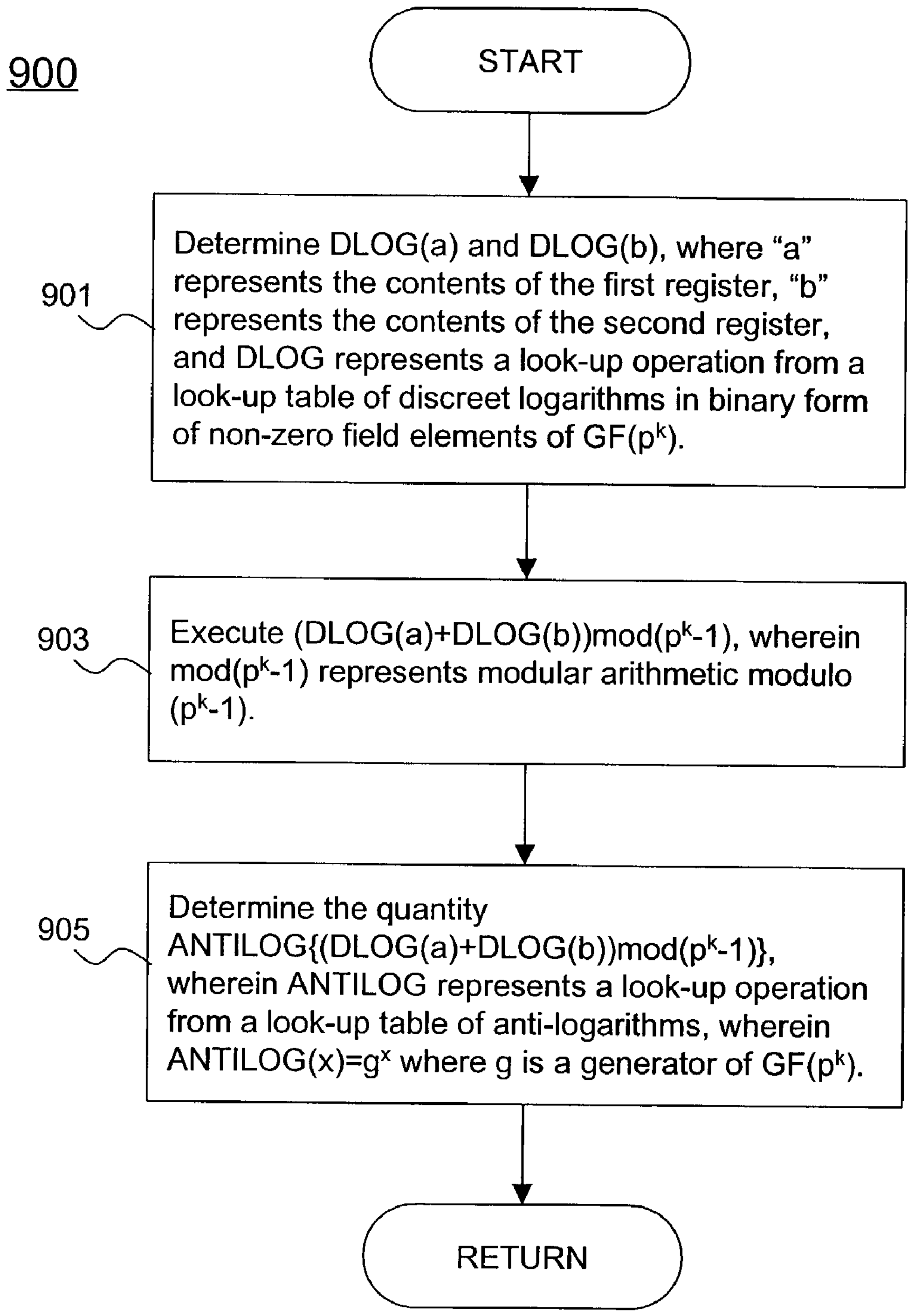
FIG. 9 is a flow diagram illustrating a method of processing binary data representing field elements of an odd-characteristic finite field in order to determine the product of those elements according to an exemplary aspect of the present invention.

FIG. 9 is a flow diagram illustrating steps executed by the processing unit 105 for processing the first and second binary data to generate third binary data that represents the product of the first and second field elements. As indicated at step 901 of FIG. 9, the processor determines the quantities DLOG(a) and DLOG(b) where "a" represents the contents of the first register and "b" represents the contents of the second register. In step 901, the DLOG operation represents a look-up operation from a look-up table of discrete logarithms in binary form of non-zero field elements of GF($p^k$). The look-up table of discrete logarithms can be stored in memory 101 illustrated in FIG. 1. An example of a simple look-up table for the DLOG operation for GF($3^2$) is given in FIG. 10A. The look-up table in FIG. 10A will be described in greater detail below.

At step 903, the processing unit 105 executes addition of the quantities DLOG(a) and DLOG(b) and reduces the result of this addition modulo ($p^k-1$). At step 905, the processing unit 105 determines the quantity ANTILOG{(DLOG(a)+DLOG(b))mod($p^k-1$)}. The ANTILOG operation represents a look-up operation from a look-up table of anti-logarithms, wherein ANTILOG(X)=$g^x$, where g is a generator of GF($p^k$). An example of a simple look-up table for the ANTILOG operation for GF($3^2$) is given in FIG. 11A. The look-up table in FIG. 11A will be described in greater detail below. The result of the operations set forth in step 905 is third binary data referred to in step 305 of FIG. 3 which, in this example, represents a third field element that is the product of the first and second field elements.

Exemplary look-up tables of discrete logarithms and anti-logarithms referred to above for the single-guard-bit representation will now be described. For the sake of brevity, a look-up table of discrete logarithms may hereinafter also be referred to as a DLOG table, and a look-up table of anti-logarithms may hereinafter also be referred to as an ANTILOG table.

In one example, the DLOG table can be indexed by binary data corresponding to field elements of GF($p^k$) wherein the binary data are viewed as memory addresses. This type of DLOG table is referred herein as a "directly addressed" DLOG table and uses consecutive binary data corresponding to field elements as memory addresses. For $p=2^m-1$, for example, the DLOG table can be indexed (addressed) by k(m+1)-bit binary strings. Alternatively, the DLOG table can be indexed using binary strings k(m+1)−1 bits in length if the most significant guard bit of the binary data representing each field element not used for addressing (the most significant guard bit is not needed for table look-ups). If the most significant guard bit is not used for addressing, the size of the DLOG table can be reduced by a factor of two. Assuming that binary data representing field elements is referred to as a(t) (where t is the polynomial variable in a polynomial basis representation), the corresponding looked-up value from the DLOG table at an address corresponding to a(t) is the integer "x" where x=DLOG{a(t)}. In a directly addressed DLOG table for $p=2^m-1$, given that the single-guard-bit representation of field elements allocates every m-th bit to be a guard bit (for a total of k guard bits), there are only $2^{km}$ relevant entries in the DLOG table that are actually used during look-up. These relevant entries are those for which a quantity a(t) has zeros in the guard-bit positions. Such a DLOG table overall has $2^{k(m+1)}$ reserved memory locations (rows), if indexed using binary strings k(m+1) bits in length, or $2^{k(m+1)-1}$ rows, if indexed using binary strings k(m+1)−1 bits in length. Stated differently, rows in a direct addressing DLOG table for which the field element a(t) (the memory address) has a "one" in any guard-position are not used.

For example, if k=8 and p=3 (i.e., m=2), each element of the field can be represented as a 24-bit string (with zeros in every third bit position), and the DLOG table can, accordingly, be indexed by strings of length 8(2+1)=24 (equivalent to $8(\log_2(3)+1)$). In this example, there are 224 reserved memory locations in the DLOG table, but only one in every 256 of these will contain data that is actually accessed, since look-ups will only be conducted for addresses corresponding to field elements, i.e. strings whose guard-bit locations are zeros. In the above example, there are k=8 guard-bit locations, so only one table index in every $2^8$ (=256) will be used for actual table look-ups. However, for moderate k and m (e.g., k(m+1)<25), implementing a look-up table in this manner is in many cases still feasible.

As noted above, the most significant guard bit is not needed to index a directly addressed DLOG table, and this observation allows saving a factor of two in the size of the DLOG table. As will be described below, for p of the form $p=2^m+1$, $p=2^m-d$ and $p=2^m+d$ (d>1 and d odd), each coefficient of a field element is represented using m+2, m+1 and m+2 bits of binary data (not including guard bits), respectively, instead of m bits as for $p=2^m-1$. Directly addressed DLOG tables for p of forms other than $p=2^m-1$, therefore, are correspondingly larger than directly addressed DLOG tables for p of the form $p=2^m-1$.

An exemplary DLOG table 1000 illustrating concepts described above for the single-guard-bit representation is shown in FIG. 10A for the simple case of GF($3^2$) where $p=2^m-1$ for m=2. The example in FIG. 10A was constructed for GF($3^2$) using the generator g(t)=t and the irreducible polynomial $p(t)=t^2+t+2$. Such a DLOG table can be implemented, for example, using an 8-bit, 16-bit, 32-bit, etc., architecture. As noted previously, choosing an appropriate generator and irreducible polynomial for a given finite field GF($p^k$) is within the purview of one of ordinary skill in the art.

The exemplary DLOG table 1000 illustrated in FIG. 10A comprises memory addresses 1001 corresponding to the field elements a(t) in binary form and stored values 1003 corresponding to the associated integers x in binary form. In addition, the exemplary DLOG table 1000 comprises $2^{k(m+1)}=2^6=64$ rows (entries) 1005. In the example of FIG. 10A, each memory address comprises a k(m+1)=2(2+1)=6-bit string, and the left-most bit of each memory address 1001 corresponds to the most significant guard bit of a corresponding field element. This most significant guard bit can be eliminated from the memory addresses 1001, if desired, allowing the DLOG table 1000 to be indexed by binary strings k(m+1)−1 bits in length.

The memory addresses 1001 comprise groups of data bits corresponding to coefficients of field elements in the manner previously described. Each memory address 1001 further comprises a plurality of guard bits 1005

The stored values 1003 of the DLOG table 1000 are illustrated as being functionally adjacent to the memory addresses 1001 for purposes of illustration. Each stored value 1003 comprises binary data representing an integer x as defined above. Reference information 1050 is presented in FIG. 10B in a manner that is aligned via rows with the information in the DLOG table 1000 shown in FIG. 10A. The reference information 1050 in FIG. 10B is not part of the DLOG table 1000 and is merely provided for convenience to reflect the association between the binary information shown in the DLOG table 1000 and the field elements a(t) in polynomial form and the actual integer values x. Various blank entries denoted by "--" are present in the "x" and "a(t)" columns of both FIG. 10B and FIG. 10A. These blank entries stem from two considerations. First, some blank entries reflect the fact that there is no integer x that satisfies $g^x=0$ for the field element "0" (a(t)=0), as is known to those of ordinary skill in the art. Other blank entries correspond to memory addresses 1001 having a "one" in any corresponding guard-bit position. As noted above, these entries are not used in the exemplary DLOG table 1000.

In the above-described direct-addressing example, the DLOG table 1000 has reserved memory locations that are not used for look-up operations corresponding to the two types of blank entries described above. The majority of these blank entries are associated with memory addresses having a "one" in any guard-bit position. However, compact DLOG tables can be implemented without such blank entries. For example, instead of associating field elements with consecutive memory addresses, binary data representing field elements a(t) with only zeros at guard-bit positions can be stored in a DLOG table. Corresponding values for x=DLOG (a(t)) can also be stored in the DLOG table. The stored a(t) entries and x entries can be associated with each other such that looking up a given a(t) entry returns the corresponding x entry. This approach does not have the simplicity of using consecutive binary data corresponding to a(t) entries as addresses, but it does have the advantage of requiring less memory space.

In one aspect of the present invention, a multiple-guard-bit representation can be used to obtain compact tables without significantly complicating the look-ups, as will be described later. In general, such a compact DLOG table can be configured with $2^{km+1}$ reserved memory locations (e.g., viewed as $2^{km}$ rows with 2 entries per row), all of which can be used for look-up operations. Alternatively, such a compact DLOG table can be implemented using $2^{km}$ reserved memory locations if the most significant guard bit is eliminated. In comparison, a directly addressed DLOG table comprises $2^{k(m+1)}$ reserved memory locations (or $2^{k(m+1)-1}$ reserved memory locations if the most significant guard bit is eliminated). Thus, utilizing a compact DLOG table can be useful for computations involving relatively larger field elements (e.g., field elements represented by binary data of greater than 25 bits including guard bits).

Exemplary aspects of ANTILOG tables according to the present invention will now be described. ANTILOG tables according to the present invention are similar to DLOG tables described above. In particular, ANTILOG tables also contain binary information representing the quantities x and a(t). However, ANTILOG tables are indexed (addressed) by binary data representing the quantity x=DLOG(a(t)). Thus, for a memory address corresponding to a given value of x, the looked-up quantity is a(t)=ANTILOG(x). Given that ANTILOG tables are indexed by x instead of a(t) (as for DLOG tables), ANTILOG tables are considerably smaller than corresponding DLOG tables. In particular, ANTILOG tables have $p^k-1$ reserved memory locations regardless of the functional form of p. The fact that there are $p^k-1$ reserved memory locations instead of $p^k$ reserved memory locations stems from the fact that there is no integer x corresponding to the field element $a(t)=g^x=0$.

An exemplary ANTILOG table 1100 is shown in FIG. 11A for the simple case of $GF(3^2)$ for the single-guard-bit representation where $p=2^m-1$ and m=2. The example in FIG. 11A was constructed for $GF(3^2)$ using the generator g(t)=t and the irreducible polynomial $p(t)=t^2+t+2$. Such an ANTILOG table can be implemented, for example, using an 8-bit, 16-bit, 32-bit, etc., architecture. The exemplary ANTILOG table 1100 illustrated in FIG. 11A comprises memory addresses 1101 corresponding to integers x in binary form and stored values 1103 corresponding to the associated field elements a(t) in binary form.

The memory addresses 1101 of the exemplary ANTILOG table 1100 are illustrated in FIG. 11A as being functionally adjacent to the stored values 1103 for purposes of illustration. Each stored value 1103 comprises groups of data bits representing coefficients of field elements in the manner previously described. Each stored value 1103 further comprises a plurality of guard bits 1105 whose entries are zeros.

In a manner similar to that shown in FIG. 10B, reference information 1150 is presented in FIG. 11B in a manner that is aligned via rows with the information in the ANTILOG table 1100 shown in FIG. 11A. The reference information 1150 in FIG. 11B is not part of the ANTILOG table 1100 and is merely provided for convenience to reflect the association between the binary information shown in the ANTILOG table 1100 and the field elements a(t) in polynomial form and the actual integer values x.

As noted above, DLOG tables and ANTILOG tables according to the present invention can be stored using any suitable hardware architecture (e.g., 8-bit, 16-bit, 32-bit, etc.). In addition, as noted above, directly addressed DLOG tables can be implemented with consecutive binary data representing field elements used as memory addresses. Alternatively, compact DLOG tables can be implemented that do not use direct addressing as described above. Such compact DLOG tables use less memory space but do not allow indexing directly by binary data representing field elements, and a more time-consuming table look-up is needed for compact DLOG tables. However, in the multiple-guard-bit representation described below, a considerably more compact DLOG table can be provided (approximately a factor $2^k$ smaller) that still allows direct addressing and in which only a very small decrease in efficiency is encountered with regard to table look-ups.

Memory requirements for directly addressed look-up tables for the single-guard-bit representation for $p=2^m-1$ are as follows. For a directly addressed DLOG table, each row contains the binary form of an integer x of size $k*\log_2(p)\approx km$ bits, and (not including the most significant guard bit) the table is indexed by (k−1)(m+1)+m=k(m+1)−1 bit binary strings corresponding to the field elements. Thus, the size of the DLOG table is roughly $km2^{k(m+1)-1}$ bits. For the ANTILOG table, each entry contains at most a k(m+1)-bit string, and there are $p^k-1$ entries. Thus, the size is $k(m+1)(p^k-1)$ bits, which is roughly equal to $k(m+1)2^{km}$ bits. Accordingly, the DLOG table is roughly a factor $2^{k-1}$ larger than the ANTILOG table.

It is possible to reduce table sizes even further (for both the single-guard-bit representation and the multiple-guard-bit representation) at the cost of carrying out a larger number of multiplications. For example, the aforementioned Karatsuba's method for multiplying polynomials of degree k works by replacing a single multiplication of two degree-k polynomials with three multiplications, each involving polynomials of degree k/2. Those of ordinary skill in the art will recognize that above-described exemplary multiplication according to the present invention can be similarly modified to use tables of smaller size in conjunction with more table look-ups. For instance, if S is a table size for carrying exemplary multiplication according to the present invention as described above, a modification can be made wherein tables of size $S^{1/2}$ are used in conjunction with three times as many table look-ups. Notwithstanding the increased cost in table look-ups, this approach can be desirable for memory-constrained environments.

In view of the discussion above with regard to GF_p_k_MUL and the corresponding DLOG and ANTILOG tables, it can be seen that the above-described exemplary approach for carrying out multiplication of field elements of $GF(p^k)$ according to the present invention differs significantly from conventional approaches. First, in comparison to approaches for binary finite fields with characteristic p=2, the present approach stores binary data representing field elements differently by utilizing guard bits. Accordingly, the DLOG and ANTILOG tables according to the present invention also possess guard bits, such as illustrated in FIGS. 10A and 11A, whereas the look-up tables for conventional approaches involving binary finite fields do not possess (or require) guard bits.

In addition, in comparison to conventional approaches for multiplication of field elements of an odd-characteristic finite field, the present method accomplishes the multiplication task with significantly fewer operations. In particular, with regard to the extension field $GF(p^{lk})$ referred to above in the discussion regarding SUM(α, β) and PRODUCT(α, β), each element of the extension field is represented as a vector (polynomial) of length l, where each component (coefficient) is stored according to the single-guard-bit representation. Multiplying two elements in the extension field requires approximately $3l^2$ operations rather than $(lk)^2$ operations as would be required using conventional approaches. Thus, even for relatively small values of k, a significant increase in computational speed is achieved.

In another aspect of the invention relating to multiplications of field elements of an odd-characteristic finite field, a dedicated hardware apparatus can be provided for carrying out operations of GF_p_k_MUL illustrated in FIG. 9. FIG. 12 is a functional block diagram illustrating such an exemplary hardware apparatus. In particular, the exemplary apparatus 1200 illustrated in FIG. 12 provides another approach for generating third binary data, denoted as c in FIG. 4, that can represent the product of a first field element and a second field element of $GF(p^k)$. In FIG. 12, solid lines represent electrical connections for the flow of data, and dotted lines represent electrical connections for the flow of control signals. The apparatus 1200 is described here in the discussion pertaining to the single-guard-bit representation, but the apparatus 1200 is equally applicable to a multiple-guard-bit representation, which is described later. Moreover, the apparatus 1200 is independent of the form of the characteristic value p (i.e., $p=2^m\pm1$ or $p=2^m\pm d$).

The apparatus 1200 comprises a first register 1201 and a second register 1203 for holding first binary data (register contents "a") and second binary data (register contents "b"), respectively. The first binary data and the second binary data represent field elements of the finite field $GF(p^k)$. Here, it is assumed that the first and second binary data in the first and second registers 1201 and 1203 are already configured with zeros at appropriate guard-bit locations. However, guard-bit insertion and removal circuits, such as described with regard to FIGS. 7 and 8 could also be included if desired such that initial binary data without guard bits could be input to the apparatus 1200. The apparatus 1200 also comprises a combinatorial logic and clock device (clock/logic) 1205, a first multiplexer 1207 (MUX1), a DLOG look-up memory 1209, and an ANTILOG look-up memory 1211. The DLOG and ANTILOG look-up memories can be implemented, for example, using a random access memory (RAM) or a flash memory. The apparatus 1200 also comprises a register 1213 for holding the binary quantity DLOG(a), a register 1215 for holding the binary quantity DLOG(b), an addition gate (+) 1217 (also referred to as an adder), and a register 1219 for holding the integer value $p^k-1$ in binary form, which can be received, for example, from a processor. Alternatively, a specialized circuit can be provided along with the register 1219 to generate the value $p^k-1$ upon input of values for p and k. Configuring such a specialized circuit is within the purview of one of ordinary skill in the art. The apparatus 1200 also comprises a modulo arithmetic circuit 1221 (MOD) for computing the remainder of an input quantity divided by $p^k-1$, which is supplied by register 1219. The circuit 1221 can be conventional modular arithmetic hardware known to those of ordinary skill in the art and does not need to be described further. The apparatus 1200 further comprises a second multiplexer 1223 (MUX2) and an output register 1225 for holding third binary data "c" resulting from computations within the apparatus. The clock/logic unit 1205 can also have an output terminal (not shown) for providing a signal to be input to another hardware apparatus to initiate computations in another hardware apparatus when computations in the apparatus 1200 are complete. For example, another hardware apparatus can be another apparatus 1200 or an addition apparatus 600 such as illustrated in FIG. 6.

The operation of the exemplary apparatus 1200 illustrated in FIG. 12 will now be described. First, the DLOG look-up memory 1209 and the ANTILOG look-up memory 1211 are initialized once with appropriate discrete logarithm and anti-logarithm data. This can be accomplished by providing an initial programming signal to the clock/logic unit 1205 via the line labeled s, and by simultaneously supplying discrete logarithm and anti-logarithm data to the DLOG look-up memory 1209 and the ANTILOG look-up memory 1211, respectively, via external data buses labeled eD1 and eD2. At the same time, address data is supplied to the DLOG memory 1209 and to the ANTILOG memory 1211 by external address buses eA1 and eA2, respectively, via MUX1 1207 and MUX2 1223, respectively. As noted above, the look-up memories 1209 and 1211 can be implemented with RAM or flash memory, for example. Alternatively, if the apparatus 1200 is to be dedicated for particular values of p and k, the look-up memories 1209 and 1211 can be implemented using ROM, and pre-computations of the discrete logarithm and antilogarithm data can be done once and loaded into the ROM at manufacture.

With the look-up memories 1209 and 1211 initialized, first binary data representing a first field element and second binary data representing a second field element can be input on lines labeled a and b to the first register 1201 and the second register 1203, respectively. It is assumed that the first binary data and the second binary data are already configured with zeros at appropriate guard-bit positions. Alternatively, guard-bit insertion circuits can be utilized to insert appropriate guard bits before loading the first binary data and second binary data into the first and second registers 1201 and 1203, respectively, such as described with regard to FIGS. 7 and 8. Binary data representing the quantity $p^k-1$ are input on the line labeled "$p^k-1$" to the register 1219. The first binary data, the second binary data, the discrete logarithm and antilogarithm data, and the binary data representing the quantities p and k can be provided, for example, from a processor (not shown) or from one or more hardware apparatuses (not shown). For example, an addition apparatus 600 as illustrated in FIG. 6 or 7 can be used to provide at least some of this data (e.g., first binary data and second binary data) via a conventional routing circuit.

Computation is initiated by a start signal on the line labeled s as shown in FIG. 12. The start signal can also be provided from a processor (not shown) or from one or more hardware apparatuses (not shown). When the values of the first binary data and second binary data in the registers 1201 and 1203 are stable, a signal s1 locks those values into the first and second registers 1201 and 1203, respectively. When values of the binary data representing the quantity $p^k-1$ in register 1219 are stable, a signal s5 locks those values in register 1219. A signal s2 is then input to MUX1 1207 which then passes the contents, a, of the first register 1201 to the DLOG memory 1209 to access the DLOG memory 1209. When the output values from the DLOG memory are stable, the output values are locked into register 1213 by a signal s4. Register 1213 now holds the value of DLOG(a). Another signal s2 is then input to MUX2 1223 which then passes the contents, b, of the second register 1203 to the DLOG memory 1209 to access the DLOG memory 1209. When the output values from the DLOG memory are stable, the output values are locked into register 1215 by a signal s3. Register 1213 now holds the value of DLOG(b). The adder 1217 then computes the integer sum of the contents of registers 1213 and 1215 and sends the result to the modulo arithmetic circuit 1221 (MOD) to compute the remainder of the value input thereto when divided by the quantity $p^k-1$, which is available from register 1219. The output from MUX2 is then input to the ANTILOG memory 1211 to access the ANTILOG memory 1211. When the output values from the ANTILOG memory 1211 are stable, the output values are locked into register 1225 by a signal s6. Register 1225 now holds the value ANTILOG{(DLOG(a)+DLOG(b))mod ($p^k-1$)} in the single-guard-bit representation, which is available for output as register contents, c. If desired, however, a guard-bit-removal circuit, such as illustrated in FIGS. 7 and 8, could be placed functionally between the ANTILOG memory 1211 and the register 1225 to remove guard bits from the result of the computations. This completes the description of the exemplary multiplication apparatus 1200 illustrated in FIG. 12.

In the apparatus 1200 as described, the first register 1201 and a processor (not shown) can be viewed as means for storing first binary data. Alternatively, the first register 1201 and a guard-bit insertion circuit (not shown) can be viewed as means for storing first binary data. The second register 1203 and a processor (not shown) can be viewed as means for storing second binary data. Alternatively, the second register 1203 and a guard-bit insertion circuit (not shown) can be viewed as means for storing second binary data. Further, the register 1225 can be viewed as means for storing third binary data. Moreover, the clock/logic device 1205 and any or all of the remaining devices illustrated in FIG. 12 can be viewed as means for executing at least one operation on the first binary data and the second binary data.

Addition Using Multiple-Guard-Bit Representation, $p=2^m-1$

Exemplary aspects of the invention pertaining to addition of field elements where $p=2^m-1$ are now described for the multiple-guard-bit representation. Here it is assumed that invention is implemented using a hardware architecture operating on at least 2 km bit quantities (i.e., registers are at least 2 km bits in size). The invention according to the multiple-guard-bit representation may be implemented, for example, using the system 100 illustrated in FIG. 1, which has already been described. In addition, dedicated hardware apparatuses, such as illustrated in FIGS. 6, 7, 8 and 12 and which have already been described, may also be used to implement the invention according to the multiple-guard-bit representation. Descriptions of these apparatuses are not reproduced here. However, appropriate modifications to the apparatuses illustrated in FIGS. 6, 7, 8 and 12 for the multiple-guard-bit representation, where necessary, will be described below.

The representation of field elements of GF($p^k$) in the multiple-guard-bit representation was described previously in the discussion pertaining to the example of FIG. 2C. As noted in that discussion, elements of a finite field are stored as binary strings, but instead of having only one guard-bit position between adjacent groups of data bits representing coefficients of a field element, a plurality of guard-bit positions (e.g., m guard-bit positions) are provided between adjacent groups of bit positions that are allocated to store binary data representing the field coefficients of a field element. For example, as illustrated in FIG. 2C for GF($3^8$), eight groups of bit positions 221-*r* (unshaded bit positions) are allocated to store binary data representing field coefficients $\alpha_{7,i}, \ldots, \alpha_{1,i}, \alpha_{0,i}$, and adjacent groups of bit positions 221-*r* are separated by groups of two guard-bit positions 213-*r* (lightly shaded bit positions). The guard-bit positions are initialized to each contain a binary value of zero.

An implementation of an exemplary form of GF_p_k_ADD for the field GF($p^k$) where $p=2^m-1$ is now described for the multiple-guard-bit representation. To perform the addition of two field elements $\alpha_1$ and $\beta_1$ using first and second binary data stored in first and second registers according to the multiple-guard-bit representation, the operations associated with GF_p_k_ADD are in principle the same as those for the single-guard-bit representation. Only the number of guard-bit positions between adjacent groups of data bits representing field coefficients and the forms of the first and second predetermined binary quantities, M1 and M2, are changed. Where multiple guard-bit positions (e.g., "m" guard-bit positions) are configured between adjacent groups of data bits associated with field coefficients, the approach proceeds as previously described with regard to FIG. 4. That is, M1 is assigned to have values of zero at bit positions corresponding to bit positions of first guard bits in the first register and binary values representing the quantity $2^m-1$ at bit positions corresponding to bit positions of groups of first data bits in the first register. M2 is given by M2=NOT(M1). Then, in a manner similar to that described above for the single-guard-bit representation, third binary data representing the sum of the first and second field elements of GF($p^k$) can be generated by carrying out the operations in Equation 19

$$c=((a+b)\&M1)+(((a+b)\&M2)>>m) \qquad (19)$$

where a and b represent contents of the first and second register, respectively, in which the first and second binary data are stored according to the multiple-guard-bit representation and where c represents the resulting contents of a third register holding third binary data also stored according to the multiple-guard-bit representation. The explanation of how the above-noted operations result in correctly providing third binary data representing a third field element of GF($p^k$) equal to the sum of the first and second field elements is the same as described above for the single guard-bit representation and is not repeated here.

As noted above, hardware apparatuses illustrated in FIGS. 6, 7 and 8 can be used to implement the invention according to the multiple-guard-bit representation. No modifications to the apparatus 600 illustrated in FIG. 6 are necessary in this regard. It is merely necessary to recognize that the first and second binary data are stored in the first and second registers 601 and 603 according to the multiple-guard-bit representation and that the first and second predetermined binary quantities M1 and M2 are configured as described above.

For the multiple-guard-bit representation, a modification to the addition apparatus 700 illustrated in FIG. 7 is required in the sense that the guard-bit-insertion circuits 701' and 703' and the guard-bit removal circuit 709' must be configured to insert multiple guard bits, instead of a single guard bit, between adjacent groups of data bits representing coefficients of a field element. In this regard, the exemplary guard-bit-insertion circuit 800 illustrated in FIG. 8A can be configured such that the electrical connections 811 are displaced wherein more than one guard-bit position 809 without an electrical connection 811 is inserted between adjacent groups of bit positions 807 in the register 805. Similarly, the exemplary guard-bit-removal circuit 820 illustrated in FIG. 8B can be configured such that the electrical connections 831 are displaced to remove more than one guard-bit position between adjacent groups of bit positions 807 in the register 825. With such modifications for the multiple-guard-bit representation, the operation of the apparatus 700 illustrated in FIG. 7 is the same as previously described.

Multiplication Using Multiple-Guard-Bit Representation

Implementations of exemplary forms of GF_p_k_MUL for the field GF($p^k$) will now be described for the multiple-guard-bit representation. This discussion is applicable to p given by the functional forms $p=2^m\pm1$ and $p=2^m\pm d$. The only differences that occur for different functional forms of p relate to the number of bits used to store binary data representing a given coefficient of a field element and how many bits are allocated in ANTILOG tables for each coefficient of a field element. These differences will be discussed in greater detail below. The immediate discussion will proceed for the case where $p=2^m-1$ for which m bits are used to store each coefficient of a field element, but the discussion is applicable to the other functional forms for p noted above.

In a first exemplary implementation of GF_p_k_MUL for the multiple-guard-bit representation, a compression function is used to more efficiently utilize memory space allocated for DLOG and ANTILOG tables. This approach uses directly addressed DLOG and ANTILOG tables in a manner somewhat similar to that described above for the single-guard-bit representation, but the forms of the directly addressed DLOG and ANTILOG tables are different. In particular, to save memory space allocated for the DLOG and ANTILOG tables, the DLOG and ANTILOG are configured without guard bits (making them about $km2^{km}$ bytes in combined size). For a directly addressed DLOG table, where binary data corresponding to field elements are used as memory addresses, eliminating guard bits from the DLOG table means that the total number of consecutive memory addresses are reduced. Thus, the number of reserved memory locations are also reduced. For the ANTILOG table, which is also directly addressed and which uses binary data representing integers x=DLOG(a(t)) as memory addresses, eliminating guard bits reduces the number of bits used to store binary data representing field elements a(t), thereby reducing memory requirements. To utilize such tables, binary data representing field elements of GF($p^k$) stored in the multiple guard representation are compressed before carrying out a DLOG table look-up. In addition, resulting binary data is then decompressed after carrying out an ANTILOG table look-up. This is now described in greater detail.

Figure 13:
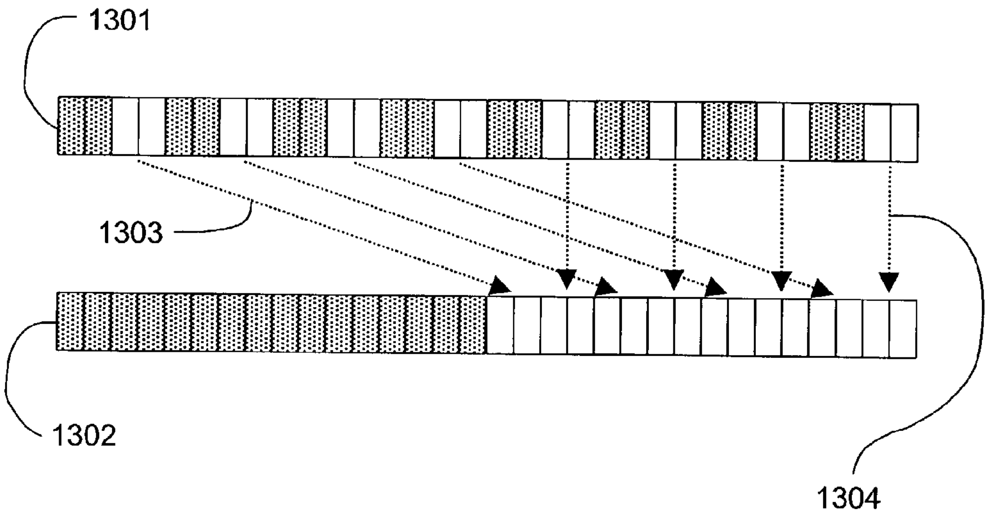
FIG. 13 is a schematic illustration of a compression operation for compressing binary data stored in a register in a multiple-guard-bit representation according to an exemplary aspect of the present invention.

Here it is assumed that field elements are stored according to the multiple-guard-bit representation with m guard bits between adjacent groups of data bits that represent coefficients of a field element. However, the present approach is not limited to m guard bits between adjacent groups of data bits and modifications for multiple guard bits other than m guard bits between adjacent groups of data bits will be apparent from the discussion below. Let t=INT(k/2) where INT(k/2) is the integer value of k/2 rounded down to nearest integer. A compression can be executed on register contents, a, stored in the multiple-guard-bit representation using a compression function (COMP) given by $$COMP(a)=\{(aXOR(a>>(2t-1)m))\&M3\} \qquad (20)$$

where M3 is predetermined binary quantity representing the value $2^{km}-1$ so that COMP(a) has km bits. (The XOR can be replaced by a bitwise OR-operation in equation 20 above.) The COMP function moves groups of data bits representing field coefficients (that is, relevant, information-carrying data) from bit-position blocks 2jm, . . . , (2j+1)m−1, where j≧t, to the reserved guard-bit-position blocks (2(j−t)+1) m, . . . , (2(j−t)+2)m−1. This is shown, for example, in FIG. 13 which illustrates the above-noted mapping of bit positions from a register 1301 to bit positions of a register 1302 where uncompressed data in register 1301 is compressed into register 1302. Dotted oblique lines 1303 illustrate the mapping of bit-position blocks shifted relative to their original positions. Dotted vertical lines 1304 illustrate the mapping of bit position blocks which are not shifted relative to their original positions. As illustrated in FIG. 13 for the case of GF($3^8$) where t=4 and m=2 (because $p=2^m-1$), as an example for j=t=4, data in bit positions 16 (i.e., 2jm) and 17 (i.e., (2j+1)m−1) are mapped to bit positions 2 (i.e., (2(j−t)+1)m) and 3 (i.e., (2(j−t)+2)m−1). Other data blocks are similarly mapped. Accordingly, no groups of data bits representing coefficients of a field element are lost in the above-noted operations. The directly addressed DLOG table is configured such that the memory addresses correspond to COMP values of associated field elements for fast look-up. The directly addressed ANTILOG table stores COMP values of binary data representing field elements. Moreover, all entries in the DLOG and ANTILOG tables will contain relevant (i.e., information-carrying) data. Hence, there is no empty or unused space in the DLOG and ANTILOG tables.

A decompression of compressed binary data can be carried out using a decompression function (DECOMP) in an analogous manner. Let M4 be a predetermined binary quantity with ones in bit-positions 2jm, 2jm+1, 2jm+2, . . . , (2j+1)m−1, where j=0, 1, . . . , k−1, and zeros elsewhere. Then $$DECOMP(z)=\{(zXOR(z<<(2t-1)m))\&M4\} \qquad (21)$$

where, again, the XOR can be replaced by a bitwise OR-operation and <<(2t−1)m represents a left shift by $(2t-1)_m$ bits. The mask M4 will make sure that guard-bit positions contain only zeros. After a table look-up using the ANTILOG table has been carried out, the value is decompressed by the above DECOMP function. Hence, if a and b are first and second binary data (register contents of first and second registers) stored according to the multiple-guard-bit representation where a and b represent first and second field elements $\alpha_i$ and $\beta_j$ of GF($p^k$), a full multiplication of $\alpha_i$ and $\beta_J$ in GF($p^k$) can be achieved by executing the operations given in Equation 22

$$c=\text{DECOMP}(\text{ANTILOG}\{(\text{DLOG}\{\text{COMP}(a)\}+\text{DLOG}\{\text{COMP}(b)\})\text{mod}(p^k-1)\}) \qquad (22)$$

where c is third binary data that can be stored in a third register and that represents a third field element equal to the product of the first and second field elements. Thus, nine fast operations and one modular addition can be carried out to effectively perform $k^2$ multiplications in parallel. By implementing GF_p_k_MUL in this exemplary manner, computations can be easily carried out in extension fields of the type GF($p^{lk}$) via the algorithms PRODUCT(α, β) and REDUCE(δ, f) described earlier.

In a second exemplary implementation of GF_p_k_MUL for the multiple-guard-bit representation, it is possible to multiply field elements of GF($p^k$) without utilizing the above-noted compression and decompression functions. In this exemplary approach, the operations associated with GF_p_k_MUL are in principle the same as those for the single-guard-bit representation described above with regard to FIGS. 9–12. Only the number of guard-bit positions between adjacent groups of data bits representing field coefficients in a given register and the form of the DLOG and ANTILOG tables 1000 and 1100, respectively, are changed. In this regard, field elements are stored according to the multiple-guard-bit representation as described above and as illustrated, for example, in FIG. 2C. Moreover, the DLOG and ANTILOG tables are similar in form to the exemplary tables shown in FIGS. 10A and 11A, respectively, but are modified such that more than one guard-bit is provided between adjacent groups of data bits representing field coefficients. For example, the exemplary DLOG table 1000 illustrated in FIG. 10A can be modified for the multiple-guard-bit representation by providing more than one guard bit 1009 (e.g., m guard bits) between adjacent groups of data bits 1007. Similarly, the exemplary ANTILOG table 1100 illustrated in FIG. 11A can be modified for the multiple-guard-bit representation by providing more than one guard bit 1109 (e.g., m guard bits) between adjacent groups of data bits 1107. With such modifications, multiplication in the multiple-guard-bit representation can be carried out in the same manner as described above with reference to FIGS. 9–12. Of course, this immediate approach does not have the benefit of saving memory space as described above with regard to the form of GF_p_k_MUL for the multiple-guard-bit representation that utilizes compression and decompression functions.

Other Computations Using Single-/Multiple-Guard-Bit Representation, $p=2^m-1$

Some other operations that can be easily performed using the single- and/or multiple-guard-bit representation will now be described. First, scalar multiplication can easily be carried out using the multiple-guard-bit representation. Scalar multiplication, i.e. multiplying an element $\alpha_i=(\alpha_{k-1,1}, \ldots, \alpha_{1,1}, \alpha_{0,1})$ of $GF(p^k)$ by some $\gamma$ in the ground field GF(p), can be carried out in the multiple-guard-bit representation without the use of tables whatsoever. It is desired to compute the following quantity $$\gamma\cdot\alpha=(\gamma\alpha_{k-1,i} \bmod p, \ldots \gamma\alpha_{1,i} \bmod p, \gamma\alpha_{0,i} \bmod p). \quad (23)$$

As noted in Seminumerical Algorithms referred to above, for $p=2^m-1$, multiplication modulo p of two binary quantities u and v, both assumed to be in the range 0, 1, . . . , p, can be performed in accordance with the relations $$uv \bmod p = \{(uv \bmod 2^m) + (uv \operatorname{div} 2^m)\} \bmod p \quad (24)$$

$$= \{(uv \;\&\; (2^m-1)) + (uv >> \text{m})\} \bmod p. \quad (25)$$

Because $u<2^m$ and $v<2^m$, it is clear that $uv<2^{2m}$. Let u be binary data representing $\alpha_i$ stored in a first register according to the multiple-guard-bit representation, and let v be binary data representing $\gamma$ (an element of GF(p)) stored in a second register according to the multiple-guard-bit representation where v has binary values representing the quantity $\gamma$ in the right-most bit positions and zeros elsewhere. In other words, if v were viewed as binary data representing a vector quantity, the vector quantity would be $(0, 0, \ldots, 0, \gamma)$. Then, k modular multiplications can be performed in parallel by executing the following operations $$c'=uv \quad (26)$$

$$c=GF\_p\_k\_\text{ADD}(c'\&M1,(c'>>m)\&M1) \quad (27)$$

where M1 is a predetermined binary quantity with ones in bit-positions 2jm, (2j+1)m−1 and binary values representing the quantity $2^m-1$ elsewhere (j=0, 1, . . . , t, where t is defined as above), and where GF_p_k_ADD is the exemplary addition algorithm for the multiple-guard-bit representation as described above. In this regard, the multiplication of u and v in Equation 26 can be normal multiplication of register contents as conventionally carried out by known processors (e.g., integer multiplication or floating-point multiplication). Alternatively, the multiplication of u and v in Equation 26 can be carried out using table look-ups as described above with reference to FIG. 9. Hence, the convolution (multiplication) in this representation can be done in 4+5=9 simple operations, rather than 2k multiplication and modular reduction operations as would be conventionally required.

A special case of scalar multiplication is doubling. The field quantity $\alpha_1+\alpha_1$ (or $2\alpha_i$) given $\alpha_i$ an element of $GF(p^k)$ can be determined by executing the following operations $$c'=a<<1 \quad (28)$$

$$c=(c'\&M1)+((c'\&M2)>>m) \quad (29)$$

where a is binary data representing $\alpha_i$ stored according to the single-guard-bit representation or the multiple-guard-bit representation, and where M1 and M2 are predetermined binary quantities (mask quantities) defined as described above for either the single-guard-bit representation or the multiple-guard-bit representation as appropriate. Accordingly, it can be seen that doubling can be accomplished using five efficient operations.

Another computation that can be carried out is equality testing. For example, testing whether binary data, a, representing a field element of $GF(p^k)$ represents the zero element can be done by checking whether a=2a, where the doubling is performed as described directly above. Because the characteristic, p, is odd, the quantity 2a can never be zero unless a=0. In principle, it would be desirable to test directly whether a=0 using a single word-operation. However, because the element 0 in the ground field GF(p) has two representations (0 and p), it is possible for the binary data a to represent 0, even if all bits of the binary data a are not identically equal to zero. Thus, the doubling operation provides a convenient approach for testing whether a quantity is equal to zero. This approach can be applied for both the single-guard-bit representation and multiple-guard-bit representation.

Another computation that can be carried out is determining the additive inverse of a field element of $GF(p^k)$, i.e., given a, it is desired to determine "−a" such that a+(−a)=0. Given first binary data, a, stored according to either the single-guard-bit representation or the multiple-guard-bit representation representing a field element of $GF(p^k)$, it is possible to determine second binary data, c, representing the additive inverse field element as follows. Let z be binary data representing the quantity (p, p, . . . , p) in $GF(p^k)$. That is, z comprises k groups of data bits with guard bits therebetween in the appropriate locations, wherein each group of data bits holds the binary equivalent of p (e.g., z may be pre-computed and treated as a constant). Then, c=−a can be determined by executing the single word operation $$c=z-a, \quad (30)$$

where "−" is the normal subtraction operator on words. From this it follows that general equality testing, i.e. determining whether a=b, can be done by checking whether a+(−b)=0, i.e. first using the above technique for additive inverse, then the aforementioned method for testing if an element is zero.

Another computation that can be carried out is the multiplicative inverse. In a multiplicative group of size s, it is true that $x^s=1$ for every x. In other words, for any x in the field, $x^{-1}=x^{s-1}$. For the finite field $GF(p^k)$, the multiplicative group has size $s=p^k-1$. Therefore, the multiplicative inverse of a field element can be carried out by table look-ups in accordance with the relation $$a^{-1}=\text{ANTILOG}\{((p^k-2)\cdot(\text{DLOG}\{a\})\text{mod}(p^k-1)\} \quad (31)$$

where first binary data, a, represents a field element of $GF(p^k)$ and is stored according to the single-guard-bit representation or the multiple-guard-bit representation. Second binary data $a^{-1}$ represents the multiplicative inverse field element. The above-operations in equation 35 can be carried out directly using the single-guard-bit representation using table look-ups in a manner similar to that described above with regard to the discussion of GF_p_k_MUL for the single-guard-bit representation. For the multiple-guard-bit representation, the operations in equation 35 can also be carried out directly where the DLOG look-up table is configured with multiple guard bits in the memory addresses and where the binary data stored in the ANTILOG table is configured with multiple guard bits positioned between groups of data bits representing field coefficients. Alternatively, the operations in equation 35 can be carried out for the multiple-guard-bit representation using "compressed" DLOG and ANTILOG look-up tables in conjunction with compression and decompression operations as previously described. That is, the first binary data a can be compressed using the COMP function described above prior to executing a DLOG table look-up, and a decompression operation can be carried out using the DECOMP function on resulting binary data after the ANTILOG table look-up has been carried out.

Another computation that can be carried out is exponentiation. Generalizing the multiplicative inverse discussion above, exponentiation of a field element to the n-th power can be computed by table look-ups in accordance with the relation $$a^n=\text{ANTILOG}\{(n\cdot(\text{DLOG}\{a\}))\text{mod}(p^k-1)\}. \quad (32)$$

where a is first binary data representing a field coefficient according to either the single-guard-bit representation or multiple-guard-bit representation. In a manner like that described above, equation 36 can be implemented directly or, alternatively, it can be implemented using compression and decompression functions, if desired, prior to the DLOG table look-up and following the ANTILOG table look-up, respectively.

Assessment of Efficiency Enhancements

An assessment of efficiency enhancements obtained using the inventive approaches described above in comparison to conventional approaches are now discussed for a typical cryptographic application. From cryptographic security point of view, it is currently recommended to implement encryption using elliptic curves (see *Handbook of Applied Cryptography*, referenced above) over finite fields of size approximately $2^{160}$ to provide sufficient complexity for the encryption schemes to be considered secure. Thus, in the case of p=3 according to the present invention, it would be necessary to use an extension of GF(3) of degree greater than 101 (i.e., $3^{101}\approx 2^{160}$). In the case of p=7 according to the present invention, the extension degree would need to be at least 57. That is, the necessary complexity could be achieved by carrying out computations in $GF(3^{102})$ or in $GF(7^{60})$, for example.

Rather than carry out computations in $GF(3^{102})$ or in $GF(7^{60})$ directly, the present invention provides for achieving the necessary complexity by carrying out the computations in an appropriate extension field $GF(p^{lk})$. For example, for p=3, the necessary complexity can be obtained by carrying out computations in the extension field $GF(3^{lk})$ where l=17 and k=6 (because 102=6·17). Similarly, for p=7, the necessary complexity can be obtained by carrying out computations in the extension field $GF(7^{lk})$ where l=12 and k=5 (because and 60=5·12). As described above, such computations will require carrying out arithmetic operations in a base field $GF(p^k)$, which can be $GF(3^6)$ or $GF(7^5)$, respectively, in the immediate examples. In addition, it should be noted that computations in $GF(3^6)$ can be implemented using the single-guard-bit representation with a conventional 32-bit architecture. Moreover, computations in $GF(7^5)$ can be implemented using either the single-guard-bit representation or the multiple-guard-bit representation with a conventional 32-bit architecture. As described previously, the algorithms SUM(α, β) and PRODUCT(α, β) can be used to relate computations in the extension field $GF(p^{lk})$ with computations in the field $GF(p^k)$. Various types of computations in $GF(p^k)$ have been described above in detail, including various implementations of GF_p_k_ADD and GF_p_k_MUL.

The table below presents a summary of computational efficiency for the single-guard-bit representation and multiple-guard-bit representation according to the present invention as compared to the conventional approach for computations involving the specific finite fields of $GF(3^{lk})$ where l=17 and k=6 and $GF(7^{lk})$ where l=12 and k=5. In particular, the table below shows the approximate combined size (in bytes) of the DLOG and ANTILOG look-up tables and the number of operations needed to perform additions and multiplications in the respective fields. The number of operations required to perform multiplication using the multiple-guard-bit representation includes utilization of the compression and decompression operations described above.

| | | | Single-guard-bit Representation | | | Multiple-guard-bit Representation | | | Conventional Approach | | |
|---|---|---|---|---|---|---|---|---|---|---|---|
| Field | k | l | Table size | ops. for add. | ops. for mult. | Table size | ops. for add. | ops. for mult. | Table size | ops. for add. | ops. for mult. |
| $GF(3^{lk})$ | 6 | 17 | $2^{19}$ | 85 | 578 | $2^{13}$ | 85 | 2890 | — | 102 | 10400 |
| $GF(7^{lk})$ | 5 | 12 | $2^{21}$ | 60 | 288 | $2^{16}$ | 60 | 1440 | — | 60 | 3600 |

As is evident from the table above, a large gain in efficiency over the conventional approach is achieved for multiplication using the inventive approaches described above. With regard to the indicated number of operations required for addition, it must be noted that the type of operations utilized in the single-guard-bit representation and multiple-guard-bit representation according to the present invention are mainly highly efficient, simple bit operations, whereas the type of operations associated with the conventional approach are much slower modular addition operations. Thus, it is evident that a significant gain in efficiency is also achieved for addition using the inventive approaches described above as compared to the conventional approach for carrying out addition in $GF(p^k)$. Thus, the gains achieved using the present invention are, accordingly, even more significant than the table above may, at first glance, suggest. This same observation is also true for multiplication of field elements according to the present invention.

Considerations that are relevant in determining whether a single-guard-bit representation or a multiple-guard-bit representation will now be described. If memory consumption is not an issue, then the single-guard-bit representation is preferable due to its better computational performance. Depending on the application at hand, if addition operations are the predominant operations, then a single guard representation should be used because it enables making k as large as possible, and k additions can therefore be performed in parallel at a given time. Moreover, because the sizes of the DLOG and ANTILOG look-up tables scale with $2^k$, if the additions are predominantly used rather than multiplications, it can be practical to avoid the DLOG and ANTILOG look-up tables entirely and simply use the conventional method for multiplying field elements.

If, on the other hand, multiplications are the predominant operations, the multiple-guard-bit representation is preferred because it minimizes the sizes of the DLOG and ANTILOG look-up tables. In view of the above discussion, it can be seen that the single-guard-bit representation and multiple-guard-bit representation represent, in a sense, opposite ends of a scale that involves considering trade-offs between compactness of the DLOG and ANTILOG look-up tables, ease of table look-ups, and the degree of parallelization (i.e., the number of field-element coefficients that can be represented in a single machine register). If w is the (fixed) word size of the hardware architecture (i.e., w is the register size), and m is the number of bits in the ground field GF(p), for $p=2^m-1$, some attributes of the single-guard-bit representation can be summarized as follows. Binary data representing $k=w/(m+1)$ coefficients of $GF(p^k)$ (the coefficients being elements of GF(p)) can be fit into one word, that is, into a single hardware register. This packing of binary data is optimal, for surely $k<w/m$ is satisfied. No compression is needed before a DLOG table look-up, and no decompression is need following an ANTILOG table look-up (which is clearly optimal). The look-up tables for the single-guard-bit representation are about $2^k$ times as large as the look-up tables for the multiple guard bit representation. That is, the look-up tables for the single-guard-bit representation are bigger than the absolute minimum size required to store all elements of the field.

Some attributes of the multiple-guard-bit representation can be summarized as follows. Binary data representing $k=w/(2m)$ coefficients of $GF(p^k)$ (which are elements of GF(p)) can be fit into one word, that is, into a single hardware register. A small amount of computation can, and should, be devoted to compression and decompression operations associated with table look-ups, if desired, to save memory space required for DLOG and ANTILOG look-up tables. By utilizing the compression and decompression operations, the DLOG and ANTILOG tables are essentially optimal in size.

Extensions to p of the Form $p=2^m+1$ and $p=2^m\pm d$

In the discussion above, computations in finite fields of odd prime characteristic were described for p of the form $p=2^m-1$. Extensions of the above-described approaches will be described below for computations in finite fields of odd prime characteristic where p is of the form $p=2^m+1$ and $p=2^m\pm d$, where d is small. In principle, any values of d where $d<2^m$ can be used, but as will be seen, a smaller d is preferable. In particular, as discussed below, special optimizations are available when $p=2^m-d$, with $d\leqq(2^m+1)/3$, and $p=2^m+d$, with $d\leqq p/6$, which turn out to be essentially as efficient as the case d=1. Only small increases in memory requirements and computational overhead are needed for these extensions compared to the case where $p=2^m-1$. Whereas the above-described treatment for $p=2^m-1$ allowed p=3, 7, 31, etc., the extensions to $p=2^m+1$ and $p=2^m\pm d$ allow utilization of the primes p=5, 11, 13, 17, etc. In principle, all primes are allowed, though as mentioned the invention is most beneficial where d is small as noted above. Also, the word size and memory of the hardware set some practical limits on how large a value of p may be utilized. As noted previously, where it is possible to write an odd characteristic prime p in terms of more than one functional form, it is generally preferable to utilize an approach for $p=2^m-1$ over approaches for the other two functional forms. In addition, it is preferable to use an approach for $p=2^m+1$ over an approach for $p=2^m\pm d$ where d>1.

The following observation is relevant in understanding the extension to p of the form $p=2^m+1$ as well as for $p=2^m\pm d$. As suggested above using somewhat different notation (see e.g., equation 15) a reduction of some value e modulo p, when $p=2^m-1$, can be carried out in accordance with the following relation $$e \bmod p=(e \bmod 2^m)+(e \operatorname{div} 2^m)=(e\&(2^m-1))+(e>>m). \quad (33)$$

As noted, this subtracts an integer multiple of p from e. Thus, the result is mathematically correct, and the only issue is "practical", i.e. that the result may not always belong to the set {0, 1, . . . , p−1}, which is the conventional representation of integers modulo p. This was solved by the following observation. The representation of integers modulo p can be extended to the larger set Sp={0, 1, . . . , p} such that zero has two representations, 0 and p. Then, if f and g are elements of $Sp^-$, Equation 33 correctly computes (f+g) mod (p) in the dual representation where e is the binary sum of f and g. These observations will now be generalized. Let $p=2^m+d$ (where d may be negative, but $|d|<2^m$). Then, for any integer e, the following relations hold $$e \bmod (p) = (e \bmod 2^m) - d(e \operatorname{div} 2^m) \quad (34)$$

$$= (e - 2^m(e \operatorname{div} 2^m)) - d(e \operatorname{div} 2^m)$$

$$= e - (2^M + d)(e \operatorname{div} 2^m) = e - pr \quad (35)$$

for an integer r. That is, the result is equal to e mod(p), up to an integer multiple of p. Hence, what is performed in equations 34 and 35 is a subtraction by a multiple of p. To get a complete reduction mod p such that the quantity c−pk is indeed in the set {0, 1, . . . , p−1}, the relations in Equations 34 and 35 should use k=e div p=e div $(2^m+d)$. However, the present invention utilizes an approximation where k=e div $2^m$ such that e−pk is not guaranteed to be in the set {0, 1, . . . , p−1}. For the case d=−1 (corresponding to $p=2^m-1$), for example, utilizing the slightly larger set $Sp^-$ above allows the modular reduction operation in combination with addition to be closed with respect to the set $Sp^-$ in the determination of e=f+g.

Generalizations of the algorithms GF_p_k_ADD and GF_p_k_MUL for the cases $p=2^m+1$ and $p=2^m\pm d$ for odd $|d|>1$ will be described below in conjunction with determining suitable representation sets Sp corresponding to allowed values of coefficients of field elements of $GF(p^k)$. As will be seen, the Sp sets depend on the functional form of p and on m and d, where $p=2^m\pm d$. In analogy to the above, these sets will be denoted by $Sp^+$ for the case $p=2^m+1$, $Sp^{+d}$ for $p=2^m+d$, and $Sp^{-d}$ for $p=2^m-d$. As noted above, the coefficients of field elements of $GF(p^k)$ themselves are elements of GF(p). It should be noted that as long as a modular reduction of a quantity c subtracts a multiple of p from c, there is mathematically no problem with allowing more general sets Sp if they are closed under addition followed by the modular reduction.

Addition and Multiplication in $GF(p^5)$ where $p=2^m+1$

In the following descriptions of GF_p_k_ADD and GF_p_k_MUL for the case where $p=2^m+1$, it is assumed that $m\geqq 2$ such that $p\geqq 5$. This is because the case where p=3 is preferably addressed using the previously described approaches for addition and multiplication where $p=2^m-1$ (i.e., $p=2^2-1$). Let the set $Sp^+$ be given by $Sp^+=\{0, 1, \ldots, 2p-2\}$. (Thus, for $p=2^m+1$ the present invention allows the values 0, 1, . . . , p−2, to have two representations, whereas in the case $p=2^m-1$, only the value 0 had more than one representation.) Each coefficient of a field element of $GF(p^k)$ is then an element of $Sp^+$. Note that $2p-2=2^{m+1}$, so that m+2 bits (not including guard bits) are used to represent a coefficient of a field element of $GF(p^k)$, which is one more bit than was needed to represent coefficients in the set $Sp^-=\{0, \ldots, p\}$ utilized in the approaches for $p=2^m-1$.

For the case $p=2^m+1$, binary data representing field elements of $GF(p^k)$ can be stored in hardware registers according to either the single-guard-bit representation or the multiple-guard-bit representation, such as described previously, except that for $p=2^m+1$, m+2 bits (not including guard bits) are allocated for each group of data bits representing a coefficient of a field element. For example, in the single-guard-bit representation, first binary data representing a first field element $\alpha_i$ of $GF(p^k)$, wherein the first binary data comprises k groups of first data bits, can be stored as follows. Here it is assumed that (m+3)k is at most the hardware word size (i.e., register size). Let $\alpha_i$ be a first field element of $GF(p^k)$ where $\alpha_i=((\alpha_{k-1,i}, \ldots, \alpha_{0,i})$ and where each $\alpha_{j,i}$ belongs to the set $Sp^+$. A group of first data bits representing $\alpha_{0,i}$ is stored in a first register in bit positions 0, 1, . . . , m+1. A first guard bit having a value of zero is stored in the first register in bit position m+2 (a guard-bit position). Another group of first data bits representing $\alpha_{1,i}$ is stored in the first register in bit positions m+3, . . . , 2m+4, and so on. Accordingly, there is one first guard bit in every bit position v(m+3)−1 where v=1, 2, . . . —that is, every successive (m+3)-rd bit position. In other words, there is one first guard bit positioned adjacent to the most significant bit of each group of first data bits. Second binary data comprising k groups of second data bits representing a second field element of $GF(p^k)$ can similarly be stored in a second register with one second guard bit adjacent to the most significant bit of each group of second data bits. (Here, the use of "first" and "second" merely distinguish between attributes corresponding to the first field element and the second field element, respectively.) By storing binary data representing first and second field elements of $GF(p^k)$ in first and second hardware registers in this manner, no carry bit will propagate from one group of data bits representing a field coefficient into an adjacent group of data bits representing another field coefficient. The approach for storing binary data representing field elements according to the multiple-guard-bit representation is completely analogous, the only difference being that more than one guard-bit position is provided between adjacent groups of data bits representing field coefficients.

An exemplary form of GF_p_k_ADD where $p=2^m+1$ will now be described with reference to the flow diagram of FIG. 14. The operations shown in FIG. 14 can be executed by a system such as system 100 shown in FIG. 1. Further, it is assumed that steps 301 and 303 shown in FIG. 3 have already been executed by the processor 105 such that first binary data representing a first field element of $GF(p^k)$ are stored in a first register (e.g., register 107 shown in FIG. 1) and such that second binary data representing a second field element are stored in a second register (e.g., register 109) in a manner such as described directly above. The first and second binary data can be stored according to either the single-guard-bit representation or the multiple-guard-bit representation—the approach is the same in either case. The steps illustrated in FIG. 14 then represent an exemplary implementation of step 305 shown in FIG. 3.

As indicated at step 1401, the processing unit 105 adds the contents, a, of the first register 107, and the contents, b, of the second register 109 using addition (that is, addition with a carry into the next most significant bit if necessary). The result of the addition can be stored in another register 111 such as illustrated in FIG. 1. As indicated at step 1403, the processing unit 105 then executes a logical AND operation between the quantity (a+b) stored in register 111 and a first predetermined binary quantity M1 stored in one of the registers (e.g., register 113). The quantity M1 has values of zero at bit positions corresponding to bit positions of first guard bits stored in the first register 107 and has binary values representing the quantity $2^m-1$ at bit positions corresponding to bit positions of each group of first data bits stored in the first register. For example, where p=5 (i.e., m=2 where $p=2^m+1$), the first predetermined binary quantity M1 comprises successive binary strings (0, 0, 1, 1) separated by bit values of zero (corresponding to guard-bit positions), because $2^m-1=3$, which is given by (0, 0, 1, 1) in binary. The above definition for the quantity M1 is applicable to the multiple-guard-bit representation as well as to the single-guard-bit representation for the case where $p=2^m+1$. The result of the operations indicated at step 1403 can be referred to as first intermediate data c1 and is stored in one of registers (e.g., register 115).

As indicated at step 1405, the processing unit 105 executes a logical AND operation between the quantity (a+b) stored in register 111 and a second predetermined binary quantity M2 where M2 is given by M2=NOT(M1). The NOT operation is bitwise logical negation. The result of this operation is stored in one of registers (e.g., register 117). Also indicated at step 1405, the processing unit 105 then executes a right shift by m bits on the quantity ((a+b)&M2). The result of this operation can be stored in the same register 117 or in a different register. At step 1407, the processing unit 105 subtracts the quantity {((a+b)&M2)>>m} from a third predetermined binary quantity P1. The quantity P1 has values of zero at bit positions corresponding to bit positions of the first guard bits stored in the first register and has binary values representing the quantity $2^m+1$ (=p) at bit positions corresponding to bit positions of each group of first data bits in the first register. For example, where p=5 (i.e., m=2) the third predetermined binary quantity P1 comprises successive binary strings (0, 1, 0, 1) separated by bit values of zero (corresponding to guard-bit positions), because $2^m+1=5$ which is given by (0, 1, 0, 1) in binary. The result of the operations indicated at step 1409 can be referred to as second intermediate binary data c2 and is stored in one of the registers (e.g., register 119). At step 1409 the processor executes addition between the first intermediate binary data c1 and the second intermediate binary data c2 to generate the third binary data, represented by c, which can be stored in one of the registers (e.g., register 121). According to this approach, the third binary data c represents the sum of the first field element and the second field element.

Figure 14:
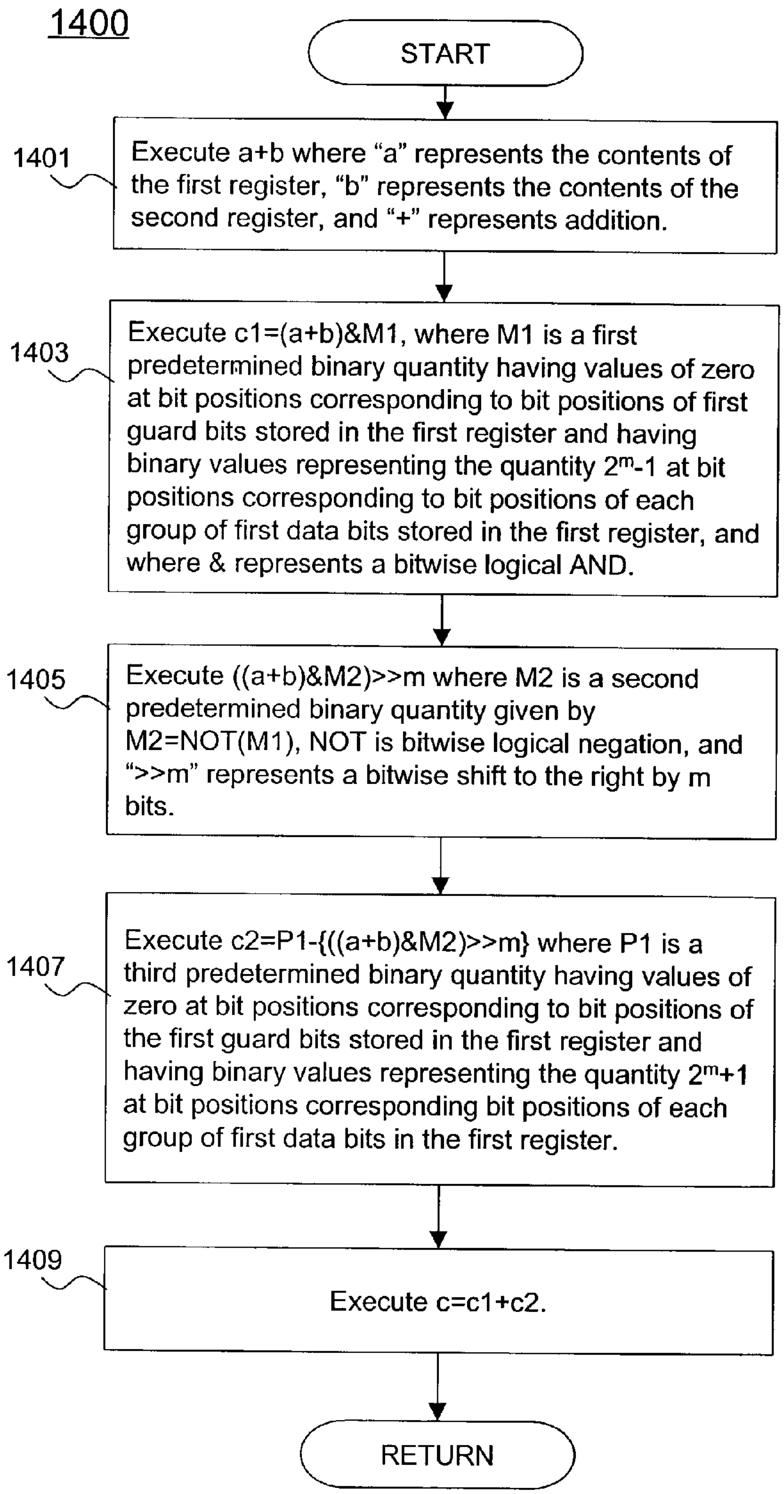
FIG. 14 is a flow diagram illustrating a method of processing binary data in order to determine the sum of two field elements where $p=2^m+1$ in accordance with the method illustrated in FIG. 3 according to an exemplary aspect of the present invention.

The algorithms according to FIGS. 3 and 14 have been described in terms of a specified sequence of steps to facilitate the description. However, it is not necessary to carry the steps indicated in FIGS. 3 and 14 in the exact order illustrated. Those of ordinary skill in the art will recognize that the order of steps can be varied and that some of the steps can be carried out simultaneously. For example, steps 301 and 303 shown in FIG. 3 can be carried out simultaneously, and steps 1403 and 1405 shown in FIG. 4 can be carried out simultaneously. Regardless of the sequence in which various operations are executed, it is merely necessary to determine the quantity c (third binary data) in accordance with the relation $$c=((a+b)\&M1)+(P1-\{((a+b)\&M2)>>m)\}) \quad (36)$$

where a is first binary data representing the first field element, b is second binary data representing the second field element, + represents addition, and M1, M2 and P1 are as defined above. In this regard, those of ordinary skill in the art will recognize that each group of data bits $c_j$ of the resulting quantity c represents a value that is an element of the set $Sp^+$, and each such $c_j$ is given by $c_j=(a_j+b_j)$ mod(p) (up to a single multiple of p), where the j subscript for the quantities a and b designate corresponding groups of data bits that represent an associated coefficient of the respective field element.

Thus, it is evident that addition of field elements in $GF(p^k)$ where $p=2^m+1$ can be carried out using six simple instructions (compared to five simple instructions for $p=2^m-1$). Utilizing the second term (P1−{(c'&M2)>>m)}) as an additive quantity in equation 36 is, in principle, the same as subtracting the quantity ((a+b)div $2^m$) modulo p, thus making equation 36 consistent with equation 33. However, implementing subtraction of a quantity q as an addition of the quantity p−q has advantages. In particular, if subtraction is implemented in a conventional way, i.e. by subtracting ((a+b)div $2^m$) rather than by adding (P1−{((a+b)&M2)>>m) }), there is a possibility of encountering negative "borrows" even if no additive carries are encountered. In contrast, by utilizing the additive quantity (P1−{((a+b)&M2)>>m)}), such negative borrows can be avoided.

To prove that the approach given in equation 36 will produce correct addition results, observe that if $a_j$ and $b_j \in Sp^+$, then any $c_j$ of the quantity c in equation 36 will satisfy $0 \leqq c_j < 2^m-1+p=2p-2$ (because $0 \leqq (a_j+b_j)$div $2^m \leqq 4<p$). Thus, each $c_j$ of the quantity c in equation 36 is an element of Sp as claimed. As noted above, the reduction in equation 36 subtracts (($c_j$ div $2^m$)−1)p from $c_j$, which is a multiple of p. Thus, each $c_j$ will indeed be in the set $Sp^+$, and as such, equal to the remainder of $(a_j+b_j)$ mod p, up to a (single) multiple of p.

As noted above, the treatment of addition (GF_p_k_ADD) of two field elements of $GF(p^k)$ for $p=2^m+1$ in the multiple-guard-bit representation according to the present invention is substantially the same as that for the single-guard-bit representation. It is merely necessary to note that the first and second binary data representing the first and second field elements, respectively, are stored with multiple guard bits placed between adjacent groups of data bits representing coefficients of the respective field elements. Moreover, the prescriptions given above for determining the quantities M1, M2 and P1 require no modification for the multiple-guard-bit representation. Of course, applying those prescriptions to the multiple-guard-bit representation will generate different values of the quantities M1, M2 and P1 than will be generated for the single-guard-bit representation.

EXAMPLE 2

Figure 15:
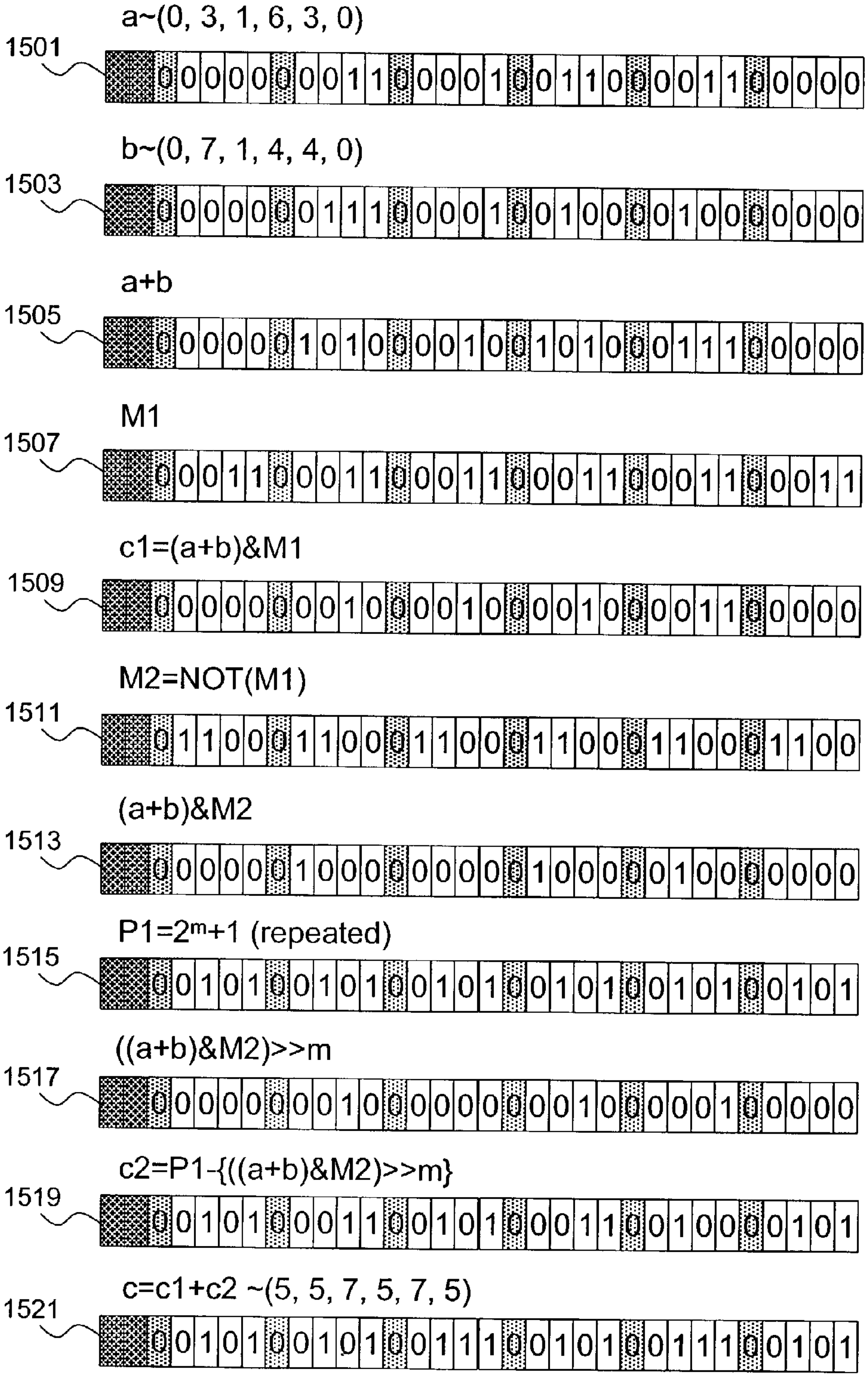
FIG. 15 is a schematic illustration of register contents for an example of addition in $GF(5^6)$ in accordance with the method illustrated in FIG. 14.

A numerical example illustrating the approach shown in FIG. 14 for $p=2^m+1$ will now be described with reference to FIG. 15. FIG. 15 schematically illustrates a collection of registers 1501–1521 with exemplary register contents stored therein according to the single-guard-bit representation. Each register 1501–1521 comprises 32 bit locations in this example according to a 32-bit architecture. In this particular example, computations are carried out using binary data representing field elements of $GF(5^6)$, where $p=2^m+1=5$, and m=2. Accordingly, m+2=4 bits are allocated for each coefficient of the field element (not including guard bits), and adjacent 4-bit groups are separated by a single guard-bit position (lightly shaded regions). In addition, in this example there are two unused bit positions (darkly shaded regions) at the most significant bit positions of each register. The computations described below can be carried out, for example, using a processing system, such as processing system 100 illustrated in FIG. 1.

In this example, each coefficient a given field element is itself an element of the field GF(5). Values of the coefficients in GF(5) correspond to binary data according to the following associations: 0~(0, 0, 0, 0); 1~(0, 0, 0, 1); 2~(0, 0, 1, 0); 3~(0, 0, 1, 1); 4~(0, 1, 0, 0). In addition, there is a dual representation with the following additional associations wherein two different numbers in GF(p) represent a same value: 5~(0, 1, 0, 1), which also corresponds to 0; 6~(0, 1, 1, 0), which also corresponds to 1; 7~(0, 1, 1, 1), which also corresponds to 2; and 8~(1, 0, 0, 0), which also corresponds to 3.

To begin, first binary data, a, representing a first field element given in vector notation as (0, 3, 1, 6, 3, 0) is stored in a first register 1501. In addition, second binary data, b, representing a second field element given in vector notation as (0, 7, 1, 4, 4, 0) is stored in a second register 1503. Each guard-bit position in registers 1501 and 1503 is initially assigned a value of zero. The contents of registers 1501 and 1503 are added via addition and the result (a+b) is stored in register 1505 (corresponding to step 1401 in FIG. 14). The contents of register 1505 (a+b) are then combined with the first binary quantity M1 stored in register 1507 via a logical AND operation, and the result ((a+b)&M1) is stored in register 1509 (corresponding to step 1403 of FIG. 14). In this example, the first predetermined binary quantity M1 comprises successive binary strings (0, 0, 1, 1) separated by bit values of zero (corresponding to guard-bit positions), because $2^m-1=3$, which is given by (0, 0, 1, 1) in binary.

The second predetermined binary quantity M2=NOT (M1) is then formed and stored in register 1511, and the contents of register 1511 (M2) are then combined with the contents of register 1505 (a+b) via a logical AND operation, the result (c=((a+b)&M2)) being stored in register 1513 (corresponding to step 1405 in FIG. 14). The third predetermined binary quantity P1 is stored in register 1515 wherein P1 represents the repeated binary equivalent of the quantity $2^m+1$ placed in adjacent 4-bit groups, each of which is separated by a bit value of zero (corresponding to guard-bit positions). In this example, the third predetermined binary quantity P1 comprises successive binary strings (0, 1, 0, 1) separated by bit values of zero (corresponding to guard-bit positions), because $2^m+1=5$, which is given by (0, 1, 0, 1) in binary. The contents of register 1513 ((a+b)&M2) are right shifted by m bits (e.g., 2 bits), and the result (((a+b)&M2)>>2) is stored in register 1517 (corresponding to step 1405 in FIG. 14). The contents of register 1517 (((a+b)&M2)>>2) are subtracted from the contents of register 1515 (P1) and the result (c2=P1−(((a+b)&M2)>>2)) is stored in register 1519 (corresponding to step 1407 of FIG. 14). Finally, the contents of register 1509 (c1) are added to the contents of register 1519 (c2) using addition, and the resulting third binary data (c=c1+c2) is stored in register 1521. The resulting third binary data stored in register 1521 correspond to a field element given in vector notation as (5, 5, 7, 5, 7, 5), which is the expected result. If desired, this result can be reduced modulo 5 (which is mod(p) in this example) prior to an output operation, for example, providing the result (0, 0, 2, 0, 2, 0). This completes the discussion of Example 2.

Figure 16:
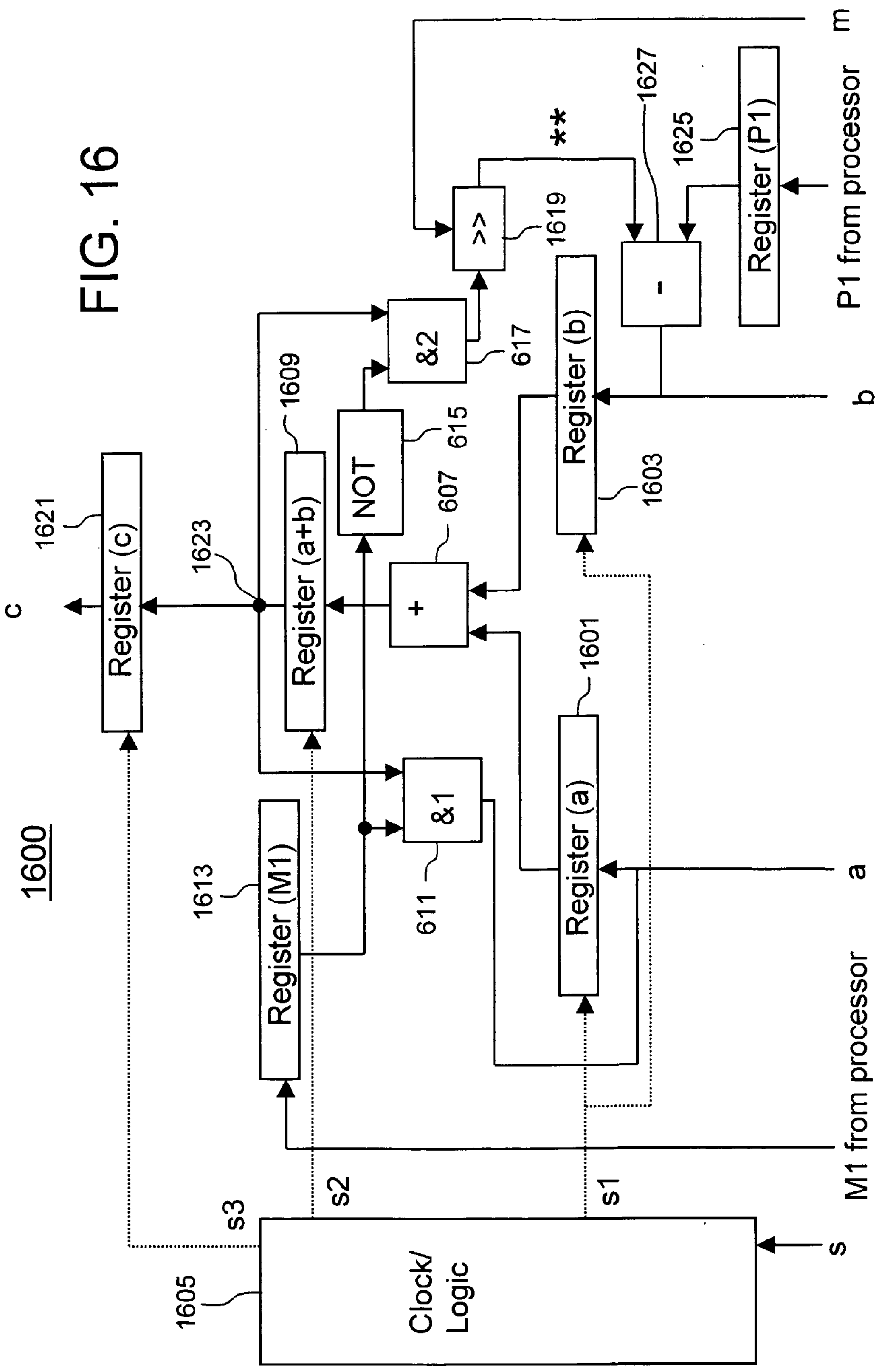
FIG. 16 is a functional block diagram of a hardware apparatus for carrying out computations involving field elements of an odd-characteristic finite field where $p=2^m+1$ according to an exemplary aspect of the present invention.

In another aspect of the invention relating to computations involving field elements of an odd-characteristic finite field where $p=2^m+1$, a hardware apparatus can be provided for carrying out operations for the exemplary form of GF_p_k_ADD illustrated in FIG. 14. FIG. 16 is a functional block diagram of such an exemplary hardware apparatus. In particular, the apparatus 1600 illustrated in FIG. 16 provides another approach for generating third binary data, denoted as c in FIGS. 14 and 16, that can represent the sum of a first field element and a second field element of $GF(p^k)$. The apparatus 1600 is applicable to both the single-guard-bit representation and the multiple-guard-bit representation.

The hardware apparatus 1600 illustrated in the functional block diagram of FIG. 16 shares various common features and operational aspects with the apparatus 600 illustrated in FIG. 6, and like features are given like reference numerals in FIGS. 6 and 16. Discussion of aspects of the apparatus 1600 that are common to the apparatus 600 will not be duplicated here. Rather, aspects in which the apparatus 1600 differs from the apparatus 600 will be discussed.

The apparatus 1600 possesses several features not found in the apparatus 600. In particular, the apparatus 1600 possesses an additional register 1625 for holding the third predetermined binary quantity P1 and a subtraction gate 1627 for subtracting the output from the right-shift gate 1619 from the contents (P1) of the register 1625. The output from the subtraction gate 1627 is fed back into the register 1603 as indicated. In contrast, as illustrated in FIG. 6, the apparatus 600 has no register analogous to register 1625 and no subtraction gate analogous to subtraction gate 1627. Rather, for the apparatus 600 illustrated in FIG. 6, the output from the right-shift gate 619 is fed directly into register 603 illustrated therein. By providing the register 1625 and the subtraction gate 1627 in the manner illustrated in FIG. 16B, the apparatus 1600 is enabled to manipulate data in a manner corresponding to step 1407 illustrated in FIG. 14. In other respects, the apparatus 1600 operates like the apparatus 600 illustrated in FIG. 6, and no additional discussion of the like aspects in FIG. 1600 is required.

In the apparatus 1600 as described above, the first register 1601 and a processor (not shown) can be viewed as means for storing first binary data such as described with regard to FIG. 6. The second register 1603 and a processor (not shown) can be viewed as means for storing second binary data. Further, the register 1621 and/or the register 1609 can be viewed as means for storing third binary data. Moreover, the clock/logic device 1605 and any or all of the remaining devices illustrated in FIG. 16 can be viewed as means for executing at least one operation on the first binary data and the second binary data.

Figure 17:
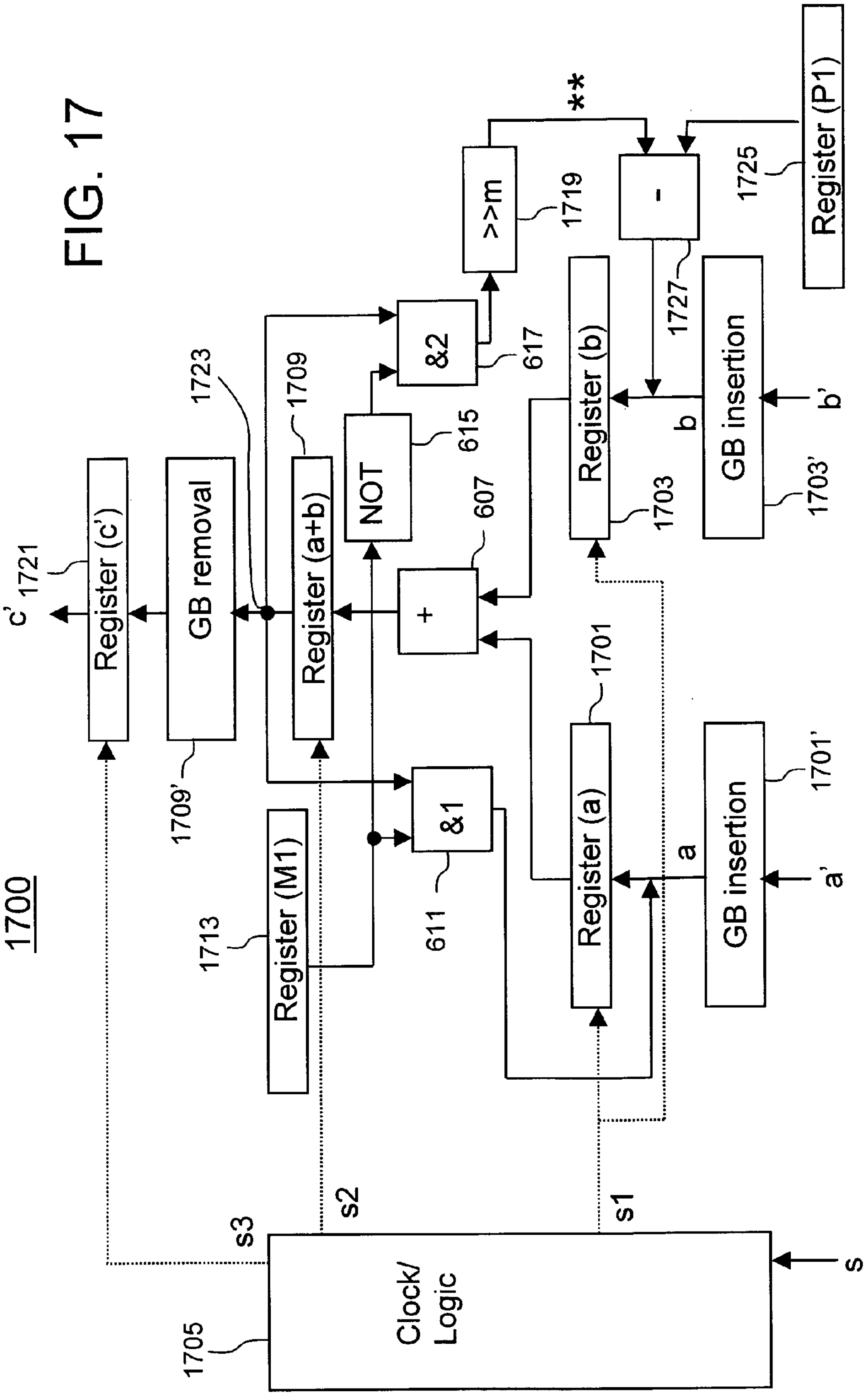
FIG. 17 is another functional block diagram of a hardware apparatus for carrying out computations involving field elements of an odd-characteristic finite field where $p=2^m+1$ according to another exemplary aspect of the present invention.

In another exemplary aspect of the invention, the addition apparatus 1600 used for $p=2^m+1$ can be modified, such as shown for the hardware apparatus 1700 illustrated in the block diagram of FIG. 17, for a situation in which a dedicated choice of the finite field $GF(p^k)$ is made and remains unchanged. That is, the quantities m, p, and k, as well as the choice of whether the representation is a single-guard-bit representation or a multiple-guard-bit representation, are fixed, and the hardware apparatus 1700 is dedicated to those choices. In this situation, the hardware apparatus 1700 can receive initial binary data representing field elements wherein the initial binary data are not configured with zeros in guard-bit positions. Rather, the hardware apparatus 1700 itself configures the initial binary data with zeros in appropriate guard-bit positions to generate first and second binary data without the need for a processor to configure the first and second binary data with zeros in guard-bit positions. The hardware apparatus 1700 illustrated in FIG. 17 will now be described.

The hardware apparatus 1700 illustrated in the functional block diagram of FIG. 17 shares various common features and operational aspects with the apparatus 1600 illustrated in FIG. 16, and like features are given like reference numerals in FIGS. 16 and 17. Discussion of aspects of the apparatus 1700 that are common to the apparatus 1600 will not be duplicated here. Rather, aspects in which the apparatus 1700 differs from the apparatus 1600 will be discussed.

The apparatus 1700 possesses several features not found in the apparatus 1600. In particular, the apparatus 1700 possesses guard-bit-insertion circuits 1701' and 1703' (GB insertion) and a guard-bit-removal circuit 1709' (GB removal). The guard-bit-insertion and guard-bit-removal circuits, 1701', 1703' and 1709' can be implemented, for example, using circuits similar to those shown in the examples of FIGS. 8A and 8B, which have already been described. As shown in FIG. 17, the guard-bit-insertion circuits 1701' and 1703' are functionally arranged at the input to the hardware apparatus 1700, and the guard-bit-removal circuit 1709' is functionally arranged between the register 1709 and the output register 1721. The guard-bit-insertion circuits 1701' and 1703' operate to receive initial binary data a' and b' (without guard bits) corresponding to first and second field elements of $GF(p^k)$ and to insert appropriate guard bits into that data. In other words, the guard-bit-insertion circuits 1701' and 1703' transform the initial binary data a' and b' into first binary data and second binary data having guard bits, in particular, with zeros at guard-bit positions. The guard-bit-removal circuit 1709' has the opposite function—namely, to receive third binary data c representing a computational result and having guard bits and to remove those guard bits, thereby forming final binary data c' representing the computational result, but without guard bits.

The apparatus 1700 also lacks certain features present in the apparatus 1600 because they are not needed in the apparatus 1700. In particular, the apparatus 1700 lacks an input line for the quantity m into the right-shift gate 1719 and into the mask register 1713. Such an input line is not necessary given that m is fixed. Rather, the right-shift gate 1719 is initialized once with the value of m to execute the appropriate right shift. Similarly, the mask register 1713 and the register 1725 are initialized once with the appropriate forms of M1 and P1 depending upon whether the single-guard-bit representation or multiple-guard-bit representation is being used. Conventional electrical connections can be used for carrying out these initializations and are not shown in FIG. 17. In respects other than the operational distinctions noted above, the operation of the apparatus 1700 illustrated in FIG. 17 is substantially similar to that described for the apparatus 1600 illustrated in FIG. 16, and no further discussion is necessary.

In the apparatus 1700 as described above, the first register 1701 and the guard-bit insertion circuit 1701' can be viewed as means for storing first binary data. The second register 1703 and the guard bit insertion circuit 1703' can be viewed as means for storing second binary data. Further, the register 1709 can be viewed as means for storing third binary data. Moreover, the clock/logic device 1705 and any or all of the remaining devices illustrated in FIG. 7 can be viewed as means for executing at least one operation on the first binary data and the second binary data.

Multiplication of field elements in GF($p^k$) where $p=2^m+1$ can be carried out using the exemplary forms of GF_p_k_MUL previously described with reference to FIGS. 9–12 for $p=2^m-1$ for both the single-guard-bit representation and multiple-guard-bit representation. It is merely necessary to recognize that m+2 bits (not including guard bits) are allocated to store each group of data bits representing a coefficient of a field element of GF($p^k$) for $p=2^m+1$ as opposed to m bits for the case where $p=2^m-1$. This difference, of course, must also be applied to the form of the DLOG and ANTILOG tables. Where the compression function (COMP) and decompression function (DECOMP) are utilized with the multiple-guard-bit representation, these functions must also take into consideration that m+2 bits, rather than m bits, are allocated to store each group of data bits representing a field coefficient.

Addition and Multiplication in GF($p^k$) where $p=2^m\pm d$

In another aspect of the present invention, the above-described treatments of carrying out computations in GF($p^k$) for $p=2^m-1$ and $p=2^m+1$ can be extended to p of the form $p=2^m\pm d$. Here, it is assumed that is assumed that d>1 and d is odd. Moreover, the choices of m and d are such that the resulting p is an odd prime. Where a given prime can be written as both $p=2^m-d$ and $p=2^m+d$ for different choices of m and d, it is preferable to use the form that allows the smallest value of d. For example, p=11 can be written as both $p=2^3+3$ (m=3, d=3) and as $p=2^4-5$ (m=4, d=5). It is preferable to use the choice $p=2^3+3$ where m=3 and d=3. Approaches for carrying out addition and multiplication in GF($p^k$)—that is, approaches for implementing GF_p_k_ADD and GF_p_k_MUL—for $p=2^m\pm d$ will now be described.

For the case $p=2^m\pm d$, binary data representing field elements of GF($p^k$) can be stored in hardware registers according to either the single-guard-bit representation or the multiple-guard-bit representation, such as described previously, except that for $p=2^m-d$, m+1 bits (not including guard bits) are allocated for each group of data bits representing a coefficient of a field element, and that for $p=2^m+d$, m+2 bits (not including guard bits) are allocated for each group of data bits representing a coefficient of a field element. For example, in the single-guard-bit representation for $p=2^m-d$, first binary data (register contents a) representing a first field element $\alpha_1$ of GF($p^k$), wherein the first binary data comprises k groups of first data bits, can be stored as follows. Here it is assumed that (m+2)k is at most the hardware word size (i.e., register size). Let $\alpha_i$ be a first field element of GF($p^k$) where $\alpha_i=(\alpha_{k-1,i}, \ldots, \alpha_{0,i})$ and where each $\alpha_{J,i}$ belongs to the a Sp (which will be a certain set $Sp^{-d}$ or $Sp^{+d}$, depending on the form of p, as discussed below). A group of first data bits representing $\alpha_{0,i}$ is stored in a first register in bit positions 0, 1, . . . , m. A first guard bit having a value of zero is stored in the first register in bit position m+1 (a guard-bit position). Another group of first data bits representing $\alpha_{1,i}$ is stored in the first register in bit positions m+2, . . . , 2m+2, and so on. Accordingly, there is one first guard bit in every bit position v(m+2)−1 where v=1, 2, . . . —that is, every successive (m+1)-th bit position. In other words, there is one first guard bit positioned adjacent to the most significant bit of each group of first data bits. Second binary data (register contents b) comprising k groups of second data bits representing a second field element of GF($p^k$) can similarly be stored in a second register with one second guard bit adjacent to the most significant bit of each group of second data bits. (The use of "first" and "second" is merely distinguish between attributes corresponding to the first field element and the second field element, respectively.) By storing binary data representing first and second field elements of GF($p^k$) in first and second hardware registers in this manner, no carry bit will propagate from one group of data bits representing a field coefficient into an adjacent group of data bits representing another field coefficient. The approach for storing binary data representing field elements according to the multiple-guard-bit representation is completely analogous, the only difference being that more than one guard-bit position is provided between adjacent groups of data bits representing field coefficients.

Addition in GF($p^k$) (that is, implementing GF_p_k_ADD) for the case where $p=2^m-d$ will now be described with reference to FIGS. 18 and 19. The case where $p=2^m-d$ can be treated by extending the approach used for $p=2^m-1$. It is assumed that d>1 and d is odd. It may be assumed, obviously, that $1<d<2^m-1$, because otherwise p would be strictly smaller than 5 (or even negative). Two exemplary approaches for carrying out addition (two exemplary forms for implementing GF_p_k_ADD) can be used according to two regimes for the value of d: 1) $d\leqq(2^m+1)/3$, and 2) $(2^m+1)/3<d<2^m-1$.

First, an exemplary approach 1800 for implementing GF_p_k_ADD where $d\leqq(2^m+1)/3$ for the case $p=2^m-d$ will be described with reference to FIG. 18. This description is applicable to both the single-guard-bit representation and multiple-guard-bit representation. Let the set $Sp^{-d}$ be given by $\{0, 1, \ldots, 2^m+d-1\}$, and let each coefficient of a field element of GF($p^k$) be an element of the set $Sp^{-d}$. Of course, each integer referred to in the set $Sp^{-d}$ has an equivalent binary string that is used to store a corresponding coefficient of a field element, such as has been described previously. The operations shown in FIG. 18 can be executed by a system such as system 100 shown in FIG. 1. Further, it is assumed that steps 301 and 303 shown in FIG. 3 have already been executed by the processor 105 such that first binary data representing a first field element of GF($p^k$) are stored in a first register (e.g., register 107 shown in FIG. 1) and such that second binary data representing a second field element are stored in a second register (e.g., register 109) in a manner such as described directly above. The first and second binary data can be stored according to either the single-guard-bit representation or the multiple-guard-bit representation—the approach is the same in either case. The steps illustrated in FIG. 18 then represent an exemplary implementation of step 305 shown in FIG. 3.

It will be noted that steps 1801, 1803 and 1807 are the same as steps 401, 403 and 407 shown in FIG. 4 for the case $p=2^m-1$. Moreover, the prescriptions for determining the predetermined binary quantities M1 and M2 for the approach illustrated in FIG. 18 are the same as for FIG. 4. The exact forms of M1 and M2 will depend, of course, upon whether the single-guard-bit representation or multiple-guard-bit representation is used as has been described previously. Also, unlike in the case for $p=2^m-1$ where m bits were used to represent each coefficient, m+1 bits are used to represent each coefficient for $p=2^m-d$. The masks M1 and M2 are thus modified in view of these considerations compared to the case for $p=2^m-1$. However, the definitions (prescriptions) for these quantities in terms of where zero/non-zero bits are located relative to the guard/non-guard bit locations is the same for each functional form of p. Having described these differences, no further description of steps 1801, 1803 and 1807 is necessary.

Step 1805 is analogous to step 405 shown in FIG. 4, except that the quantity c2 in step 1805 is given by c2=d*{((a+b)&M2)>>m} instead of {((a+b)&M2)>>m}. That is, the quantity c2 in step 1805 has a multiplicative factor of "d" that is not present in step 405 shown in FIG. 4. The multiplication * by d is multiplication that is conventionally carried out with known processors (e.g., normal integer multiplication or floating-point multiplication). Binary data representing the quantity d is stored in the right-most bit positions of register with zeros elsewhere. In other words, if d were viewed as a vector quantity with coefficients corresponding to groups of data bits associated with field elements, the vector quantity would be (0, 0, 0, . . . , d). Thus, implementing the approach 1800 illustrated in FIG. 18 provides third binary data, c, that represents the sum of first and second field elements of $GF(p^k)$.

Figure 18:
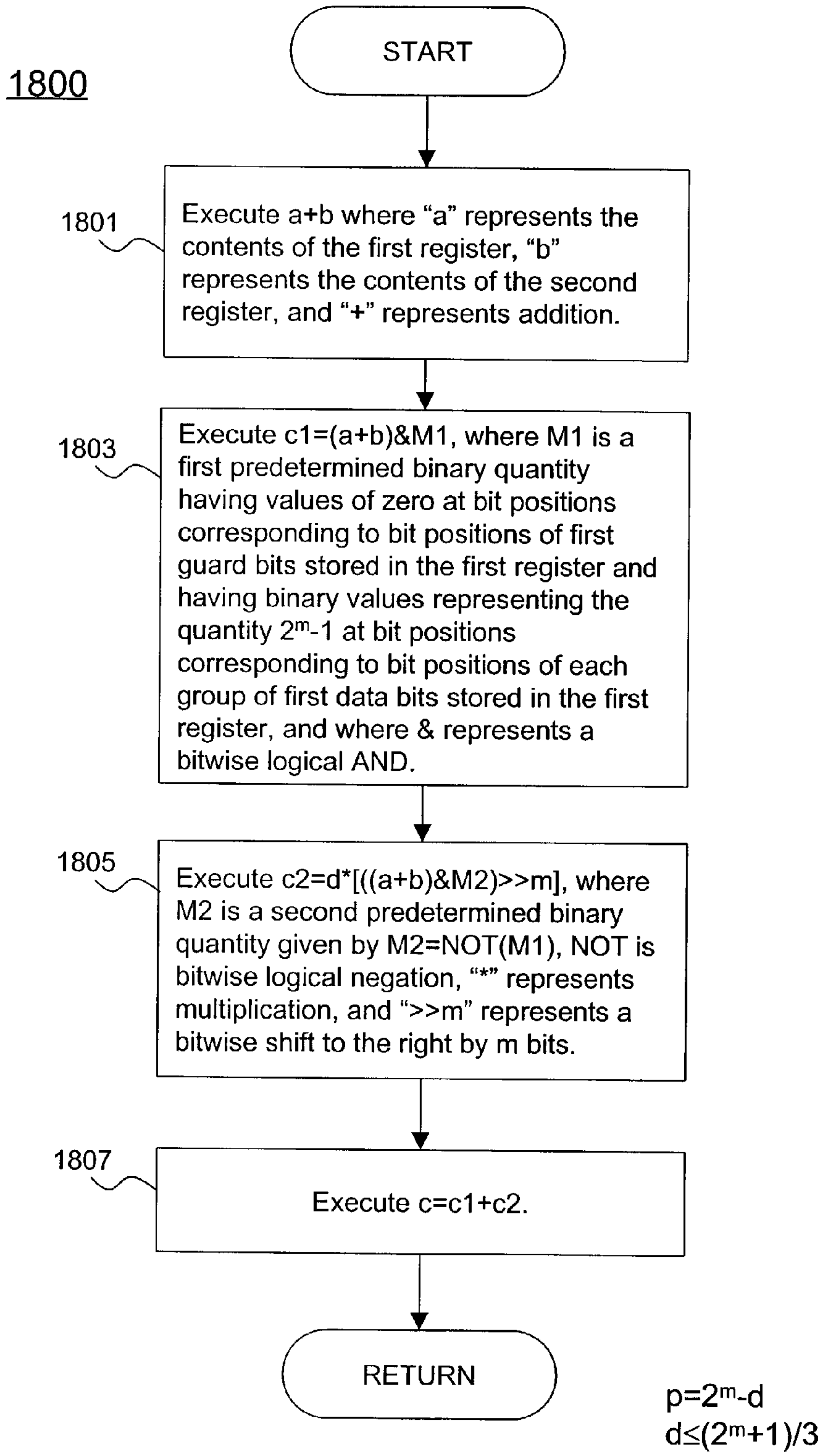
FIG. 18 is a flow diagram illustrating a method of processing binary data in order to determine the sum of two field elements where $p=2^m-d$ and $d\leqq(2^m+1)/3$ in accordance with the method illustrated in FIG. 3 according to an exemplary aspect of the present invention.

Of course, the sequence of carrying out the operations shown in FIG. 18 can vary from the sequence illustrated in FIG. 18, such as has been previously described. Different sequences can be used as long as the quantity c is determined in accordance with the relation.

$$c=((a+b)\&M1)+d*(((a+b)\&M2)>>m) \qquad (37)$$

where a, b, c, M1 and M2 are as described above. Note equation 37 reduces to Equation 13 for the case d=1.

It will now be shown that the set $Sp^{-d}$ is closed under the operations shown in equation 37 (addition followed by modular reduction) where a and b each comprise k groups of data bits $a_j$ and $b_j$, respectively, where j=0, . . . , k−1 and where each $a_j$ and $b_j$ represents a group of data bits corresponding to an element of the set $Sp^{-d}=\{0, 1, \ldots, 2^m+d-1\}$ referred to above. Then, with regard to each individual coefficient of the first and second field elements of $GF(p^k)$, respectively, it can be seen that $a_j+b_j \leqq 2^{m+1}+2d-2$ (this equation is intended to reflect a comparison of the integer values represented by $a_j$ and $b_j$). Note that a function defined by $h(x)=(x \bmod 2^m)+d(x \operatorname{div} 2^m)$ (corresponding to equation 43 above) is a "sawtooth" function which monotonically increases locally on each interval of form $\{t2^m, (t+1)2^m-1\}$. Furthermore, for $y<2^m$ and $z<z'$ where z and z' are positive integers, $h(z2^m+y)<h(z'2^m+y)$. For $0 \leqq (a_j+b_j) \leqq 2^m 2d-2$, then $((a_j+b_j) \operatorname{div} 2^m) \leqq 2$ (this equation is intended to reflect a comparison of the integer values represented by $a_j+b_j$). Thus, to show that $h(a_j+b_j) \leqq 2^m+d-1$, for all $a_j+b_j$ in the above-noted interval, it is enough to show that $h(2^{m+1}-1)$ (the highest "peak" of any "sawtooth") and $h(2^{m+1}+2d-2)$ (for the largest possible input to h) are both bounded from above by $2^m+d-1$. Evaluating h at these two points gives $h(2^{m+1}-1)=2^m+d-1$ and $h(2^{m+1}+2d-2)=4d-2 \leqq 2^m+d-1$ by the restriction $d \leqq (2^m+1)/3$. Thus, $Sp^{-d}$ is closed with respect to equation 36 above. That completes the discussion for the case where $d \leqq (2^m+1)/3$ and $p=2^m-d$ with reference to FIG. 18.

An exemplary approach 1900 for implementing GF_p_k_ADD where $(2^m+1)/3<d<2^m-1$ for the case $p=2^m-d$ will now be described with reference to FIG. 19. This description is applicable to both the single-guard-bit representation and multiple-guard-bit representation. When d is in the range given by $(2^m+1)/3<d<2^m-1$, it may be difficult to find a set Sp of reasonable size that is closed under the above reduction operation. In this regard, a reasonable size can mean that the set Sp is sufficiently small that at least two coefficients of a field element of $GF(p^k)$ can be represented in a single hardware register or that a sufficient number of coefficients of a field element of $GF(p^k)$ can be represented in a single hardware register such that a desired degree of parallelization and computational efficiency can be achieved using the approach set forth in FIG. 18. If such a set Sp of reasonable size can be found, then the approach illustrated in FIG. 18 can also be used when d is given by $(2^m+1)/3<d<2^m-1$.

Figure 19:
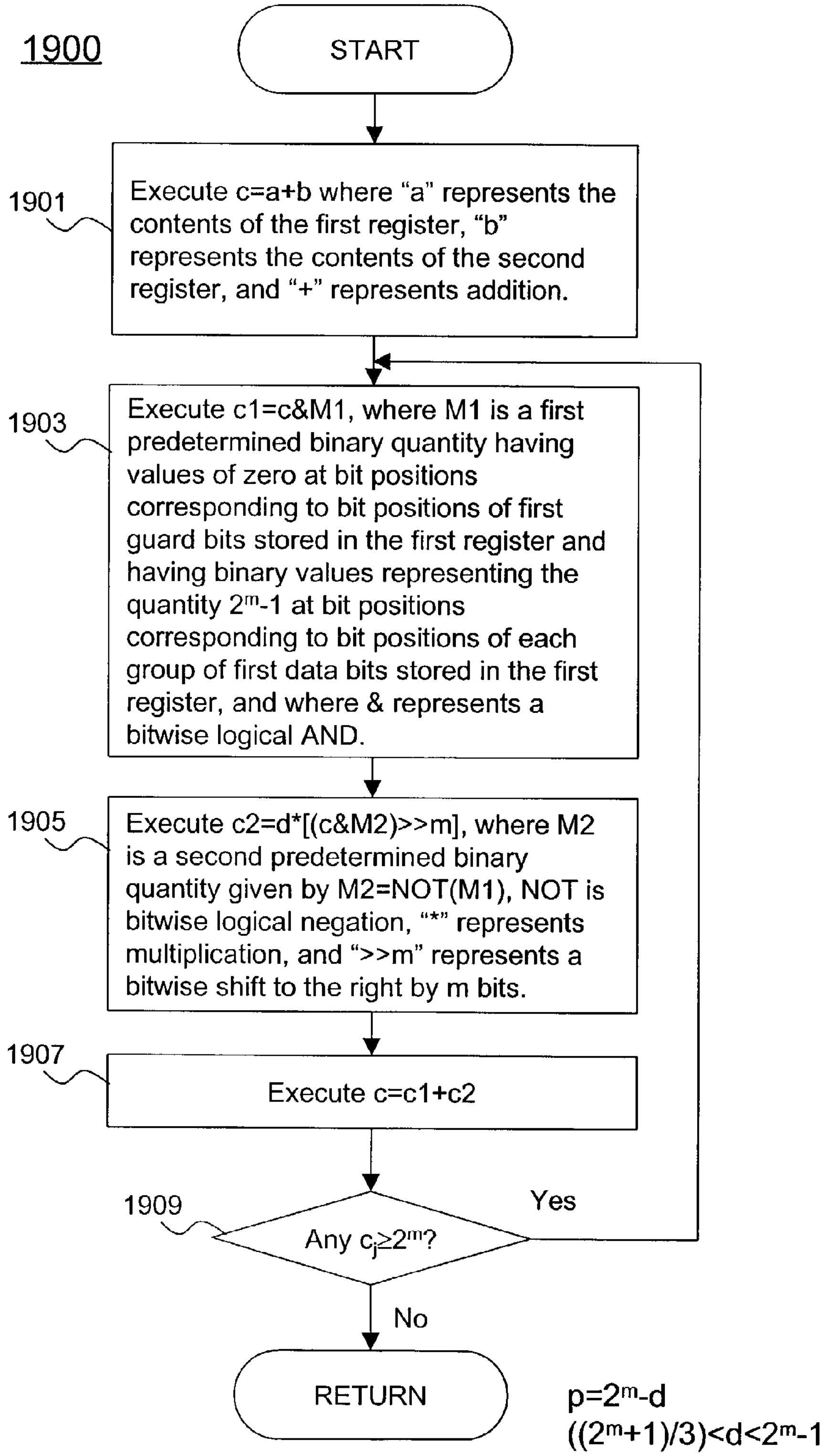
FIG. 19 is a flow diagram illustrating a method of processing binary data in order to determine the sum of two field elements where $p=2^m-d$ and $(2^m+1)/3<d<2^m-1$ in accordance with the method illustrated in FIG. 3 according to an exemplary aspect of the present invention.

When a set Sp of reasonable size is not available for d given by $(2^m+1)/3<d<2^m-1$, the exemplary approach for GF_p_k_ADD illustrated in FIG. 19 can be used to carry out addition in $GF(p^k)$. In this situation, simply let the set Sp be the set given by $Sp=\{0, 1, \ldots, 2^m-1\}$ (i.e., independent of d). Addition in $GF(p^k)$ can then be carried out in accordance with a slightly modified modular reduction algorithm as reflected in FIG. 19. In particular, it can be seen that steps 1901, 1903, 1905 and 1907 shown in FIG. 19 are the same as steps 1801, 1803, 1805 and 1807 shown in FIG. 18, respectively, except that step 1901 is written as c=a+b for convenience, the notation "c" is utilized in steps 1903 and 1905, and a reassignment of the quantity c occurs in step 1907. Moreover, the prescriptions for determining M1 and M2 shown in FIG. 19 are the same as shown in FIG. 18 (the forms of M1 and M2 will, of course, depend upon whether the single-guard-bit representation or multiple-guard-bit representation is used). Accordingly, no further discussion of steps 1901, 1903, 1905 and 1907 is necessary.

The approach 1900 illustrated in FIG. 19 is modified compared to the approach 1800 illustrated in FIG. 18 with regard to step 1909. Step 1909 is a decision step that determines whether any $c_j$ (of the result c) represents an integer value that is greater than or equal to $2^m$. If the answer is yes, then steps 1903, 1905 and 1907 are repeated using the present c. In other words, the approach 1900 illustrated in FIG. 19 executes the operations given in equations 38 and 39

$$c=a+b \qquad (38)$$

while any $c_j>2^m$ do $$c=(c\&M1)+d*((c\&M2)>>m) \qquad (39)$$

where it is understood that $c_j>2^m$ is shorthand for determining whether a group of data bits $c_j$ represents an integer value greater than $2^m$. Thus, as reflected in equations 38 and 39 above, a modular reduction is carried out until each $c_j<2^m$, which guarantees that each $c_j$ of the result c is in the set Sp. Thus, the approach above, in effect, involves subtracting a number of multiples of p from each coefficient of a field element of $GF(p^k)$, where each coefficient is an element of the set Sp. Because $p<2^m$ and $c>0$, each $c_j$ of the result c is indeed a correct representation of $(a_j+b_j)$ mod p, up to a multiple of p. Of course, the modular reduction may now take more time, and one question is how many times the reduction represented by equation 39 above is carried out. Under the approach described above, it can be seen that the reduction is carried out at most twice. In particular, suppose that a $c_j$ in equation 38 becomes at least $c_j \geqq 2^m$ (otherwise there is nothing to show). Since $a_j$ and $b_j$ represent coefficients that are elements of Sp, it is also true that $c_j<2^{m+1}-2$. Each execution of the reduction in equation 39 subtracts a multiple of p, e.g., t·p, where $t\geqq 1$. Then, because $c_j-2p\leqq 2^{m+1}-2-2(2^m-d)=2d-2<2^m$, it is seen that at most two modular reductions are necessary.

It remains to be shown how it is determined whether any $c_j \geqq 2^m$ in equation 39. This test can be carried out on all $c_j$ in parallel as follows. Suppose $c=(c_{k-1}, \ldots, c_0)$ holds a binary result following the reduction in equation 39. The reduction in equation 39 needs to be performed again if there is a j, $0\leqq j\leqq k-1$, such that $c_j\geqq 2^m$. With M2 as the predetermined binary quantity (mask quantity) defined above, performing the test $(c_j\&M2)\neq 0$ is true if and only if at least one of the $c_j$ satisfies $c_j\geqq 2^m$. Note that even if some other $c_i<2^m$, there is no harm in performing the reduction on such a component, because the reduction will not have any effect on that component (since $c_i$ div $2^m=0$, and no multiple of p will be subtracted there). That completes the discussion for the case where $(2^m+1)/3<d<2^m-1$ and $p=2^m-d$ with reference to FIG. 19.

Now, addition in GF($p^k$) (that is, implementing GF_p_k_ADD) for the case where $p=2^m+d$ will be described with reference to FIGS. 20 and 21. The case where $p=2^m+d$ can be treated by extending the approach used for $p=2^m+1$. It is now assumed that d>1 and d is odd. Two exemplary approaches for carrying out addition (two exemplary forms for implementing GF_p_k_ADD) can be used according to two regimes for the value of d: 1) $d\leqq p/6$, and 2) $p/6<d<2^m-1$. (Note that the case $d\geqq 2^m-1$ can be treated by the previously described methods, simply by rewriting p as $p=2^{m'}\pm d'$ where m' and d' are appropriately chosen.)

First, an exemplary approach 2000 for implementing GF_p_k_ADD where $d\leqq p/6$ for the case $p=2^m+d$ will be described with reference to FIG. 20. This description is applicable to both the single-guard-bit representation and multiple-guard-bit representation. Here, the set $Sp^{+d}$ is given by {0, 1, . . . , 2p−(d+1)}, and each coefficient of a field element of GF($p^k$) is an element of the set $Sp^{+d}$, requiring m+2 bits of storage for each such coefficient, not including the guard bit(s). The operations shown in FIG. 18 can be executed by a system such as system 100 shown in FIG. 1. Further, it is assumed that steps 301 and 303 shown in FIG. 3 have already been executed by the processor 105 such that first binary data representing a first field element of GF($p^k$) are stored in a first register (e.g., register 107 shown in FIG. 1) and such that second binary data representing a second field element are stored in a second register (e.g., register 109) in a manner such as described directly above. The first and second binary data can be stored according to either the single-guard-bit representation or the multiple-guard-bit representation—the approach is the same in either case. The steps illustrated in FIG. 20 then represent an exemplary implementation of step 305 shown in FIG. 3.

It will be noted that steps 2001, 2003, 2005 and 2009 are the same as steps 1401, 1403, 1405 and 1409 shown in FIG. 14 for the case $p=2^m+1$. Moreover, the prescriptions for determining the predetermined binary quantities M1 and M2 are the same for FIG. 20 as for FIG. 14 (the exact forms of M1 and M2 will depend, of course, upon whether the single-guard-bit representation or multiple-guard-bit representation is used as has been described previously). As noted, here, m+2 bits are allocated to store each coefficient of field elements, not including the guard bit(s). Accordingly, no further description of these steps is necessary. Step 2007 is analogous to step 1407 shown in FIG. 14, except that the quantity c2 in step 2007 is given by c2=P1−d*{((a+b)&M2)>>m} instead of P1−{((a+b)&M2)>>m}, where * is multiplication as discussed above (e.g., normal integer multiplication or floating-point multiplication). That is, the quantity c2 in step 2007 has a multiplicative factor of "d" that is not present in step 1407 shown in FIG. 14. In addition P1 in step 2007 of FIG. 20 comprises binary values representing the quantity $2^m+d$ rather than $2^m+1$, as in step 1407 of FIG. 14. Thus, implementing the approach 2000 illustrated in FIG. 20 provides third binary data, c, that represents the sum of first and second field elements of GF($p^k$).

Figure 20:
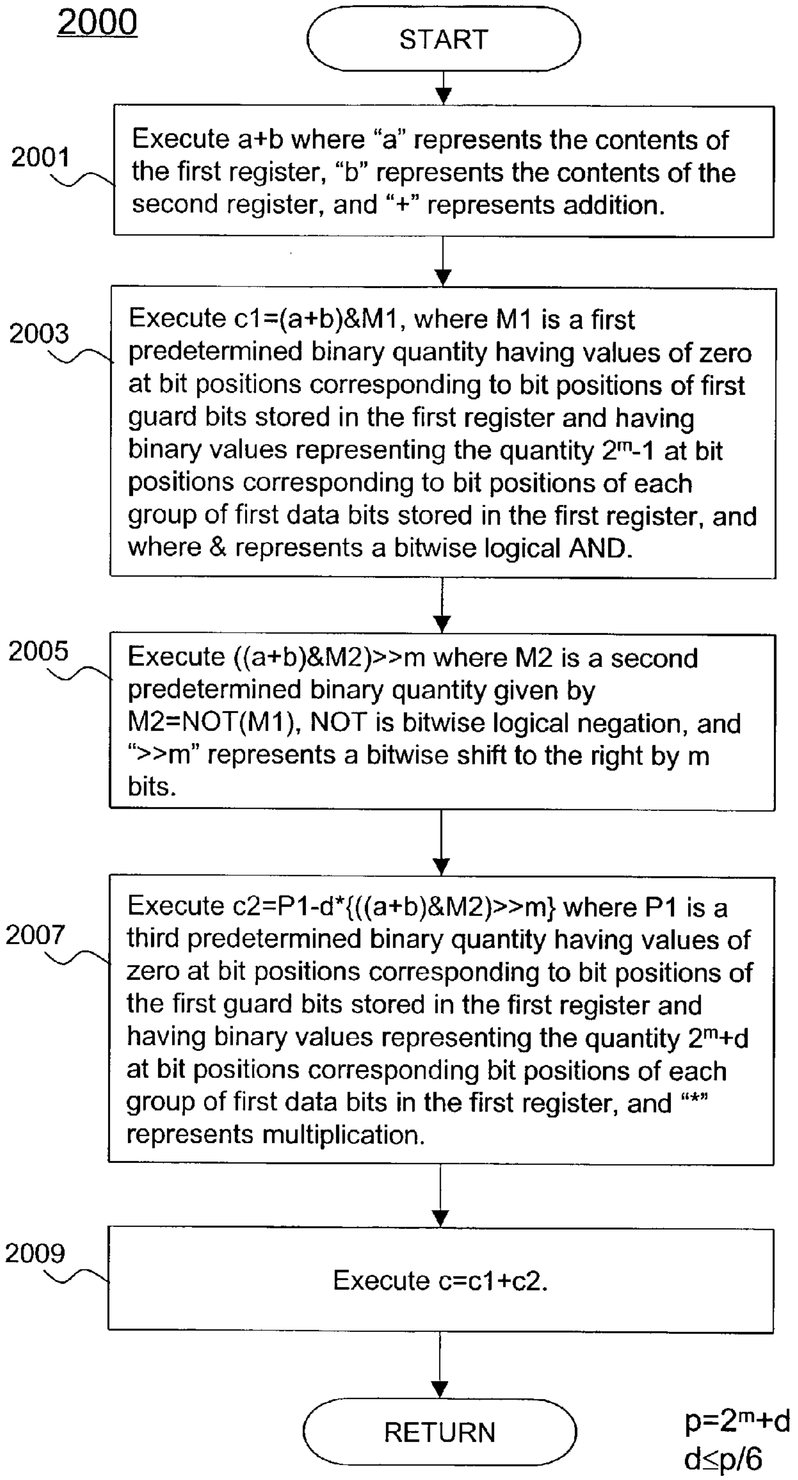
FIG. 20 is a flow diagram illustrating a method of processing binary data in order to determine the sum of two field elements where $p=2^m+d$ and $d\leqq p/6$ in accordance with the method illustrated in FIG. 3 according to an exemplary aspect of the present invention.

Of course, the sequence of carrying out the operations shown in FIG. 20 can vary from the sequence illustrated in FIG. 18, such as has been previously described. Different approaches can be taken as long as the quantity c is determined as shown in equation 40 below, where a, b, c, M1, M2 and P1 are as described previously with reference to FIG. 14.

$$c=((a+b)\&M1)+P1-d*(((a+b)\&M2)>>m) \quad (40)$$

Note that this reduces to equation 36 for the case d=1. That completes the discussion for the case where $d\leqq p/6$ and $p=2^m+d$ with reference to FIG. 20. It can also be verified by one of ordinary skill in the art that the set $Sp^{+d}$ is indeed closed with respect to the above reduction using methods in analogy to the case $p=2^m-d$, d>1, as discussed above.

An exemplary approach 2100 for implementing GF_p_k_ADD where $p/6<d<2^m-1$ for the case $p=2^m+d$ will now be described with reference to FIG. 21. This description is applicable to both the single-guard-bit representation and multiple-guard-bit representation. As noted previously for the case where $p=2^m-d$, when d is in the range given by $p/6<d<2^m-1$, it may be difficult to find a set Sp of reasonable size that is closed under the above reduction operation. However, if a set Sp of reasonable size can be found, then the approach illustrated in FIG. 20 can also be used when d is given by $p/6<d<2^m-1$.

Figure 21:
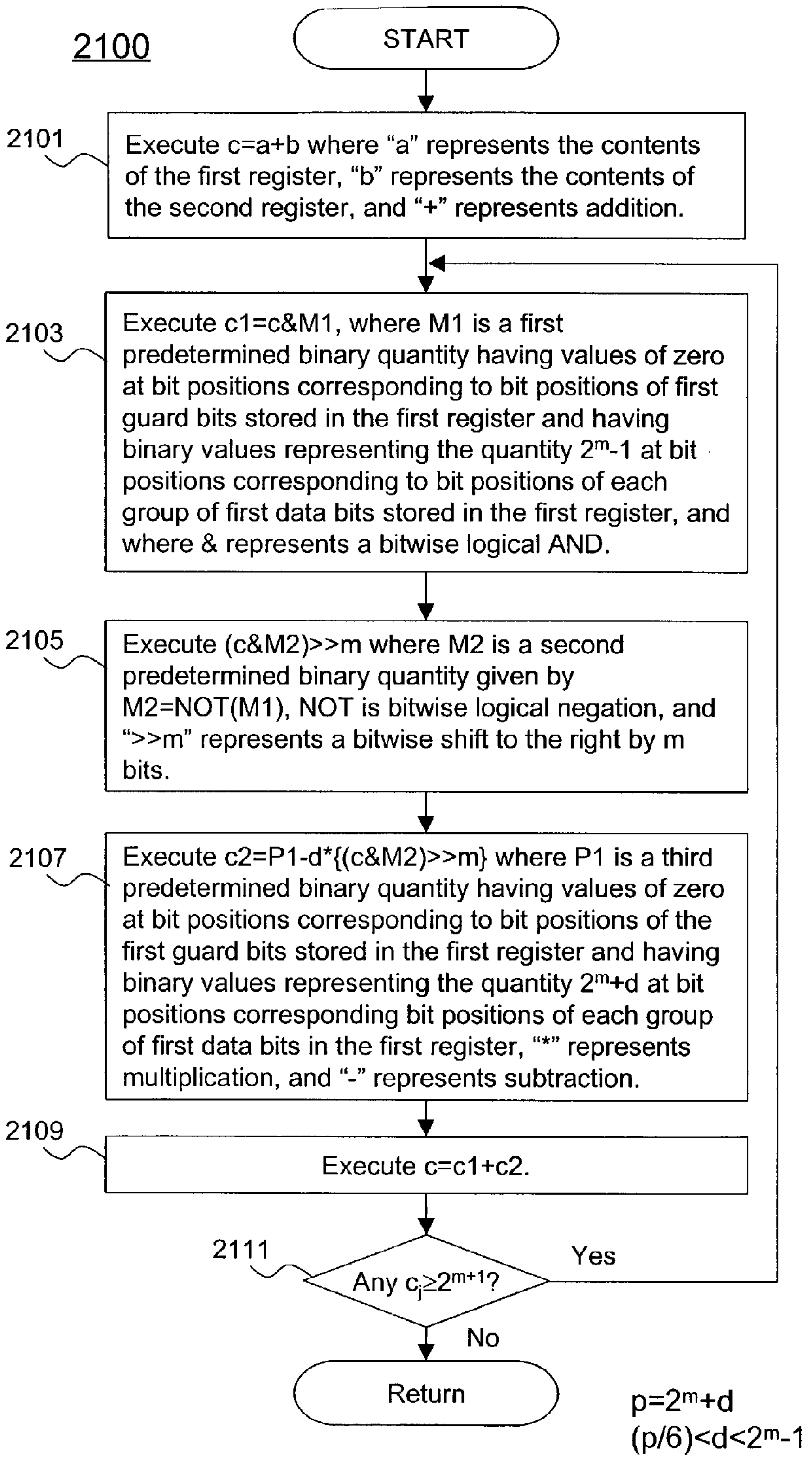
FIG. 21 is a flow diagram illustrating a method of processing binary data in order to determine the sum of two field elements where $p=2^m+d$ and $p/6<d<2^m-1$ in accordance with the method illustrated in FIG. 3 according to an exemplary aspect of the present invention.

When a set Sp of reasonable size is not available for d given by $p/6<d<2^m-1$, the exemplary approach for GF_p_k_ADD illustrated in FIG. 21 can be used to carry out addition in GF($p^k$), by repeatedly performing reductions, in analogy to what was done in equation 39 for the case $p=2^m-d$. However, it is now not clear that a coefficient that is already smaller than $2^m$ actually cannot get larger by this reduction. In fact, this is indeed the case. Considering the reduction function $h'(z)=(z \bmod 2^m)+p-d(z \text{ div } 2^m)$, notice that h'(0)=p>0. Moreover, in the interval {p, p+1, . . . , $2^{m+1}-1$}, the function h' has fixed-points; h'(z)=z, for all z in that interval. The approach of repeated reductions therefore needs slight modification. In this situation, the set Sp will instead be given by Sp={0, 1, . . . , $2^{m+1}-1$} (i.e., independent of d). Note that now, m+1 bits are needed for storage of each coefficient, not including the guard bit(s). Addition in GF($p^k$) can then be carried out in accordance with a slightly modified modular reduction algorithm as reflected in FIG. 21. In particular, it can be seen that steps 2101, 2103, 2105, 2107 and 2109 shown in FIG. 21 are the same as steps 2001, 2003, 2005, 2007 and 2009 shown in FIG. 20, respectively, except that step 2101 is written using c=a+b, the notation "c" is utilized in steps 2103–2107, and a reassignment of the quantity c occurs in step 2109. Moreover, the prescriptions for determining the quantities M1, M2 and P1 shown in FIG. 21 are the same as in FIG. 20 (the exact forms of M1, M2 and P1 will, of course, depend upon whether the single-guard-bit representation or multiple-guard-bit representation is used). Accordingly, no further discussion of steps 2101, 2103, 2105, 2107 and 2109 is necessary.

However, the approach 2100 illustrated in FIG. 21 is modified compared to the approach 2000 illustrated in FIG. 20 with regard to step 2111. Step 2111 is a decision step that determines whether any $c_j$ (of the result c) represents an integer value that is greater than $2^{m+1}$, similar to what was described with reference to FIG. 19. If the answer is yes, then steps 2103, 2105, 2107 and 2109 are repeated. In other words, the approach 2100 illustrated in FIG. 21 executes the operations given in equations 41 and 42

$$c=a+b \quad (41)$$

while any $c_j \geqq 2^{m+1}$ do $$c=(c\&M1)+P1-d^*((c\&M2)>>m) \quad (42)$$

where it is understood that $c_j \geqq 2^{m+1}$ is shorthand for determining whether a group of data bits c, represents an integer value greater than $2^{m+1}$. The implementation of the loop represented by equation 42 is similar to that described with reference to equation 39 and FIG. 19. A difference is that in the previous case the test could be implemented by checking if (c & M2) was zero or not. In the present case, the test can be carried out by checking whether (c & M7) is zero or not, where M7 is a new binary quantity that is the same as M2, except that bit m, and in general, the least significant non-zero bit of any given segment of M2, is reset to zero. (For example, whereas the quantity M2 illustrated in the example of FIG. 15 is given by repeated occurrences of (1, 1, 0, 0) as indicated by reference numeral 1511, the quantity M7 as described above would be given by repeated occurrences of (1, 0, 0, 0) for the test for the present case, with guard bits in appropriate positions.) It can be easily seen by those of ordinary skill in the art that by using the above-noted choice of Sp and the test condition in equation 42, the reduction will eventually terminate, with all components of c being smaller than $2^{m+1}$. That completes the discussion for the case where $p/6<d<2^m-1$ and $p=2^m+d$ with reference to FIG. 21.

In the discussions above relating to FIGS. 18–21, it was noted that the approaches illustrated therein are applicable to both the single-guard-bit representation and multiple-guard-bit representation. When the multiple-guard-bit representation is used, it is merely necessary to note that the first and second binary data representing the first and second field elements, respectively, are stored with multiple guard bits placed between adjacent groups of data bits representing coefficients of the respective field elements, rather than single guard bits as is the case for the single-guard-bit representation. Moreover, the prescriptions for determining the quantities M1, M2 and P1 require no modification for the multiple-guard-bit representation. Of course, applying those prescriptions to the multiple-guard-bit representation will generate different values of the quantities M1, M2 and P1 than will be generated for the single-guard-bit representation. Moreover, given that separate descriptions for addition in $GF(p^k)$ have been provided for the cases where p can be written in the form $p=2^m-1$ and $p=2^m+1$, it will be recognized the approaches described above for the cases where $p=2^m-d$ and $p=2^m+d$ are applicable primarily where d is an odd integer greater than or equal to 3 and less than $2^m-1$, m is an integer greater than or equal to 3, and $p\neq 2^N\pm 1$ for any integer N.

Multiplication of field elements in $GF(p^k)$ where $p=2^m-d$ and $p=2^m+d$ can be carried out using the exemplary forms of GF_p_k_MUL previously described with reference to FIGS. 9–12 for $p=2^m-1$ for both the single-guard-bit representation and multiple-guard-bit representation. It is merely necessary to recognize that m+1 bits (not including guard bits) are allocated to store each group of data bits representing a coefficient of a field element of $GF(p^k)$ for $p=2^m-d$ as opposed to m bits for the case where $p=2^m-1$. This difference, of course, must also be applied to the form of the DLOG and ANTILOG tables. Where the compression function (COMP) and decompression function (DECOMP) are utilized with the multiple-guard-bit representation, these functions must also take into consideration that m+1 bits, rather than m bits, are allocated to store each group of data bits representing a field coefficient.

It was noted above for the case $p=2^m-1$ that a variety of other operations can be carried out according to the present invention including scalar multiplication (equation 23), doubling (equations 28–29), determining the additive inverse (equation 30), determining the multiplicative inverse (equation 31), and exponentiation (equation 32). In view of the discussion above, it will be apparent to those of ordinary skill in the art that these operations can also be carried out for the cases where $p=2^m+1$, $p=2^m-d$ and $p=2^m+d$ using the approaches described above. Moreover, it will also be apparent that hardware apparatuses, such as described with reference to FIGS. 6–8, 12, 16 and 17, can be utilized for the cases where $p=2^m-d$ and $p=2^m+d$. The multiplication apparatus 1200 illustrated in FIG. 12, in fact, requires no modification for use where $p=2^m-d$ and $p=2^m+d$.

To modify the hardware apparatus of FIG. 6 to be adapted to the case $p=2^m-d$ (d>1), a multiplier circuit, performing multiplication (conventional multiplication) by the given quantity d, is inserted between the output connection of the right-shift gate 619 and the input connection of register 603, i.e., at the location indicated by "" in FIG. 6. For FIG. 7, the same type of multiplier circuit can be inserted between the output connection of right-shift gate 719 and the input connection of register 703, i.e., at the location indicated by "" in FIG. 7. In complete analogy, the apparatuses illustrated in FIGS. 16 and 17 can be modified with the same kind of multiplier circuit at the locations indicated by "**" in those figures, respectively, to modify them for the general case $p=2^m+d$, d>1.

Similar to the efficiency enhancements described above for $p=2^m-1$, efficiency enhancements are also expected for approaches for $p=2^m+1$, $p=2^m-d$ and $p=2^m+d$. For example, for addition for k=3, the present methods described herein are expected to be about 8 times faster than the conventional approach (which does not involve parallelization as does the present invention). For k=8 and k=10, the present methods described herein are expected to be about 15 times faster than the conventional approach.

Parallel Addition with Non-Prime Moduli

As should be clear to those of ordinary skill in the art, in none of the cases for describing k parallel additions modulo $p=2^m\pm d$, $d\geqq 1$, did we actually make use of the fact that p was a prime number. While using prime p is important for multiplication in finite fields (otherwise, the group is not cyclic and no generator/log-tables can be found), addition operations are well defined and completely analogous even if p is not prime. Thus, in another aspect of the present invention, the exemplary approaches described above for GF_p_k_ADD can be used to perform k parallel additions modulo p for any p (prime or not) that is close to a power of 2, i.e. $p=2^m\pm d$. In complete analogy, the above-described approaches can be used for different functional forms of p depending on the sign in front of d, and the magnitude of d.

Other Aspects, Including Cryptography and Error Correction

In another aspect of the present invention, the approaches described above can be used in an error correction apparatus and in a method of error correction. The purpose of an error correcting code is to enable a receiver to reconstruct an original message even if the message disturbed by errors in transit, i.e. to correct the errors in the received message. This is done by introducing redundancy to the message. As known to those of ordinary skill in the art, a number of check equations are utilized in error-correcting codes. Upon reception of a message, the receiver can determine if an error occurred by checking the received data in accordance with these equations, and if so, can also determine the error. Depending upon these equations, which define the error-correcting code, multiple errors can sometimes be corrected.

In many cases the codes/equations are constructed using finite field arithmetic. The code will then consist of N-tuples (or "vectors") of the form $$g=(g0,g1, \ldots ,gN-1) \tag{42a}$$

where each gi is an element in GF(q) for some q. Note that only a relatively small set of all such possible g can be valid code words; if all g were allowed, it would be impossible to tell whether an error occurred or not.

Conventionally, each message is mapped into such an N-tuple and transmitted. If a limited number of the $g_1$ are corrupted, the receiver can still retrieve g to obtain the original message. Examples of such codes include Reed-Solomon codes, BCH codes, and Goppa codes known to those of ordinary skill in the art, such as described in *The Theory of Error Correcting Codes* by F. J. MacWilliams and N. J. A. Sloane, Elsevier Science B. V., Amsterdam, 1977. As noted above, these codes can utilize arithmetic operations over finite fields. However, conventional implementations of such codes either utilize binary finite fields or utilize odd-characteristic finite fields in the conventional inefficient manner in which a single coefficient of $GF(p^k)$ is operated upon in a hardware register. In contrast, the present invention provides an approach for carrying out error correction involving odd-characteristic finite fields in which data representing coefficients of a finite field are processed in a parallel and highly efficient manner by storing binary data representing multiple coefficients of an odd characteristic finite field in a single hardware register and by processing the binary data representing the multiple coefficients in parallel.

A conventional approach for decoding a BCH code, such as discussed in *The Theory of Error Correcting Codes* referred to previously, can be described as follows. The field F=GF(q) is the field of $q=p^n$ elements, and we let w denote the multiplicative order of q modulo N (i.e., w is the smallest y such that $q^y=1$ mod N). Let an element α in $GF(q^N)$ be a primitive N-th root of unity, i.e., N is the smallest integer for which $\alpha^N=1$ in that field. Important special cases occur when $N=q^w-1$, which corresponds to a primitive BCH code, and when N=q−1, which corresponds to a Reed-Solomon code. The corresponding BCH code will consist of all N-dimensional vectors $g=(g_0, g_1, \ldots, g_{N-1})$ with components in GF(q) that satisfy the matrix-vector equation $Hg^T=0$, where H is a (D−1)-by-N matrix given by $$H=\begin{bmatrix} 1 & \alpha & \alpha^2 & \cdots & \alpha^{(N-1)} \\ 1 & \alpha^2 & \alpha^4 & \cdots & \alpha^{2(N-1)} \\ \vdots & \vdots & \vdots & & \vdots \\ 1 & \alpha^{d-1} & \alpha^{2(D-1)} & \cdots & \alpha^{(D-1)(N-1)} \end{bmatrix} \tag{43}$$

where T denotes transpose and where D can assume any value between 1 and N−1. This description pertains to a narrow sense BCH code, which is not the most general form.

Figure 22:
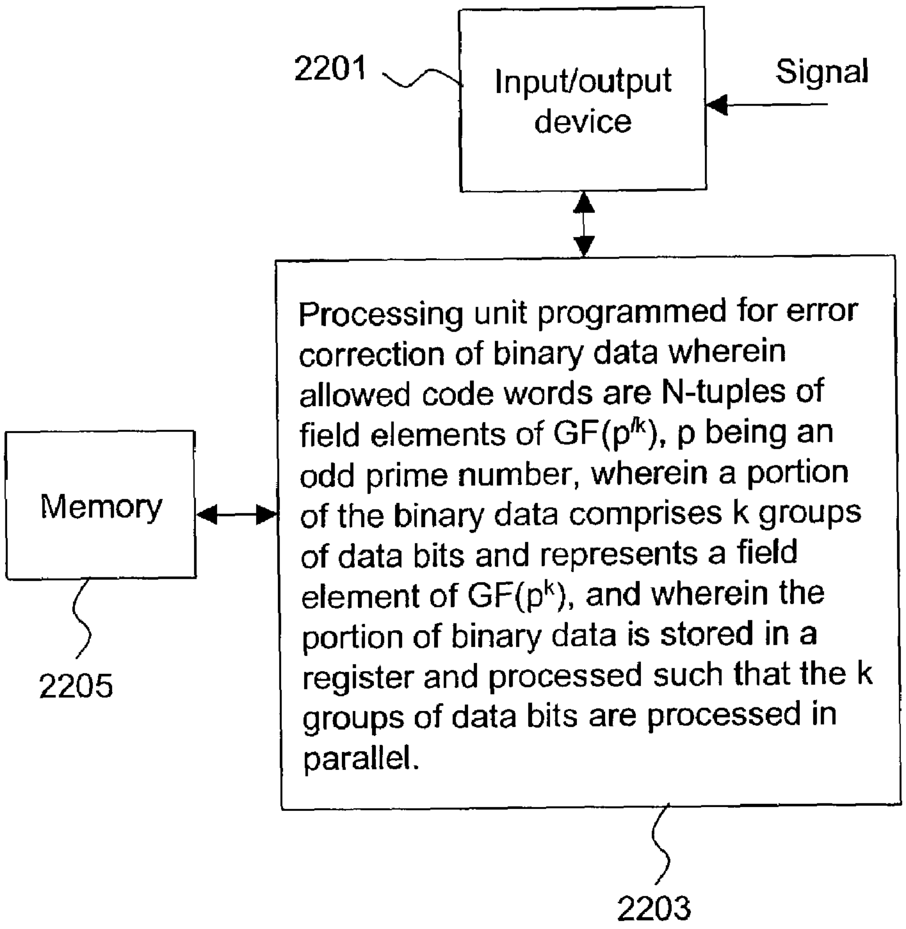
FIG. 22 is a block diagram of a system for carrying out error correction according to an exemplary aspect of the present invention.

In an aspect of the present invention, an exemplary error-correcting apparatus 2200 is provided, such as illustrated in the block diagram of FIG. 22. The apparatus 2200 comprises an input device 2201 (which can also be an input/output device, for example) that receives a signal intended to represent an allowed code word of an error correcting code and a processing unit 2203 programmed for error correction. The apparatus 2200 can also comprise a memory that can be accessed by the processing unit 2203 (e.g., to retrieve a computer program that can cause the processing unit to execute steps of the approaches described herein) and that can store binary data provided by the processor (e.g., calculation results). The signal can be binary data or it can be an analog signal that is converted (e.g., mapped with a mapping device) to binary data in the input/output unit 2201. The phrase "binary data intended to represent an allowed code word" as used herein is intended to encompass both of these possibilities.

The processing unit 2203 can be any suitable processing unit, including conventional or specialized processors, for carrying out the approaches described herein, and the input/output unit 22 can be any suitable interface or device for inputting/outputting data. For example, the processing unit 2203 can be the processing unit of a conventional computer, and the input/output device 2201 can be a conventional modem. As another example, the processing unit 2203 can be that of a hand-held device, such as a mobile telephone or personal digital assistant, and the input/output device 2201 can be a wireless receiver/transmitter. As another example, the processing unit 2203 can be that of a compact disk (CD) player or digital video disk (DVD) player, and the input/output device can be an optical signal receiver that receives a signal from a laser beam modulated by the CD or DVD and outputs a corresponding electrical signal.

The processing unit is programmed to correct errors in the binary data where allowed code words are N-tuples of field elements of $GF(p^{lk})$. The finite field $GF(p^{lk})$ is an extension field of a base field $GF(p^k)$ where p is an odd prime number and where field elements of $GF(p^k)$ comprise k base coefficients. A portion of the binary data comprises k groups of data bits and represents a field element of $GF(p^k)$ wherein the field $GF(p^k)$ has k base coefficients in accordance with a polynomial basis representation, each group of data bits representing a corresponding one of the k base coefficients. With reference to equation 42a above, the portion of the binary data refers to a part of the code word g, corresponding to the representation of one out of I elements of $GF(p^k)$, representing $g_j$ for some j in the range 0, 1, . . . N−1. In particular, in the special case that I=1, the portion will correspond directly to one of the $g_j$. The portion of the binary data is stored in a register, and the processing unit processing processes the portion of the binary data such that the k groups of data bits are processed in parallel using, for example, arithmetic operations previously described above. This will be described in greater detail below.

Figure 23:
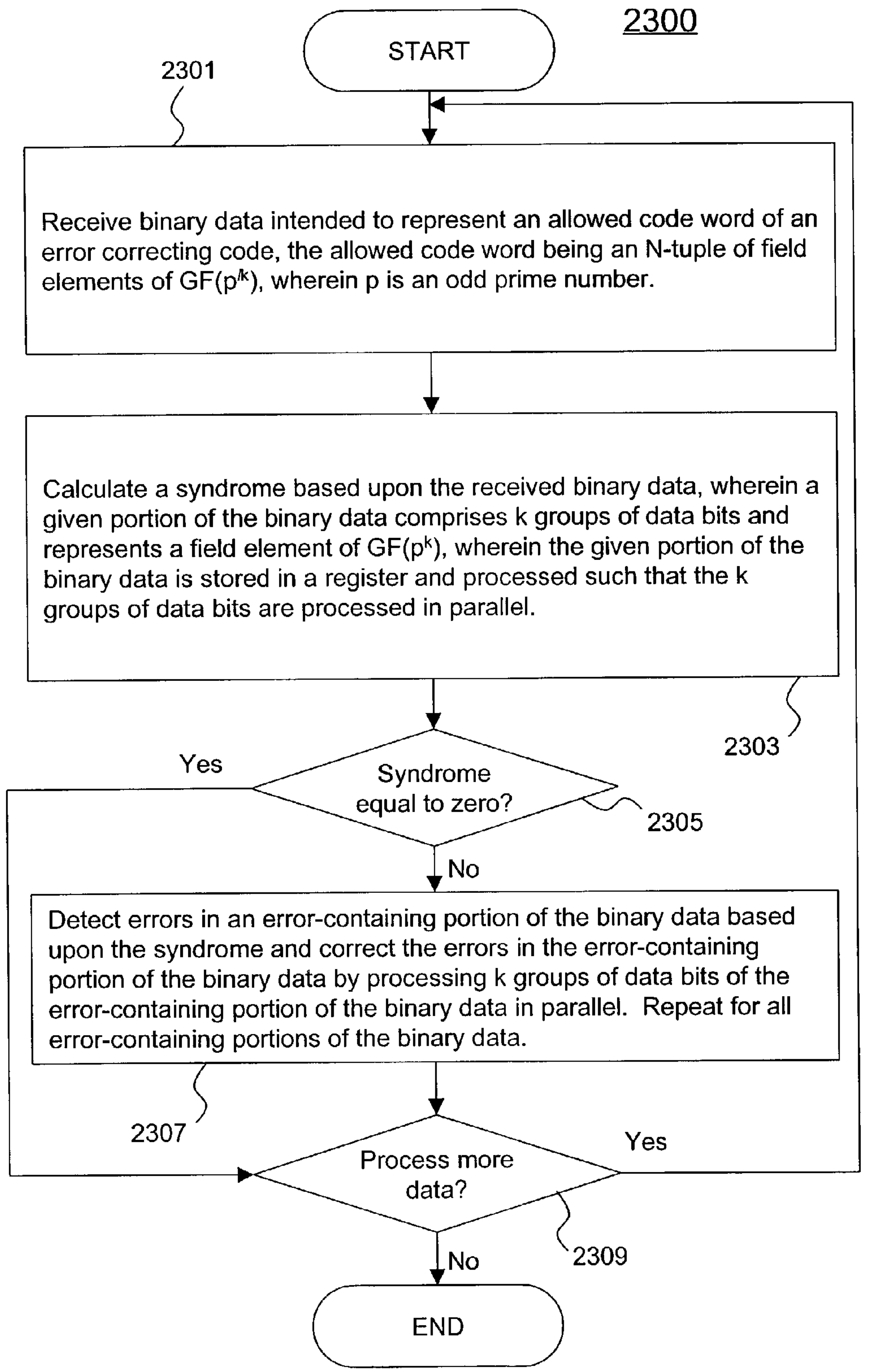
FIG. 23 is a flow diagram illustrating a method for carrying out error correction according to an exemplary aspect of the present invention.

In particular, the error-correcting apparatus 2200 can be programmed for error correction according to the present invention using an exemplary approach 2300 illustrated in FIG. 23. For example, the approach 2300 can be implemented for decoding a BCH code in which the inventive computational approaches described previously are applied to the matrix formulation for error correction described above with reference to equation 50. The approach 2300 can correct d/2 errors (and sometimes more errors) in received binary data $g'=(g'_0, g'_1, \ldots, g'_{N-1})$ intended to represent an allowed code word.

First, as indicated at step 2301 in FIG. 23, the error-correcting apparatus receives binary data intended to represent an allowed code word of an error correcting code wherein the allowed code word is an N-tuple of field elements of $GF(p^{lk})$ where p is an odd prime number. In other words, each allowed code word comprises N field elements of $GF(p^{lk})$. The binary data can be received directly or can be converted from an analog signal as noted above. In addition, each field element of $GF(p^{lk})$ can be viewed as comprising l primary coefficients in accordance with a polynomial basis representation, wherein each primary coefficient is a field element of $GF(p^k)$ having k base coefficients. The binary data intended to represent an allowed code word can be viewed as comprising N collections of data bits, wherein each collection of data bits comprises l segments of data bits, each segment of data bits representing a corresponding one of the l primary coefficients. Further, each segment of data bits can be viewed as comprising k groups of data bits, wherein each group of data bits represents a corresponding one of the k base coefficients.

As indicated at step 2303, the error-correcting apparatus 2200 then calculates a syndrome based upon the received binary data, wherein a given portion of the binary data (e.g., a given segment of data bits corresponding to one of the l primary coefficients) is stored in a register, and wherein k groups of data bits of the given portion of the binary data are processed in parallel. In particular, for the example of the matrix formulation described above with reference to equation 43 (pertaining to a BCH code), a syndrome can be calculated as follows. Transmitted binary data $g=(g_0, g_1, \ldots, g_{N-1})$ (or a transmitted signal corresponding to such binary data) is received as binary data $g'=(g'_0, g'_1, \ldots, g'_{N-1})$. Let the error locations in the binary data g' be those indices j for which $g'_j \neq g_j$, and let the error values be the (non-zero) values $e_j$ in $GF(p^{lk})$ satisfying $g'_j=g_j+e_j$. Finally, for convenience define $\eta_j=\alpha^j$ where $\alpha^j$ is a to the power of j (computed in the field). Then, in conjunction with the matrix equation 43 referred to above, the syndrome S can be calculated in accordance with the relation $$S=Hg'^T \quad (44)$$

giving $S=(S_1, S_2, \ldots, S_{d-1})$. It should be noted that the components $g'_j$ in g' are elements in $GF(p^{lk})$, and the syndrome entries $S_1$ are elements of $GF(p^{Nlk})$, where $GF(p^{Nlk})$ is an extension field of $GF(p^{lk})$. In calculating the syndrome S in accordance with equation 44, arithmetic operations must be carried out in the field $GF(p^k)$. As noted above, each of the l segments of data bits comprises k groups of data bits, each group of data bits represents a corresponding one of the k base coefficients. As reflected at step 2303, the syndrome is calculated such that k groups of data bits stored in a register are processed in parallel using, for example, exemplary implementations of GF_p_k_ADD and GF_p_k_MUL, as well as any other needed operations, described previously.

Next, as indicated at step 2305, it is determined whether the syndrome S is equal to zero, i.e., whether S=0=(0, 0, . . . , 0). If S=0, then no error occurred, and the procedure skips to step 2309 where it is determined whether more data should be processed. If S≠0, the procedure proceeds to step 2307 where the errors are detected.

As indicated at step 2307, the error-correcting apparatus detects errors in an error-containing portion of the binary data (e.g., an error-containing segment of data bits) based upon the syndrome, and corrects the errors in the error-containing portion of the binary data by processing k groups of data bits of the error-containing portion of the binary data in parallel. This process is repeated for all error-containing portions of the binary data. For example, with regard to the matrix formulation of equation 44 pertaining to a BCH code, assuming r errors occurred, equation 45 below must be satisfied for each j, where $0 \leqq j \leqq d-1$ $$S_j=e_1\eta_{i1}^j+ \ldots +e_r\eta_{ir}^j \quad (45)$$

for some $e_i$ (the error values) in $GF(p^k)$ and some $\eta_{1k}$ belonging to the set $\{\eta_0, \ldots, \eta_{n-1}\}$ (the error locations).

Moreover, in determining the error values in accordance with this example, the maximum number r must be determined, such that the system of equations $$S_{J+r}+S_{j+r-1}\tau_1+ \ldots +S_J\tau_r=0 \quad (46)$$

(where $1 \leqq j \leqq r-1$) has a unique solution for values of $\tau_i$, and those $\tau_i$ must be determined (here r is the number of corrupt indices in g'). This can be accomplished, for example, using the Berlekamp-Massey algorithm known to those of ordinary skill in the art and described, for example, in *The Theory Of Error Correcting* Codes referred to previously. Then a degree r error-locator polynomial can be established, which has the form as set forth in equation 47 below $$s(x)=(1-\eta_{i1}x)(1-\eta_{i2}x) \ \ldots \ (1-\eta_{ir}x)=\tau_r x^r+\tau_{r-1}x^{r-1}+ \ldots +\tau_0 \quad (47)$$

where $\tau_0=1$ for determining error locations. By equation 47, a given j $(0 \leqq j \leqq N-1)$ is an error location if and only if $s(\eta_j^{-1})=0$, which can be determined by evaluating each s(x), in turn, by Horner's evaluation rule for polynomials, which is known to those of ordinary skill in the art and is described, for example, in *Seminumerical Algorithms*, Vol. 2 of *The Art of Computer Programming*, referred to above. Each such computation involves on the order of r additions and multiplications in $GF(p^{lk})$, which can be carried out using exemplary approaches for SUM(α, β), PRODUCT(α, β), GF_p_k_ADD and GF_p_k_MUL according to the present invention, which have been described above.

Then, the error values $e_i$ are found by introducing the $\eta_J$ values found as described above into the equations defined by equation 45 and solving them. For locations j where no error has occurred, the value $e_j$ is defined as $e_j=0$. Next, the errors are corrected in accordance with the relation g=g'−e, where $e=(e_0, e_1, \ldots, e_{N-1})$. That is, for each j between 0 and N−1, the quantity $g_i$ is determined in accordance with $g_J=g'_J-e_J$. This latter step is accomplished by carrying out N subtractions in $GF(p^{lk})$. At this point, step 2307 is completed for the exemplary treatment of error correction involving a BCH code.

As indicated at step 2309 shown in FIG. 23, it is determined whether more data should be processed—that is, whether more binary data intended to represent an allowed code word has been received and should be processed. If more data should be processed, the procedure returns to step 2301. If no further data should be processed, the procedure ends.

In another aspect of the invention, the inventive arithmetic approaches described above, including but not limited to the exemplary approaches for GF_p_k_ADD, GF_p_k_MUL and exponentiation, can be used in cryptography, for example, in cryptography utilizing elliptic curves and in key exchange. Cryptography utilizing elliptic curves is well known to those of ordinary skill in the art. For example, an approach for encrypting plaintext onto elliptic curves is described, for example, in U.S. Pat. No. 6,307,935 (Method and apparatus for fast elliptic encryption with direct embedding), the entire contents of which are incorporated herein by reference. In addition, a key agreement and transport protocol that can use elliptic curves is described in U.S. Pat. No. 6,122,736 (Key agreement and transport protocol with implicit signatures), the entire contents of which are incorporated herein by reference. Further, a public key protocol that can utilize elliptic curves is described in U.S. Pat. No. 5,933,504 (Strengthened public key protocol), the entire contents of which are incorporated herein by reference. Moreover, an approach for implementing key exchange involving elliptic curves is described in U.S. Pat. No. 5,159,632 (Method and apparatus for public key exchange in a cryptographic system), the entire contents of which are incorporated herein by reference. It should be noted, however, that U.S. Pat. Nos. 6,307,935, 6,122,736, 5,933,504 and 5,159,632 do not disclose storing binary data representing multiple field-element coefficients in a single register and processing such binary data in parallel as taught herein.

Some aspects of elliptic curves will now be described. For a finite field F and two elements α and β in F, an elliptic curve over F can be considered (informally) the set of points (x, y) in F×F that satisfies the equation $$y^2 = x^3 + \alpha x + \beta. \qquad (48)$$

In addition, there is a point at infinity, O, which is conceptually thought of as lying "infinitely" high up on the y-axis. These points together form an abelian group under a group "addition" operation, denoted as $\textcircled{x}$. This group addition operation is defined in terms of arithmetic operations in the underlying field, F, as is known to those of ordinary skill in the art. Thus, according to the present invention, the underlying field can be chosen to be an odd-characteristic finite field $GF(p^k)$ (or an extension thereof), and the exemplary arithmetic approaches described above, including but not limited to GF_p_k_ADD and GF_p_k_MUL and exponentiation, can be used to enhance computational efficiency in cryptographic computations carried out for an elliptic-curve group over the odd-characteristic finite field $GF(p^k)$.

For example, if g is a point on such an elliptic curve, g may be combined with itself, x times, under the $\textcircled{x}$ operation to provide $$z = g \textcircled{c}\, g \textcircled{x} \ldots \textcircled{x}\, g. \qquad (49)$$

The operations in equation 49 may be thought of as a kind of exponentiation wherein $z=g^x$. In the remainder of the description, we generically use $g^x$ to denote the composition of the group operation with itself, x times acting on g. From the context it will always be clear if this operation is finite field multiplication, or, elliptic curve point addition. In the elliptic curve case, this thus gives rise to a special case of the discrete logarithm problem referred to previously. Current state of the art suggests that the elliptic curve version of the discrete logarithm can be harder to solve than in other settings, making it especially attractive for cryptography.

Figure 24A:
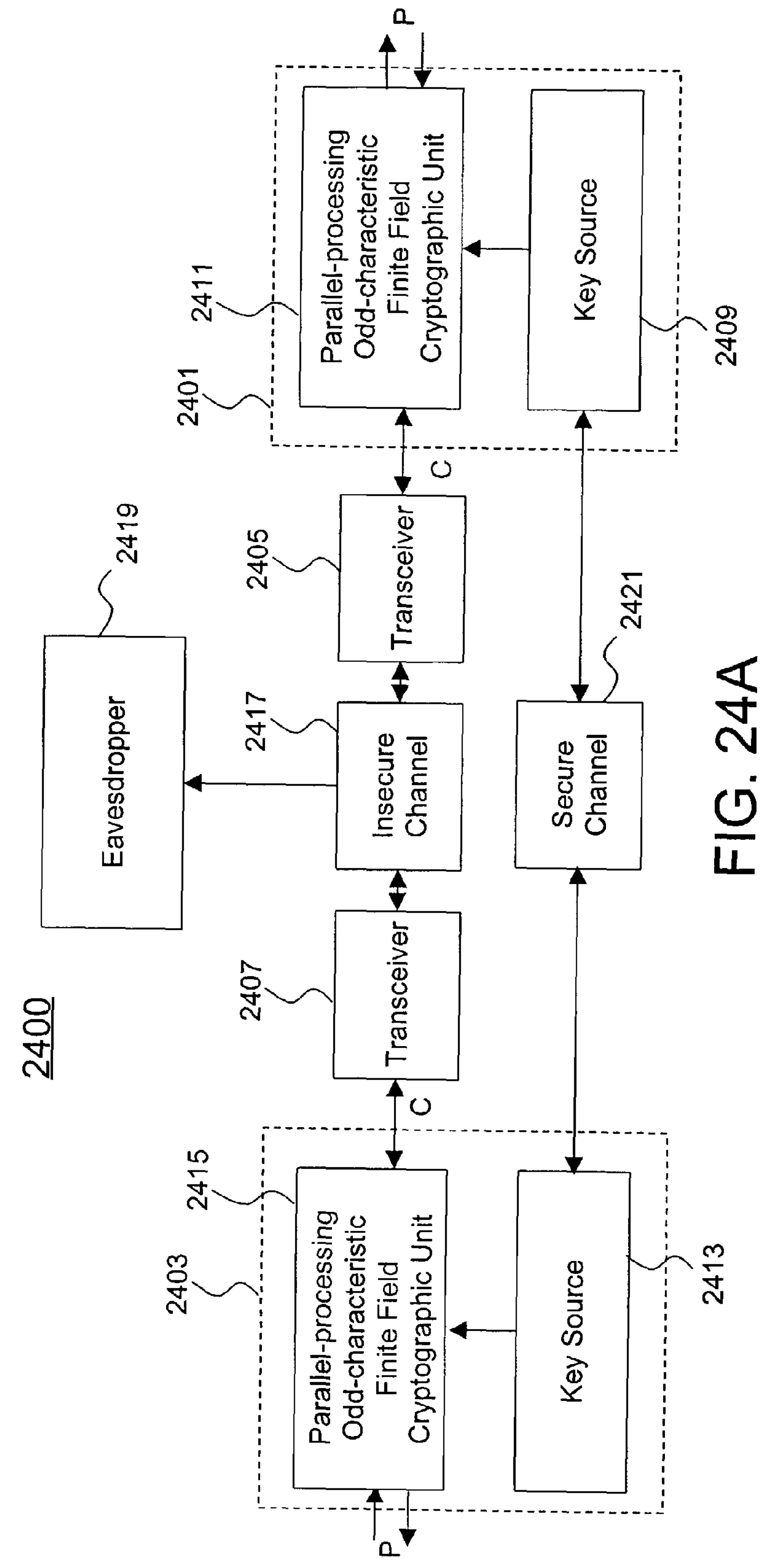
FIG. 24A is a functional block diagram illustrating a system for carrying out encryption/decryption according to an exemplary aspect of the present invention.

According to an aspect of the present invention, there is provided a cryptographic apparatus comprising a key source and an odd-characteristic finite-field cryptographic unit coupled to the key source for use in a cryptographic system, such as the exemplary cryptographic system illustrated in FIG. 24A. The cryptographic apparatus is configured to implement cryptographic computations involving the field $GF(p^k)$ (p being an odd prime) and can utilize the single-guard-bit representation or the multiple-guard-bit representation. An exemplary cryptographic system according to the present invention will now be described with reference to FIG. 24A.

FIG. 24A is a functional block diagram illustrating a cryptographic system 2400 comprising a first cryptographic apparatus 2401, a second cryptographic apparatus 2403, a first transceiver 2405 for transmitting and receiving ciphertext over an insecure channel 2417, and a second transceiver 2407 for transmitting and receiving ciphertext over the insecure channel 2417. An eavesdropper 2419 is assumed to be able to observe the communications over the insecure channel 2417. The first cryptographic apparatus 2401 comprises a first key source 2409 and a first odd-characteristic finite-field cryptographic unit 2411 (also referred to herein as the first FFCU) for encrypting and decrypting messages. Either or both the first key source 2409 and the first FFCU 2411 can be implemented, for example, using one or more processing units of a conventional computer or of a hand-held device such as a mobile phone. In addition, the first cryptographic apparatus 2401 can also comprise a memory that can be accessed by the FFCU 2411 (e.g., to retrieve a computer program that can cause the FFCU 2411 to execute steps of cryptographic approaches described herein) and that can store binary data provided by the FFCU 2411 (e.g., calculation results).

The second cryptographic apparatus 2403 comprises a second key source 2413 and a second odd-characteristic finite-field cryptographic unit 2415 (also referred to herein as the second FFCU 2415) for encrypting and decrypting messages. (Here, "first" and "second" are used merely to distinguish aspects of the first cryptographic apparatus 2401 and the second cryptographic apparatus 2403.) Either or both the second key source 2413 and the second FFCU 2415 can be implemented, for example, using one or more processing units of a conventional computer or of a hand-held device such as a mobile phone. In addition, the second cryptographic apparatus 2403 can also comprise a memory that can be accessed by the FFCU 2415 (e.g., to retrieve a computer program that can cause the FFCU 2415 to execute steps of cryptographic approaches described herein) and that can store binary data provided by the FFCU 2415 (e.g., calculation results). In addition, the first and second key sources 2409 and 2413 can include random number generators.

As noted above, the first cryptographic apparatus 2401 comprises a first key source 2409 and a first odd-characteristic finite-field cryptographic unit (FFCU) 2411 coupled to the key source. In one aspect of the present invention, the FFCU 2411 (or FFCU 2415) can be configured to execute steps of an exemplary cryptographic method 2450 illustrated in the flow diagram of FIG. 24B. The method 2450 comprises storing binary data representing at least a portion of a field element of an odd-characteristic finite field $GF(p^k)$ in a register (e.g., an internal register of a processing unit used to implement the FFCU 2411), p being an odd prime number (step 2451). The field element comprises k coefficients in accordance with a polynomial-basis representation, and the binary data comprises plural groups of data bits, wherein each group of data bits represents an associated one of the k coefficients. The method also comprises processing the binary data in accordance with a cryptographic algorithm such that the plural groups of data bits are processed in parallel (step 2453).

Figure 24B:
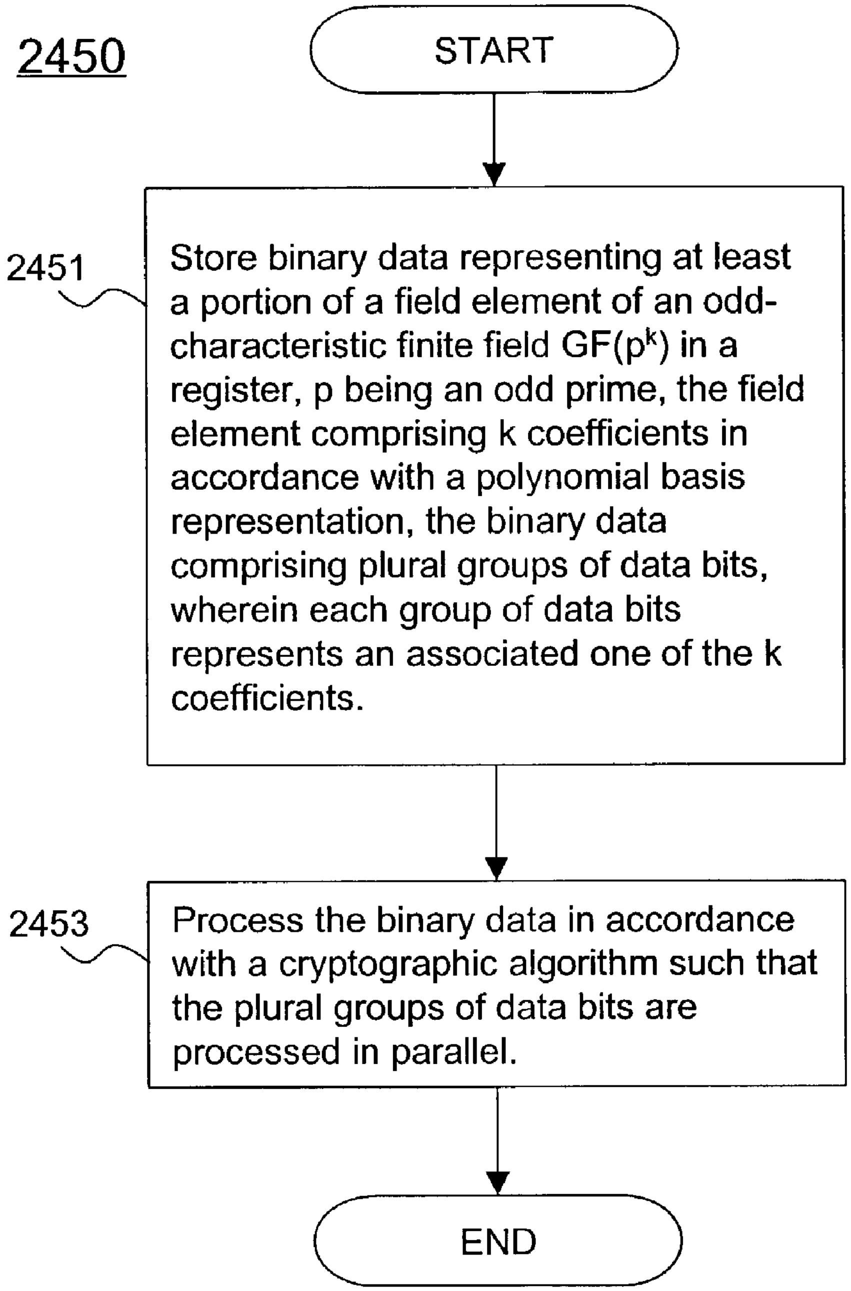
FIG. 24B is a flow diagram illustrating an exemplary cryptographic method according to the present invention.

Additional details relating to an exemplary operation of the cryptographic system 2400 illustrated in FIG. 24A and relating to the exemplary cryptographic method 2450 illustrated in FIG. 24B will now be described. The description will address the case where a message is sent from the first cryptographic apparatus 2401 and is received by the second cryptographic apparatus 2403, but the description is equally applicable to the situation where the message originates at the second cryptographic apparatus 2403 and is received by the first cryptographic apparatus 2401.

A first converser and a second converser each have secure keys. In one aspect, a secure key can be generated by key exchange according to the present invention. In this regard, the binary data referred to above can be key data, and the cryptographic algorithm referred to above can be a key exchange algorithm such as described below with reference to FIG. 25. A secure key can be thereby exchanged via the insecure channel 2417. Alternatively, in another exemplary aspect, each of the conversers can have a public key/private key pair, wherein the public keys of each converser are made available to the other converser over a public channel. In this regard the binary data referred to above can be message data, and the cryptographic algorithm referred to above can be a public-key encryption algorithm used to encrypt/decrypt the message data, such as described below with reference to FIG. 26.

As illustrated in FIG. 24A, a secure key generated by key exchange, or a public key, can be provided from the key source 2409 to the first FFCU 2411 of the first encryption apparatus 2401. Plaintext P is provided to the first FFCU 2411, and the plaintext is encrypted by the first FFCU 2411 using a suitable encryption algorithm, thereby generating ciphertext C. The encryption algorithm is agreed upon by the first and second conversers in advance, and the key from key source 2409 is appropriately configured for the encryption algorithm. If key exchange according to the present invention is used to generate a secure key, the encryption algorithm used for encrypting the plaintext can be any suitable encryption algorithm, such as DES or RSA, for example. If public/private key pairs are used, the encryption algorithm used for encrypting the plaintext can be public-key encryption such as described below with reference to FIGS. 26, 27 and 28 or any suitable encryption algorithm that can be implemented in accordance with the method 2450 illustrated in FIG. 24B.

The ciphertext C is then provided to the transceiver 2405 (e.g., a network interface, modem or wireless transmitter/receiver) which transmits the ciphertext C over the insecure channel 2417 to transceiver 2407. It is assumed that the transmission can be observed by an eavesdropper 2419.

The ciphertext is then provided to the second FFCU 2415 of the second cryptographic apparatus 2403. The second FFCU 2415 decrypts the ciphertext according to a decryption algorithm that corresponds to the encryption algorithm agreed upon by the first and second conversers. The decryption algorithm utilizes a key from the key source 2413 in conjunction with the decryption. The key can be, for example, a key generated using key exchange, or a private key corresponding to a public key used for encryption. Additional exemplary aspects according to the present invention relating to FIGS. 24A and 24B will now be discussed.

In one aspect of the present invention, the binary data stored in the register can represent all k coefficients the field element. In addition, the plural groups of data bits can be stored in the register such that at least one guard bit is positioned adjacent to the most significant bit of each group of data bits, each group of data bits being separated from an adjacent group of data bits by a corresponding at least one guard bit. One guard bit (single-guard-bit representation) or multiple guard bits (multiple-guard-bit representation) can positioned adjacent to the most significant bit of each group of data bits. An initial value of zero can assigned to each at least one guard bit.

In one aspect of the present invention, the cryptographic apparatus 2401 (and/or 2403) can implement key exchange, as one example of the cryptographic method 2450, using computations involving the odd-characteristic finite field $GF(p^k)$. Such key exchange can be carried out using the single-guard-bit representation or the multiple-guard-bit representation. An exemplary method 2500 of key exchange according to the present invention, e.g., implemented using the cryptographic system 2400, will now be described with reference to FIGS. 24A and 25.

A first converser having a first cryptographic apparatus 2401 and a second converser having a second cryptographic apparatus 2403 want to communicate securely over the insecure channel 2417 such than an eavesdropper cannot decrypt their transmissions. Thus, the first and second conversers must first agree on a key to use for encryption, data authentication, etc. Such a key can be generated using Diffie-Hellman key exchange adapted for finite-field computations over $GF(p^k)$ according to the present invention. Conventional Diffie-Hellman key exchange is described in U.S. Pat. No. 4,200,770 (Cryptographic apparatus and method), the entire contents of which are incorporated herein by reference. Moreover, as noted above, conventional key exchange over elliptic curves is described in U.S. Pat. No. 5,159,632 previously incorporated herein.

The first and second conversers agree on a quantity g, wherein g is an element of a finite field F or a point on an elliptic curve over F, F being an odd-characteristic finite field $GF(p^k)$ or an extension field of $GF(p^k)$, p being an odd prime number. In practice, g will generate a group over which calculations are carried out, the group having an exponentiation operation. If g is chosen, for example, as a point on an elliptic curve over F, the group can be viewed as an elliptic curve group defined over the F. If g is chosen as an element of F, the group can be viewed as a conventional multiplicative group over the finite field F. In either case, the quantity g should be chosen such that a smallest integer x, where $g^x=1$, is sufficiently large to provide for sufficient security ("1" is the identity element in the group). For example, the binary representation of this integer x should be at least 160 bits in size in view of the computational power of present generation processors. This smallest integer x can be denoted by $|G|$ (the size of the group). Sufficient security in this regard means that the exponentiation is secure in the sense that the discrete logarithm problem is intractable (i.e., computationally infeasible).

To generate a key, a number xA is generated (step 2501) by the key source 2409 of the first cryptographic unit 2401 associated with the first converser and is provided to the first FFCU 2411. The number xA can be, for example, an integer generated randomly or pseudorandomly, as these terms are conventionally understood in the art. The number xA is not intended to be shared with other conversers, and, in this regard, can be considered a secret number. It will be understood that an integer in this context is intended to include both an integer stored as an integer as well as an integer stored as a floating-point decimal. The first FFCU 2411 generates and sends yA, wherein yA=$g^{xA}$ (step 2503) to the second cryptographic unit 2403 associated with the second converser over the insecure channel 2417. As noted above, g is an element of a finite field F or a point on an elliptic curve over F, F being an odd-characteristic finite field GF($p^k$) or an extension field of GF($p^k$), p being an odd prime. The quantity g comprises plural first base coefficients, wherein the first base coefficients are elements of GF(p). For example, if g is chosen as an element of GF($p^k$), then g would comprise k first base coefficients that are elements of GF(p). If g is chosen as an element of an extension field GF($p^{lk}$), then g would comprise lk first base coefficients that are elements of GF(p). If g is chosen as a point on an elliptic curve over GF($p^k$), then g would comprise 2·k first base coefficients that are elements of GF(p), because g would then be represented by a pair of quantities, both of which are elements of GF($p^k$). Similarly, if g is chosen as a point on an elliptic curve over GF($p^{lk}$), then g would comprise 2·l·k base coefficients that are elements of GF(p).

The first FFCU 2411 carries out the computation of yA by storing multiple groups of first data bits representing at least some of the plural first base coefficients of g in a first register and by processing the multiple groups of first data bits in parallel to generate yA (step 2503). The multiple groups of first data bits can be stored in the first register such that at least one first guard bit is positioned adjacent to the most significant bit of each group of first data bits, each group of first data bits being separated from an adjacent group of first data bits by a corresponding at least one first guard bit. One first guard bit can be positioned adjacent to the most significant bit of each group of first data bits (i.e., the single-guard-bit representation), or multiple first guard bits can be positioned adjacent to the most significant bit of each group of first data bits (i.e., the multiple-guard-bit representation). An initial value of zero can be assigned to each first guard bit. The computation of yA can be carried out using the exponentiation function referred to in equation 32 such that the multiple groups of first data bits are processed in parallel in the manner previously described. Even though equation 32 was described with regard to p of the form $p=2^m-1$, equation 32 is also applicable for p of the form $p=2^m+1$ and $p=2^m\pm d$, as noted previously. Depending upon the register size of the hardware and the number of first base coefficients that g comprises, it may be possible to store multiple groups of first data bits representing all base coefficients of g in a single register.

Similarly, a number xB (e.g., a randomly or pseudorandomly generated integer) is independently generated by the second key source 2413 of the second cryptographic unit 2403 associated with the second converser and is provided to the second FFCU 2415. The number xB is not intended to be shared with other conversers, and, in this regard, can be considered a secret number. The second FFCU 2415 computes and sends yB=$g^{xB}$ to the first cryptographic unit 2401 over the insecure channel 2417. The second FFCU 2415 can carry out the computation of yB by storing multiple groups of data bits representing at least some of the plural first base coefficients of g in either the single-guard-bit representation or multiple-guard-bit representation in a register and by using the exponentiation function referred to in equation 32 such that the multiple groups of data bits are processed in parallel in the manner previously described.

The first FFCU 2411 receives the quantity yB, wherein yB comprises plural second base coefficients, the second base coefficients being elements of GF(p) (step 2505). The FFCU 2411 stores multiple groups of second data bits representing at least some of the plural second base coefficients of yB in a second register, and then calculates K=$(yB)^{xA}$ by processing the plural groups of second data bits in parallel (step 2507). The second FFCU 2415 computes the same value K in accordance with K=$(yA)^{xB}$. These computations can also be carried out using exponentiation operation referred to in equation 32 wherein multiple groups of data bits representing associated base coefficients (elements of GF(p)) of yB and yA are respectively processed in parallel. Under the above assumptions, only the first and second conversers can compute K, and the first and second conversers may use K (or a function thereof) as a key. By implementing the above-described adaptation of Diffie-Hellman key exchange over an elliptic curve or other group defined over GF($p^k$) using the single-guard-bit representation or multiple-guard-bit representation, the present invention offers increased computational efficiency compared to conventional approaches, which can either be manifested as increased speed compared to conventional approaches or increased security for the same computational effort.

Having generated a secure key K in accordance with the key exchange algorithm described above, the first and second conversers can utilize that key in conjunction with their first and second FFCUs 2411 and 2415, respectively, to encrypt and decrypt exchanged messages. The encryption/decryption algorithm in this regard can be, for example, conventional cryptographic methods such as RSA or DES known to those of ordinary skill in the art, or any other suitable encryption algorithm.

The first cryptographic apparatus 2401 and the second cryptographic apparatus 2403 have each been described as comprising a finite-field cryptographic unit and a key source. It should be understood that the first finite-field cryptographic unit 2411 and the first key source 2409 of the first cryptographic apparatus 2401 can be implemented using a memory and a processing unit coupled to the memory. In other words, the first cryptographic apparatus 2410 can comprise a memory and a processing unit coupled to the memory, wherein the processing unit is configured to execute steps noted above for the first cryptographic unit. Similarly, the second cryptographic apparatus can also comprise a memory and a processing unit coupled to the memory, wherein the processing unit of the second cryptographic apparatus is configured to execute steps noted above for the second cryptographic unit.

Figure 25:
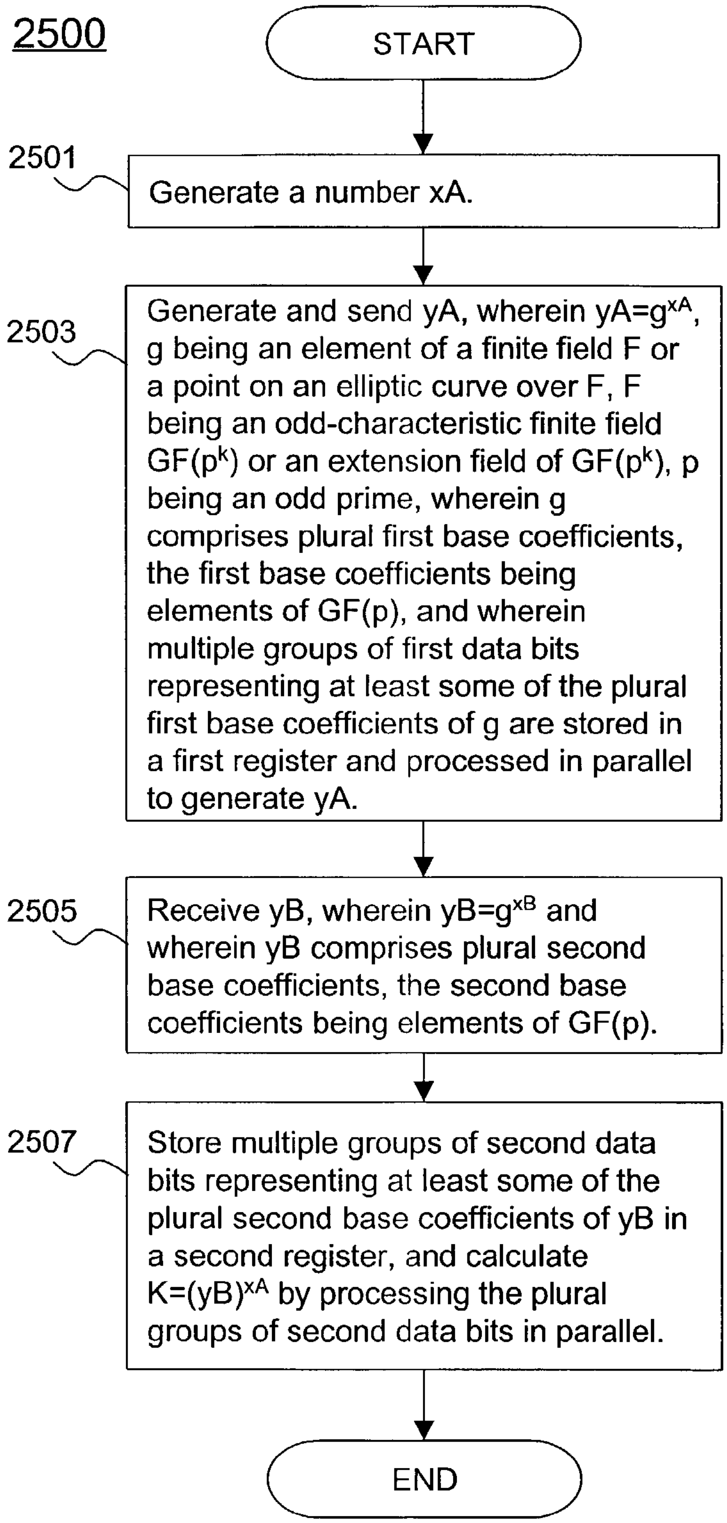
FIG. 25 is a flow diagram illustrating an exemplary method for carrying out key exchange according to the present invention.

Of course, previously described exemplary aspects of the invention including but not limited to the utilization of single or multiple guard bits, storing a portion of a field element or the entire field element in a single register (or storing a portion of or an entire quantity representing a point on an elliptic curve over F in a single register), the options of various functional forms of p, etc. are applicable to the exemplary method 2500 illustrated in FIG. 25.

In another aspect of the present invention, there is provided a method of public-key cryptography as another example of the cryptographic method 2450. An exemplary method of public-key cryptography 2600 according to the present invention will now be described with reference to FIGS. 24A and 26. The exemplary method 2600 corresponds to an adaptation of ElGamal public-key encryption and decryption modified according to the present invention. It will be understood that each cryptographic apparatus 2401 and 2403 illustrated in FIG. 24A can be implemented using a memory and a processing unit coupled to the memory, wherein each respective processing unit executes steps associated with the corresponding cryptographic apparatus.

In the exemplary method 2600, the second converser obtains a public key yA associated with a first converser, wherein $yA=g^{xA}$ and wherein xA is the first converser's private key (step 2601). For example, the second converser can receive a transmission comprising the first converser's public key and the quantity g, or the second converser can look-up the first converser's public key and the quantity g from a directory in which this information is published. The quantity g is an element of a finite field F or a point on an elliptic curve over F, wherein F is an odd-characteristic finite field $GF(p^k)$ or an extension field of $GF(p^k)$, p being an odd prime. The first and second conversers can agree in advance on a particular choice for F to be used and for whether an elliptic curve is to be used, or the first converser can publish this information in a directory along with the public key yA and the quantity g. The quantity yA comprises plural first base coefficients, and the quantity g comprises plural second base coefficients, the first and second base coefficients being elements of GF(p). The first converser can use the first cryptographic apparatus 2401 to generate the public key $yA=g^{xA}$. The first converser's private key xA can be a randomly or pseudorandomly generated integer as these terms are conventionally understood in the art and is not intended to be shared with other conversers. In this regard, the FFCU 2411 associated with the first converser can store multiple groups of data bits representing coefficients of g in a register and can process the multiple groups of data bits in parallel using the exponentiation operation referred to in equation 32 in conjunction with the single-guard-bit representation or the multiple-guard-bit representation to generate yA. As noted above, the first converser's public key yA can be published in a directory, but it is intended for the first converser to keep the quantity xA (the private key) secret.

The second converser generates a number r (e.g., using a random-number generator or psuedo-random-number generator that can be incorporated, for example, into the key source 2413) and calculates a pair of quantities $(u, v)=(g^r, f^{-1}(P)*(yA)^r)$ using the FFCU 2415 (e.g. a processing unit), wherein P represents a plaintext message of a set of plaintext messages, f is a mapping function that maps at least a portion of a vector space over F to the set of plaintext messages, and * denotes a suitable binary operation on the vector space over F (step 2603). Additional details relating to the mapping function f, the vector space over F and the operation * will be described below and with reference to FIG. 27 (which addresses the case where g is an element of F) and FIG. 28 (which addresses the case where g is a point on an elliptic curve over F).

The number r can be a randomly or pseudorandomly generated integer as these terms are conventionally understood in the art. The number r is not intended to be shared with other conversers, and, in this regard, can be considered a secret number. To calculate the quantity v, multiple groups of first data bits representing at least some of the plural first base coefficients of yA are stored in a first register and processed in parallel. The multiple groups of first data bits can be stored in the first register such that at least one first guard bit is positioned adjacent to the most significant bit of each group of first data bits, each group of first data bits being separated from an adjacent group of first data bits by a corresponding at least one first guard bit. In other words, either the single-guard-bit representation or the multiple-guard-bit representation can be used. An initial value of zero can be assigned to each first guard bit. Where, g is chosen to be an element of F, the exponentiation of yA can be carried according to equation 32 described previously. Where g is chosen to be a point on an elliptic curve over F, the exponentiations associated with $(yA)^r$ and $g^{xA}$ denote r-fold (or xA-fold) elliptic-curve point addition.

The first and second conversers agree in advance on the set of plaintext messages they will use in their communications. The function f is a mapping function that maps at least a portion of the vector space over F to the set of plaintext messages, and the first and second conversers agree on the mapping function f in advance. For example, the set of plaintext messages can comprise words, sentences and/or individual characters, and each plaintext message can be encoded as an integer.

The quantity g will generate a group over which cryptographic calculations are carried out, and the nature of the group depends upon the choice of g. In addition, it will be appreciated by those of ordinary skill in the art that the choice of g (and thus the group) also impacts the dimension of the vector space over F. Moreover, the nature of the group affects how exponentiation is carried out in step 2603 and affects the choice of the binary operation *. For example, the group generated by g can be the finite field F, in which case the vector space is the one-dimensional vector space corresponding to F, and the operation * is multiplication in F. Alternatively, the group generated by g can be a subgroup of the finite field F, in which case the vector space is also the one-dimensional vector space corresponding to F, and * is again multiplication in F. As another alternative, the group generated by g can be an elliptic-curve group over F, and the operation * can be elliptic-curve point addition or component-wise multiplication in F×F as will be discussed in greater detail with reference to FIG. 28. In this latter case, the vector space over F can be chosen according to two options. In the first option, the vector space over F can be the two dimensional vector space corresponding to F×F where "x" denotes the Cartesian product. In the second option, the vector space can be a three-dimensional vector space over F in which projective coordinates known to those of ordinary skill in the art are used in conjunction with the elliptic-curve group. To the extent that the group generated by g can be smaller than any of the above-noted vector spaces, it can be sufficient for f to map merely a portion of the vector space over F to the set of plaintext messages.

The quantity g should therefore be chosen such that the size of the group generated by g is equal to or larger than the set of plaintext messages. Moreover, it is assumed that the quantities g and yA, which are assumed to be publicly available, are chosen such that determining xA from yA and g would be computationally infeasible. Other considerations involving the relationship between security and the size of the group generated by g will be apparent to those of ordinary skill in the art in view of conventionally known attributes of ElGamal public-key cryptosystems, such as described, for example, in *Handbook of Applied Cryptography* referred to previously. For example, it is known to those of ordinary skill in the art how to choose the size of a group utilized in conventional ElGamal public-key cryptosystems. Alternatively, it is also known to those of ordinary skill in the art how to approximate the size of the group based on a given choice of the generator. These aspects are also applicable to the above-described method 2600 according to the present invention.

The mapping function f should be chosen such that each element of the group generated by g corresponds to a different plaintext message. In other words, the mapping function f can be uniquely invertible. Alternatively, if the group generated by g is larger than the set of plaintext messages, the mapping function f can be chosen such that more than one element of the group generated by p is associated with the same plaintext message. Where plaintext messages are encoded as integers, the mapping function f can be then chosen such that f is an almost injective mapping from the group generated by g to the set of integers {0, 1, 2, . . . , Q−1}, where Q≈|G| (|G| is the size of the group). For example, this can be essentially an identity mapping. Choosing a given mapping function f is within the purview of one of ordinary skill in the art in view of the above-described teachings.

The second converser then sends the pair of quantities (u, v) to the first converser over the insecure channel 2417 (step 2605). The pair of quantities (u, v) corresponds to an encrypted version of the plaintext message.

In addition, the calculation of the quantity u can be carried out by the second converser by storing multiple groups of second data bits representing at least some of the plural second base coefficients of g in a second register and by processing the multiple groups of second data bits in parallel. In this regard either the single-guard-bit representation or the multiple-guard-bit representation can be used. The calculation of $g^{xA}$ (to calculate u) can be carried out using exponentiation according to equation 32 or using xA-fold elliptic-curve point addition depending upon the choice for g. The quantities g, u and v can be elements of the finite field F, wherein F can be chosen as $GF(p^k)$ or as an extension field of $GF(p^k)$. Alternatively, the quantities g, u and v can be points on an elliptic curve over F.

The first converser can decrypt a received pair of quantities (u, v), thereby retrieving the plaintext message P, by computing $P=f(u^{-xA}*v)$ where $u^{-xA}*v=v/u^{xA}$ and wherein "/" denotes the inverse of the operation of * (step 2607). The quantity $u^{xA}$ can be computed by the first FFCU 2411 according to the exponentiation function of equation 32 or according to xA-fold elliptic-curve point addition as appropriate. This computation can be carried out using the single-guard-bit representation or multiple-guard-bit representation, such as described above with regard to key exchange. Only the first converser who knows xA is assumed to be able to decrypt this message. By implementing the above-described adaptation of ElGamal public-key cryptography using the single-guard-bit representation or multiple-guard-bit representation, the present invention offers increased computational efficiency compared to conventional approaches, which can either be manifested as increased speed compared to conventional approaches or increased security for the same computational effort.

Figure 26:
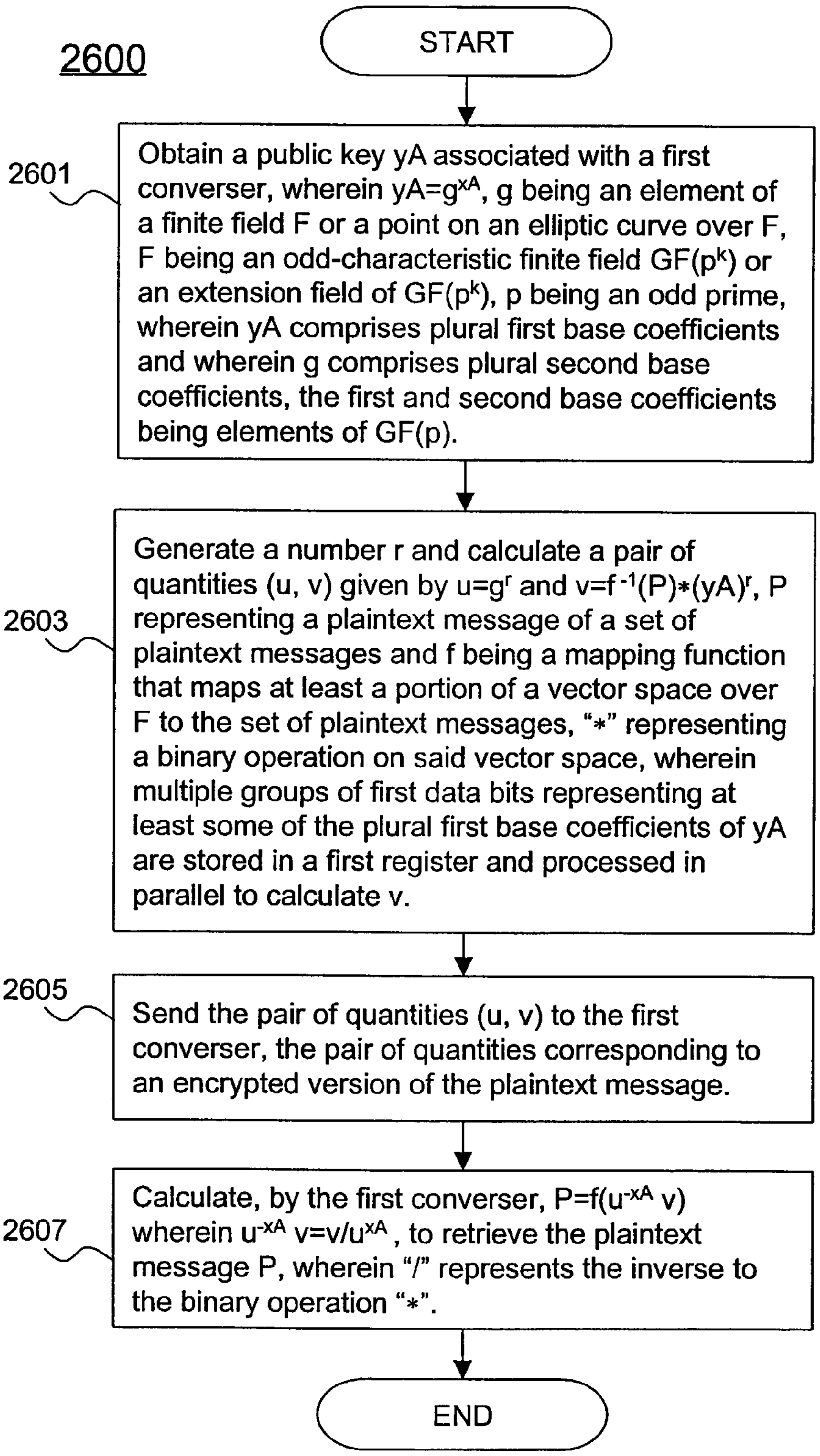
FIG. 26 is a flow diagram illustrating an exemplary method of public-key cryptography according to the present invention.

Of course, previously described exemplary aspects of the invention including but not limited to the utilization of single or multiple guard bits, storing a portion of a field element or the entire field element in a single register (or storing a portion of or an entire quantity representing a point on an elliptic curve over F in a single register), the options of various functional forms of p, etc. are applicable to the exemplary method 2600 illustrated in FIG. 26.

Exemplary implementations of the method 2600 will now be described with reference to FIG. 27 (which addresses the case where g is an element of F) and FIG. 28 (which addresses the case where g is a point on an elliptic curve over F).

Figure 27:
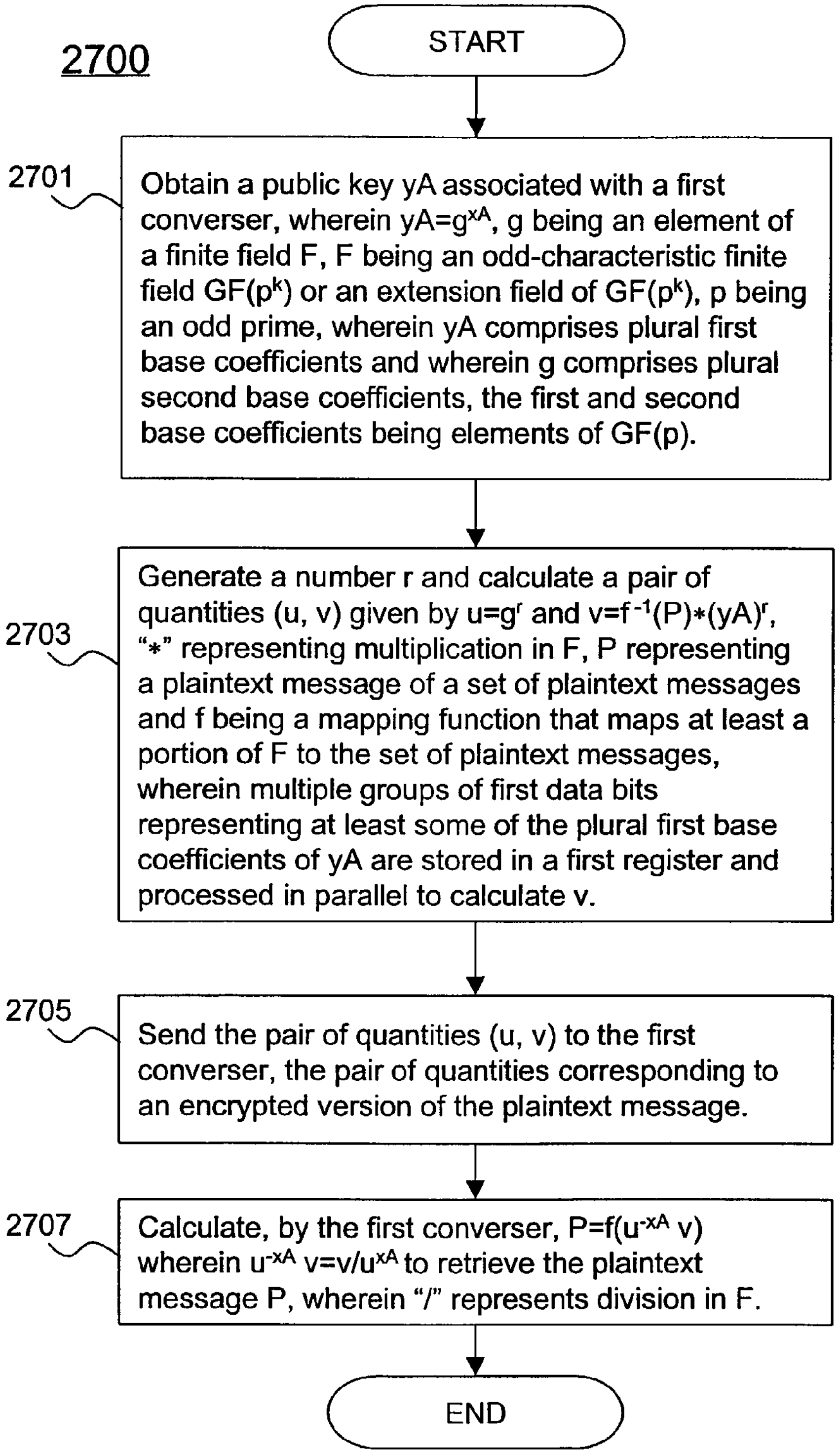
FIG. 27 is a flow diagram illustrating an exemplary method of public-key cryptography according to the present invention.

FIG. 27 is a flow diagram of an exemplary method of public-key cryptography 2700. In the exemplary method 2700, the second converser obtains a public key yA associated with a first converser, wherein $yA=g^{xA}$ and wherein xA is the first converser's private key (step 2701). For example, the second converser can receive a transmission comprising the first converser's public key and the quantity g, or the second converser can look-up the first converser's public key and the quantity g from a directory in which this information is published.

The quantity g is an element of a finite field F wherein F is an odd-characteristic finite field $GF(p^k)$ or an extension field of $GF(p^k)$, p being an odd prime. The first and second conversers can agree on particular choices for F to be used in advance, or the first converser can publish this information in a directory along with the public key and the quantity g. The quantity yA comprises plural first base coefficients, and the quantity g comprises plural second base coefficients, the first and second base coefficients being elements of GF(p). The first converser can use the first cryptographic apparatus 2401 to generate the public key $yA=g^{xA}$. The first converser's private key xA can be a randomly or pseudo-randomly generated integer as these terms are conventionally understood in the art and is not intended to be shared with other conversers. In this regard, the FFCU 2411 associated with the first converser can store multiple groups of data bits representing coefficients of g in a register and can process the multiple groups of data bits in parallel using the exponentiation operation referred to in equation 32 in conjunction with the single-guard-bit representation or the multiple-guard-bit representation to generate yA. As noted above, the first converser's public key yA can be published in a directory, but it is intended for the first converser to keep the quantity xA (the private key) secret.

The second converser generates a number r (e.g., using a random-number generator or psuedo-random-number generator that can be incorporated, for example, into the key source 2413) and calculates a pair of quantities $(u, v)=(g^r, f^{-1}(P)*(yA)^r)$ using the FFCU 2415 (e.g. a processing unit), wherein * denotes multiplication in F and wherein P represents a plaintext message of a set of plaintext messages (step 2703). The number r can be a randomly or pseudorandomly generated integer as these terms are conventionally understood in the art. The number r is not intended to be shared with other conversers, and, in this regard, can be considered a secret number. To calculate the quantity v, multiple groups of first data bits representing at least some of the plural first base coefficients of yA are stored in a first register and processed in parallel. The multiple groups of first data bits can be stored in the first register such that at least one first guard bit is positioned adjacent to the most significant bit of each group of first data bits, each group of first data bits being separated from an adjacent group of first data bits by a corresponding at least one first guard bit. In other words, either the single-guard-bit representation or the multiple-guard-bit representation can be used. An initial value of zero can be assigned to each at least one first guard bit. In addition, the exponentiation of yA can be carried according to equation 32 described previously.

The first and second conversers agree in advance on the set of plaintext messages they will use in their communications. The function f is a mapping function that maps at least a portion of F to the set of plaintext messages, and the first and second conversers agree on the mapping function f in advance. For example, the set of plaintext messages can comprise words, sentences and/or individual characters, and each plaintext message can be encoded as an integer. The quantity g will generate a group over which cryptographic calculations are carried out. This group can be the multiplicative group of the finite field F, or a subgroup of that multiplicative group, depending upon the choice of g. To the extent that the group generated by g can be smaller than F, it can be sufficient for f to map merely a portion of F to the set of plaintext messages.

The quantity g should therefore be chosen such that the size of the group generated by g is equal to or larger than the set of plaintext messages. Moreover, it is assumed that the quantities g and yA, which are assumed to be publicly available, are chosen such that determining xA from yA and g would be computationally infeasible. Other considerations involving the relationship between security and the size of the group generated by g will be apparent to those of ordinary skill in the art in view of conventionally known attributes of ElGamal public-key cryptosystems, such as described, for example, in *Handbook of Applied Cryptography* referred to previously. For example, it is known to those of ordinary skill in the art how to choose the size of a group utilized in conventional ElGamal public-key cryptosystems. Alternatively, it is also known to those of ordinary skill in the art how to approximate the size of the group based on a given choice of the generator. These aspects are also applicable to the above-described method 2600 according to the present invention.

The mapping function f should be chosen such that each element of the group generated by g corresponds to a different plaintext message. In other words, the mapping function f can be uniquely invertible. Alternatively, if the group generated by g is larger than the set of plaintext messages, the mapping function f can be chosen such that more than one element of the group generated by p is associated with the same plaintext message. Where plaintext messages are encoded as integers, the mapping function f can be then chosen such that f is an almost injective mapping from the group generated by g to the set of integers {0, 1, 2, . . . , Q−1}, where $Q \approx |G|$ (|G| is the size of the group). For example, this can be essentially an identity mapping. Choosing a given mapping function f is within the purview of one of ordinary skill in the art in view of the above-described teachings.

The second converser then sends the pair of quantities (u, v) to the first converser over the insecure channel 2417 (step 2705). The pair of quantities (u, v) corresponds to an encrypted version of the plaintext message.

In addition, the calculation of the quantity u can be carried out by the second converser by storing multiple groups of second data bits representing at least some of the plural second base coefficients of g in a second register and by processing the multiple groups of second data bits in parallel. In this regard either the single-guard-bit representation or the multiple-guard-bit representation can be used, and the exponentiation of g (to calculate u) can be carried out using equation 32 described previously. The quantities g, u and v can be elements of the finite field F, wherein F can be chosen as $GF(p^k)$ or as an extension field of $GF(p^k)$.

The first converser can decrypt a received pair of quantities (u, v), thereby retrieving the plaintext message P, by computing $P=f(u^{-xA}*v)$ where $u^{-xA}*v=v/u^{xA}$ and wherein "/" denotes division in F (step 2707). Carrying out division in F is within the purview of those of ordinary skill in the art and requires no further discussion. The quantity $u^{xA}$ can be computed by the first FFCU 2411 by applying the exponentiation function of equation 32 using the single-guard-bit representation or multiple-guard-bit representation, such as described above with regard to key exchange. Only the first converser who knows xA is assumed to be able to decrypt this message. By implementing the above-described adaptation of ElGamal public-key cryptography over a group defined over $GF(p^k)$, or the field itself, using the single-guard-bit representation or multiple-guard-bit representation, the present invention offers increased computational efficiency compared to conventional approaches, which can either be manifested as increased speed compared to conventional approaches or increased security for the same computational effort.

Of course, previously described exemplary aspects of the invention including but not limited to the utilization of single or multiple guard bits, storing a portion of a field element or the entire field element in a single register (or storing a portion of or an entire quantity representing a point on an elliptic curve over $GF(p^k)$ in a single register), the options of various functional forms of p, etc. are applicable to the exemplary method 2700 illustrated in FIG. 27.

The above-described public-key cryptography method 2700 can also be modified according to the present invention for implementation using elliptic curves over F where F is as above. An exemplary method 2800 of public-key cryptography and will now be described with reference to FIG. 28. In fact, the treatment is completely analogous to that described with regard to FIG. 27, and the discussion here will be abbreviated, describing mainly the differences that need to be considered. We assume the first and second converser have agreed on an elliptic curve group, or, that a description of the group to be used is transmitted between the conversers. This can, for instance, be done as a preamble to actual messages. Step 2801 is completely analogous to step 2701 described previously, except that in the method 2800, g is a point on an elliptic curve over F. Thus, in the exemplary method 2800, the second converser obtains a public key yA associated with a first converser, wherein $yA=g^{xA}$ and wherein xA is the first converser's private key (step 2801). The quantity g is a point on an elliptic curve over the finite field F wherein F is an odd-characteristic finite field $GF(p^k)$ or an extension field of $GF(p^k)$, p being an odd prime. The quantity yA comprises plural first base coefficients, and the quantity g comprises plural second base coefficients, the first and second base coefficients being elements of GF(p).

The second converser generates a number r (e.g., using a random-number generator or psuedo-random-number generator that can be incorporated, for example, into the key source 2413) and calculates a pair of quantities $(u, v)=(g^r, f^{-1}(P)*(yA)^r)$ using the FFCU 2415 (e.g. a processing unit), wherein P represents a plaintext message of a set of plaintext messages, wherein * is elliptic-curve point addition or component-wise multiplication in F×F, and wherein r can be generated as described above (step 2803). The function f is a mapping function that maps at least a portion of F×F to the set of plaintext messages, wherein multiple groups of first data bits representing at least some of the plural first data base coefficients of yA are stored in a first register and processed in parallel to calculate v. Additional aspects relating to the calculation of u and v will be described below.

As noted at step 2805, the second converser then sends the pair of quantities (u, v) to the first converser, the pair of quantities corresponding to an encrypted version of the plaintext message. As noted at step 2807, the first converser can then can decrypt a received pair of quantities (u, v), thereby retrieving the plaintext message P, by computing $P=f(u^{-xA}*v)$ where $u^{-xA}*v=v/u^{xA}$ and wherein "/" denotes the inverse of the operation * (step 2807). Additional details relating to the operation "/" will be described below. The quantity $u^{xA}$ can be computed by the first FFCU 2411 by applying the exponentiation function in equation 32 using the single-guard-bit representation or multiple-guard-bit representation, such as described above with regard to key exchange. Only the first converser who knows xA is assumed to be able to decrypt this message. By implementing the above-described adaptation of ElGamal public-key cryptography over an elliptic curve over F using the single-guard-bit representation or multiple-guard-bit representation, the present invention offers increased computational efficiency compared to conventional approaches, which can either be manifested as increased speed compared to conventional approaches or increased security for the same computational effort.

Additional aspects relating to calculation of the pair of quantities u and v by the first converser and relating to retrieving a plaintext message P from the pair of quantities u and v by the first converser will now be described. From a notational point of view, such as already mentioned in connection to equation 49, the exponentiations associated with $(yA)^r$, $g^r$, etc., now denote r-fold (or xA-fold) elliptic curve point addition. Computing the quantity u is thus completely analogous to the approach set forth with regard to FIG. 27, and u will now be an elliptic curve point. For v, two cases can be considered for the operation * and the mapping function f, as will now be described. In either of the two cases, the second converser needs to compute a value of the form $f^{-1}(P)*(yA)^r$, where $(yA)^r$ is now a point on the elliptic curve, i.e. an (x, y)-coordinate pair in F×F, where × denotes Cartesian product, i.e. pairs of elements from F. Thus, $f^{-1}$ needs to produce a value that can be composed with this two-dimensional value. In the first case that f can be chosen so that $f^{-1}$ is guaranteed to be a point on the elliptic curve, * can simply be the usual elliptic curve point addition operation. For the first converser in this case, the "/" operation is point subtraction-(the inverse of addition, which is well-known to those of ordinary skill in the art). For the first case, the f mapping can be done in several ways, an example of which is as follows. We can assume that the plaintext message space consists of binary strings of length smaller than lk $\log_2(p)$, where l, k, p are the values defining the field F. Note that this can be assumed without loss of generality, since we can cut a message of longer size into smaller blocks, satisfying this length constraint, and can process each block individually. We can also interpret P in the natural way as a set of base coefficients of the field F. Note that P does not uniquely determine the element associated with this set of base coefficients, since some bits are left unspecified. (The actual position of the unspecified bits can be agreed upon in advance or communicated between the conversers.) We can assign a random value, R, to the unspecified bits, and obtain a value x=x(P, R) in F. This x value is evaluated as the right-hand side of equation 48. As is well-known to those of ordinary skill in the art, the probability that there exists a left-hand y-value satisfying the equality of equation 48 is one half, and if so, finding a matching y-value can be done with well-known methods. If no matching y-value exists, we repeat the process with a new random R, etc. The probability that the process would repeatedly fail for a large number of consecutive attempts is small. The above approach describes how $f^{-1}$ can be computed by the second converser. The first converser computes f by simply discarding the y-coordinate of the elliptic curve point, and also by discarding the bit-positions corresponding to the randomly chosen R-bits.

The above-described procedure merely serves as an example how to embed messages as elliptic curve points, other approaches to defining f are possible. With regard to such approaches, it can be slightly complicated in general to assure that the mapping always produces points on the elliptic curve, satisfying equation 48. This concludes the discussion relating to the first exemplary case for choices of the mapping function f and the operation "*" associated with steps 2803 and 2807.

In the second exemplary case for choices of the mapping function f and the operation "*", it is not required to carry out the calculations in steps 2803 and 2807 to produce points on an elliptic curve. Thus, approaches involving the second case described here may be more attractive. We now describe one exemplary approach for the second case. In the second case, one chooses f to be a mapping that maps at least a fraction of arbitrary values in F×F to the plaintext space. That is, we produce more or less arbitrary (x, y) coordinate pairs, not necessarily satisfying 48. This is done so that unique decryption is almost always guaranteed (thus, the field F in general needs to be at least as large as the square root of the size of the plaintext space). Finding such f is easy and well-known to those of ordinary skill in the art. For instance, interpreting P as a set of base coefficients, encoded as binary strings, f can be essentially the identity mapping. In the second case, the combination operation * is defined to simply be coordinate-wise multiplication in F, i.e. (a, b)*(x, y)=(ax, by). For the second converser (the receiver in this exemplary description), the operation "/" is correspondingly defined as coordinate-wise division in F (the inverse operation of "*"). The approach of using coordinate-wise multiplication and division rather elliptic curve operations is known in the literature as the Menezes-Vanstone method and can be applied to the present invention as described above.

In both of the above-described approaches associated with the two cases for choices of the mapping function f, parallel processing multiple groups of data bits representing base coefficients takes place as described before.

Figure 28:
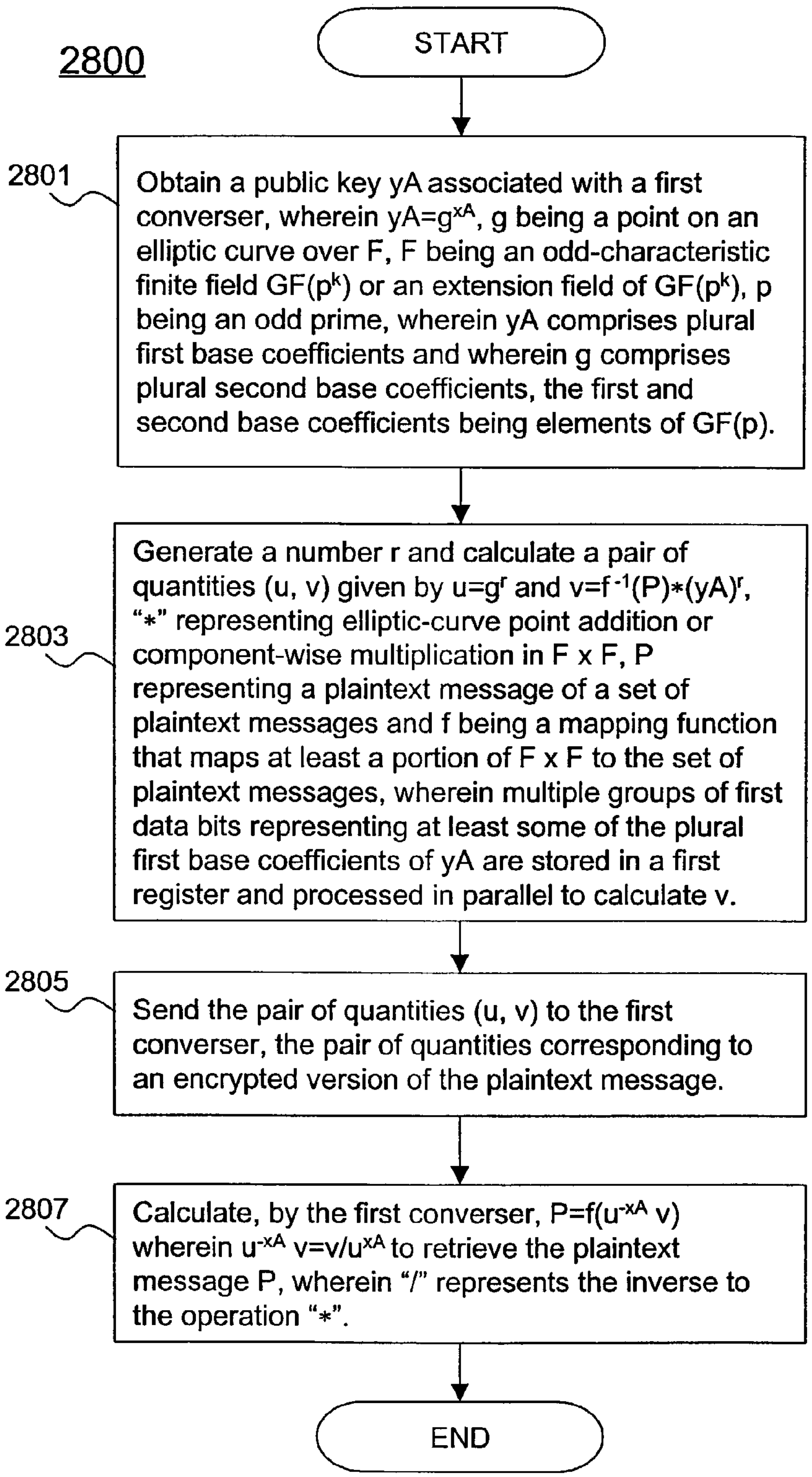
FIG. 28 is a flow diagram illustrating an exemplary method of public-key cryptography according to the present invention.

Observe that in all of the three above-described approaches according to the present invention relating to FIGS. 27 and 28 (modified ElGamal over F, modified ElGamal over an elliptic curve E over F with plaintext embedding in E, and modified ElGamal over an elliptic curve E over F without plaintext embedding in E), the function f can be viewed as mapping at least a portion of a one-dimensional vector space (that is, F) or two-dimensional vector space over F (e.g., F×F) to the set of plaintext messages.

In another exemplary aspect, the method 2800 can be modified such that instead of mapping at least a portion of a two-dimensional vector space over F (that is, F×F) to the set of plaintext messages, the mapping function f can be chosen such that f maps at least a portion of a three-dimensional vector space over F to the set of plaintext messages. In this aspect, projective coordinates in a three dimensional vector space are used in conjunction with an elliptic curve approach. Other aspects of the approach remain the same as those set forth in FIG. 28 for the exemplary method 2800. Projective coordinates are known to those of ordinary skill in the art, and no further discussion of modifying the method 2800 according to this aspect is necessary.

In another aspect of the present invention, encryption, decryption and/or authentication can be implemented using a secure key chosen by one of the conversers and exchanged over a secure channel, such as the secure channel 2421 illustrated in FIG. 24A. For example, either the first converser or the second converser can generate a secure key using the first key source 2409 or the second key source 2413. Such a secure key can then be exchanged over the secure channel 2421 (e.g., using a courier). Encryption and decryption can then be carried out using the FFCUs 2411 and 2415 illustrated in FIG. 24A. In this regard, the cryptographic algorithm referred to in FIG. 24B can be any suitable encryption algorithm that can be implemented in accordance with method 2450, and encrypted information can be thereby transmitted over the insecure channel 2417. As another example, information can be encrypted using any conventional encryption algorithm, and the cryptographic algorithm referred to in FIG. 24B can be any suitable authentication algorithm that can be based upon the secure key exchanged over the secure channel 2421 and that can be implemented in accordance with method 2450. Implementing a suitable authentication algorithm in accordance with method 2450 is within the purview of one of ordinary skill in the art in view of the teachings provided herein.

In another aspect of the present invention, a variant of ElGamal public-key cryptography can be implemented using the present inventive approaches over a finite field F, where F is the finite field $GF(p^k)$ or an extension field of $GF(p^k)$ (p being an odd prime) to provide digital signatures using the cryptographic system 2400 illustrated in FIG. 24A. For example, such a variant based upon the basic DSA (Digital Signature Algorithm) will now be described. Other variants exist as well.

Once again, a group defined over F, a quantity g (e.g., an element of F or a point on an elliptic curve over F), and a mapping function f are agreed upon by first and second conversers, such as described above with regard to the exemplary implementation of ElGamal public-key cryptography over $GF(p^k)$ according to the present invention in FIG. 26. In addition, the first converser generates a private key xA and a public key yA as described above. To sign a message P (e.g., plaintext or ciphertext encoded as an integer), the first converser can proceed as follows. The first converser generates a number r (e.g., a randomly or pseudorandomly generated integer) using, for example, a random number generator or a pseudorandom number generator that can be incorporated, for example, into the key source 2409, and computes $a=g^r$ using the first FFCU 2411 by applying the exponentiation function 32 in conjunction with either the single-guard-bit representation or multiple-guard-bit representation. The number r is not intended to be shared with other conversers, and, in this regard, can be considered a secret number. The first converser then computes a solution to the equation $$P=-xA*f(a)+r*b(\mathrm{mod}|G|) \tag{50}$$

where * is ordinary multiplication to find a quantity b that satisfies equation 50. Only the first converser, knowing xA, is assumed to be able to do this. The signature to the message P is then defined as the pair (a, b).

The first converser can then sign the plaintext message P using the first FFCU 2411 by applying one of the cryptographic approaches described above, thereby generating the signature, (a, b), and sends P and the pair (a, b) to the second converser over the insecure channel 2417.

To verify that the pair (a, b) represents a valid signature on P of the first converser, the second converser computes the following quantities u and v $$u=P*b^{-1}(\mathrm{mod}|G|) \tag{51}$$

$$v=f(a)*b^{-1}(\mathrm{mod}|G|) \tag{52}$$

where $b^{-1}$ is the multiplicative inverse of b and * represents multiplication (conventional multiplication). The second converser then computes $g^u(yA)^v$ using the second FFCU 2415 by applying the exponentiation function 32 in conjunction with the inventive approaches for storing plural groups of first data bits representing coefficients of yA in a first register, storing plural groups of second data bits representing coefficients of a representation of g in a second register, processing the plural groups of first data bits in parallel, and processing the plural groups of second data bits in parallel. The second converser accepts the signature as valid if, and only if, $g^u(yA)^v=a$. Accordingly, computational approaches involving the field $GF(p^k)$ according to the present invention can be applied to digital signatures, and the corresponding computations can be executed in a manner much faster than conventional approaches involving $GF(p^k)$ or in a manner that provides significantly greater security against forged signatures for the same computational effort.

Using elliptic curves over F according to the present invention is also a possible setting for digital signatures. In the case of elliptic-curves, the differences that need to be considered in comparison to the above-described implementation of digital signatures are completely analogous to the differences in implementation of public-key cryptography where g is an element of a finite field F (FIG. 27) and where g is a point on an elliptic curve over F (FIG. 28). Accordingly, no further discussion of using elliptic curves in conjunction with digital signatures according to the present invention is necessary.

In another aspect of the invention, a pseudorandom number generator can be provided that carries out computations in the field $GF(p^t)$ (p being an odd prime number) using computational approaches previously described herein. A pseudorandom number generator deterministically expands short random seeds to longer strings that appear to be random. Many conventional constructions are known to those of ordinary skill in the art, and such constructions can be based on finite fields and elliptic curves, for example. The inventive computational approaches described herein can be applied to such constructions.

For example, let $F=GF(p^n)$ be a finite field, defined as an extension field of $GF(p^t)$ for some t=n/w where w is an integer. Let g be an field element of F that generates a sufficiently large subgroup of F's multiplicative group. In addition, let f be a function as described above with regard to the application of the present inventive approaches to ElGamal public-key cryptography. Finally, let Tr be trace-mapping well known to those of ordinary skill in the art, which maps elements of F to elements of $GF(p^t)$ in accordance with the following equation $$Tr(x)=x+x^{p^t}+x^{p^{2t}}+\ldots+x^{p^{n-1}} \tag{53}$$

for any x in F. Finally, define the function I(x) as $I(x)=g^x$.

Upon input of a random seed s (as a binary encoded integer), the generator is now defined as follows. Let $x_0=I(s)$, and let $x_{i+1}=I(f(x_1))$ for i=0, 1, 2, . . . , T. In principle T can be taken to be very large, e.g. of magnitude comparable to square root of the field size, though a smaller T will give higher security. In addition, define the output of the pseudorandom number generator to be the concatenation of $Tr(x_0)$, $Tr(x_1)$, $Tr(x_2)$, . . . . This approach provides an output consisting of pseudorandom elements of $GF(p^t)$. If a binary string is desired as output, a suitable conversion function is applied to the outputs. Under the assumption that the discrete logarithm problem in the group is intractable (i.e., computationally infeasible), the above-described pseudorandom number generator will be secure. As indicated above, the pseudorandom number generator utilizes various operations in $GF(p^t)$, including addition, multiplication and exponentiation, and the previously described inventive approaches based upon either the single-guard-bit representation or the multiple-guard-bit representation can be used to efficiently carry out the necessary computations.

The embodiments described herein are merely illustrative and should not be considered restrictive in any way. The scope of the invention is given by the appended claims, rather than the preceding description, and all variations and equivalents which fall within the range of the claims are intended to be embraced therein.

What is claimed is:

1. An error-correction apparatus for carrying out arithmetic and logical operations, the apparatus comprising:

means for data input to, and data output from a general purpose processing unit, the processing unit for executing a plurality of processing operations on binary data stored in a single, hardware register, wherein the processing operations always operate on all bits of the single, hardware register simultaneously, the binary data comprising multiple coefficients of a field element of an odd-characteristic finite field GF($p^k$), the field element comprising:

k coefficients in a polynomial basis representation and k groups of binary data bits, each group of binary data bits comprising a corresponding one of the k coefficients, wherein k is greater than 1; and wherein the binary data is processed such that the k groups of binary data bits corresponding to the k coefficients are processed by parallel operations, each parallel operation being performed over a number of clock cycles independent of k during the plurality of operations, wherein at least one of the parallel operations is a finite field addition or multiplication of two arbitrary elements of GF ($p^k$) and the single, hardware register is arranged such that each parallel operation treats the k coefficients independently, wherein the field element is stored in the single, hardware register utilizing a single guard bit between each group of binary data bits to avoid carry bit problems wherein the single, hardware register is a w-bit register where w is greater than or equal to k(m+1) and m is the logarithm to base 2 of p, rounded up to the nearest integer.

2. The error-correction apparatus of claim 1, further comprising means for loading each element of the finite field into the single, hardware register.

3. The error-correction apparatus of claim 1, wherein the processing unit comprises a plurality of hardware registers.

4. The error-correction apparatus of claim 1, wherein the processing unit is a general purpose w-bit arithmetic logic unit (ALU) and is adapted to process the k groups of binary data bits according to one or more operations including a shift operation, an addition operation, a subtraction operation, and a logical AND operation.

5. The error-correction apparatus of claim 1, wherein binary data comprising a field element is initially stored in two single, hardware registers, and operations are carried out such that a right shift by m bits over all the binary data can be carried out by coordinating the two registers such that the least significant bit in one of the two registers is shifted to the most-significant-bit side of the other of the two registers.

6. The error-correction apparatus of claim 1, wherein the k groups of data bits are stored in the single, hardware register such that at least one guard bit is inserted adjacent to the most significant bit of each group of data bits, each group of data bits being separated from an adjacent group of data bits by a corresponding at least one guard bit.

7. The error-correction apparatus of claim 6, wherein an initial value of zero is assigned to each at least one guard bit.

8. The error-correction apparatus of claim 6, wherein one guard bit is positioned adjacent to the most significant bit of each group of data bits.

9. The error-correction apparatus of claim 6, wherein multiple guard bits are positioned adjacent to the most significant bit of each group of data bits.

10. The error-correction apparatus of claim 6, further comprising:

means for calculating a syndrome utilizing a segment of the binary data which comprises k groups of data bits, wherein a field element of the finite field GF($p^k$), p being an odd prime number, the field element comprising k coefficients in accordance with a polynomial basis representation, each one of the k groups of data bits of the segment representing a corresponding one of the k coefficients, wherein said segment is stored in a first register and is processed such that the k groups of data bits of the segment are processed in parallel, determining whether the syndrome is equal to zero, and detecting and correcting errors in the binary data if the syndrome is not equal to zero.

11. A method for carrying out arithmetic and logical operations in an error correction apparatus, the method comprising the steps of:

inputting data to, and outputting data from a general purpose processing unit having a single, hardware register;

executing a plurality of processing operations on binary data stored in the single, hardware register, wherein processing operations always operate on all 32 bits of the hardware register simultaneously, the binary data comprising multiple coefficients of a field element of an odd-characteristic finite field GF($p^k$), the field element comprising;

k coefficients in a polynomial basis representation and k groups of binary data bits, each group of binary data bits comprising a corresponding one of the k coefficients, wherein k is greater than 1; wherein the binary data is processed such that the k groups of binary data bits corresponding to the k coefficients are processed are processed by parallel operations, each parallel operation being performed over a number of clock cycles independent of k during the plurality of operations, wherein at least one of the parallel operations is a finite field addition or multiplication of two arbitrary elements of GF ($p^k$) and the hardware register is arranged such that each parallel operation treats the k coefficients independently; and storing the field element in the single, hardware register utilizing a single guard bit between each group of binary data bits to avoid carry bit problems, wherein the single hardware register is a w-bit register and w is greater than or equal to k(m+1) where m is the logarithm to base 2 of p, rounded up to the nearest integer.

12. The method of claim 11, further comprising the step of loading each element of the finite field into the single, hardware register.

13. The method of claim 11, wherein the processing unit comprises a plurality of hardware registers.

14. The method of claim 11, wherein the processing unit is a general purpose w-bit arithmetic logic unit (ALU) and is adapted for processing the k groups of binary data bits according to one or more operations including a shift operation, an addition operation, a subtraction operation, and a logical AND operation.

15. The method of claim 11, further comprising the steps of:

storing the binary data comprising a field element in two single, hardware registers, and carrying out operations by coordinating a right shift by m bits over all the binary data such that the least significant bit in one of the two registers is shifted to the most-significant-bit side of the other of the two registers.

16. The method of claim 11, further comprising the step of storing the k groups of data bits in the single, hardware register such that at least one guard bit is inserted adjacent to the most significant bit of each group of data bits, each group of data bits being separated from an adjacent group of data bits by a corresponding at least one guard bit.

17. The method of claim 16, further comprising the step of assigning an initial value of zero to each at least one guard bit.

18. The method of claim 16, wherein the at least one guard bit is positioned adjacent to the most significant bit of each group of data bits.

19. The method of claim 16, wherein multiple guard bits are positioned adjacent to the most significant bit of each group of data bits.

20. The method of claim 16, further comprising the steps of:

calculating a syndrome utilizing a segment of the binary data which comprises k groups of data bits, wherein a field element of the finite field $GF(p^k)$, p being an odd prime number, the field element comprising k coefficients in accordance with a polynomial basis representation, each one of the k groups of data bits of the segment representing a corresponding one of the k coefficients, wherein said segment is stored in a first register and is processed such that the k groups of data bits of the segment are processed in parallel, determining whether the syndrome is equal to zero, and detecting and correcting errors in the binary data if the syndrome is not equal to zero.

21. Computer instructions stored in memory for carrying out arithmetic and logical operations, comprising:

instructions within the computer readable medium for inputting data input to, and outputting data from a single general purpose processing unit;

instructions within the computer readable medium for executing a plurality of processing operations on binary data stored in a single, hardware register, wherein the processing operations are executed on all bits of the hardware register simultaneously, the binary data comprising multiple coefficients of a field element of an odd-characteristic finite field $GF(p^k)$, the field element comprising;

k coefficients in a polynomial basis representation and k groups of binary data bits, each group of binary data bits comprising a corresponding one of the k coefficients, wherein k is greater than 1; wherein the binary data is processed such that the k groups of binary data bits corresponding to the k coefficients are processed are processed by parallel operations, each parallel operation being performed over a number of clock cycles independent of k during the plurality of operations, wherein at least one of the parallel operations is a finite field addition or multiplication of two arbitrary elements of GF $(p^k)$ and the hardware register is arranged such that each parallel operation treats the k coefficients independently, and instructions within the computer readable medium for storing the field element in the single, hardware register utilizing a single guard bit between each group of binary data bits to avoid carry bit problems, wherein the single hardware register is a w-bit register and w is greater than or equal to k(m+1) where m is the logarithm to base 2 of p, rounded up to the nearest integer.

22. The computer instructions of claim 21, further comprising instructions within the computer readable medium for loading each element of the finite field into the single, hardware register.

23. The computer instructions of claim 21, wherein the processing unit comprises a plurality of hardware registers.

24. The computer instructions of claim 21, wherein the processing unit is a general purpose w-bit arithmetic logic unit (ALU) and is adapted for processing the k groups of binary data bits according to one or more operations including a shift operation, an addition operation, a subtraction operation, and a logical AND operation.

25. The computer instructions of claim 21, further comprising:

instructions within the computer readable medium for storing the binary data comprising a field element in two hardware registers, and carrying out operations by coordinating a right shift by m bits over all the binary data such that the least significant bit in one of the two registers is shifted to the most-significant-bit side of the other of the two registers.

26. The computer instructions of claim 21, further comprising instructions within the computer readable medium for storing the k groups of data bits in the single, hardware register such that at least one guard bit is inserted adjacent to the most significant bit of each group of data bits, each group of data bits being separated from an adjacent group of data bits by a corresponding at least one guard bit.

27. The computer instructions of claim 26, further comprising assigning an initial value of zero to each at least one guard bit.

28. The computer instructions of claim 26, further comprising instructions within the computer readable medium for positioning the at least one guard bit adjacent to the most significant bit of each group of data bits.

29. The computer instructions of claim 26, further comprising instructions within the computer readable medium for positioning multiple guard bits adjacent to the most significant bit of each group of data bits.

30. The computer instructions of claim 21, further comprising:

instructions within the computer readable medium for calculating a syndrome utilizing a segment of the binary data which comprises k groups of data bits, wherein a field element of the finite field $GF(p^k)$, p being an odd prime number, the field element comprising k coefficients in accordance with a polynomial basis representation, each one of the k groups of data bits of the segment representing a corresponding one of the k coefficients, wherein said segment is stored in a first register and is processed such that the k groups of data bits of the segment are processed in parallel, instructions within the computer readable medium for determining whether the syndrome is equal to zero, and instructions within the computer readable medium for detecting and correcting errors in the binary data if the syndrome is not equal to zero.

* * * * *

UNITED STATES PATENT AND TRADEMARK OFFICE

CERTIFICATE OF CORRECTION

PATENT NO. : 7,243,292 B1
APPLICATION NO. : 10/271945
DATED : July 10, 2007
INVENTOR(S) : Naslund et al.

It is certified that error appears in the above-identified patent and that said Letters Patent is hereby corrected as shown below:

On the Title Page, in Field (54), in "Title", in Column 1, Line 2, delete "CHARACTERISTICS" and insert -- CHARACTERISTIC --, therefor.

In Column 1, Line 2, delete "CHARACTERISTICS" and insert -- CHARACTERISTIC --, therefor.

In Column 2, Line 35, delete "$\gamma_J$" and insert -- $\gamma_j$ --, therefor.

In Column 2, Line 38, Equation (3), delete "$\gamma_J=\gamma_{k-1,J}u^{k-1}+\cdots+\gamma_{1,j}u+\gamma_{0,j}$" and insert -- $\gamma_j=\gamma_{k-1,j}u^{k-1}+\cdots+\gamma_{1,j}u+\gamma_{0,j}$ --, therefor.

In Column 3, Line 1, delete "$\delta_{i=}\Sigma_j\alpha_j\beta_{i-J}$" and insert -- $\delta_{i=}\Sigma_j\alpha_j\beta_{i-j}$ --, therefor.

In Column 4, Line 45, delete "$\alpha_1+\beta_1$" and insert -- $\alpha_i+\beta_i$ --, therefor.

In Column 4, Line 61, delete "$\alpha_J$" and insert -- $\alpha_j$ --, therefor.

In Column 4, Line 63, Equation (9), delete "ANTILOG{DLOG{$\alpha_J$}}=$\alpha_j$" and insert -- ANTILOG{DLOG{$\alpha_j$}}=$\alpha_j$ --, therefor.

In Column 5, Line 11, Equation (12), delete "$\alpha_J\,\beta_{i-J}$=ANTILOG{DLOG{$\alpha_j$}+ DLOG{$\beta_{i-j}$}" and insert -- $\alpha_j\,\beta_{i-j}$=ANTILOG{DLOG{$\alpha_j$}+DLOG{$\beta_{i-j}$} --, therefor.

In Column 10, Line 9, delete "$\alpha(=\Sigma_i\beta_i x^{i}$" and insert -- $\alpha(=\Sigma_i\alpha_i x^i$ --, therefor.

In Column 10, Line 10, delete "$\beta(=\Sigma_i\beta_i x^1, \beta_1$" and insert -- $\beta(=\Sigma_i\beta_i x^i, \beta_i$ --, therefor.

In Column 10, Line 15, delete "$\beta_J$" and insert -- $\beta_j$ --, therefor.

In Column 10, Line 19, before "to" delete "GF($p^k$)" and insert -- GF($p^{lk}$) --, therefor.

In Column 10, Line 23, delete "$\delta_1$=GF_p_k_ADD($\alpha_1$, $\beta_i$)" and insert -- $\delta_i$=GF_p_k_ADD($\alpha_i$, $\beta_i$) --, therefor.

In Column 10, Line 41, delete "$\delta_1=0$" and insert -- $\delta_i=0$ --, therefor.

In Column 10, Line 43, delete "$\delta_1$=GF_p_k_ADD($\delta_i$, GF_p_k_MUL($\alpha_j$, $\beta_{1-j}$))" and insert -- $\delta_i$=GF_p_k_ADD($\delta_i$, GF_p_k_MUL($\alpha_j$, $\beta_{i-j}$)) --, therefor.

UNITED STATES PATENT AND TRADEMARK OFFICE
CERTIFICATE OF CORRECTION

PATENT NO. : 7,243,292 B1
APPLICATION NO. : 10/271945
DATED : July 10, 2007
INVENTOR(S) : Naslund et al.

It is certified that error appears in the above-identified patent and that said Letters Patent is hereby corrected as shown below:

In Column 11, Line 12, delete "$\delta_{i\text{-}l}=GF\_p\_k\_SUB(\delta_{1\text{-}l}$" and insert
-- $\delta_{i\text{-}l}=GF\_p\_k\_SUB(\delta_{i\text{-}l}$ --, therefor.

In Column 11, Line 13, delete "$\delta_{i\text{-}l+J}=GF\_p\_k\_SUB(\delta_{1\text{-}l+j}$" and insert
-- $\delta_{i\text{-}l+j}=GF\_p\_k\_SUB(\delta_{i\text{-}l+j}$ --, therefor.

In Column 13, Line 38, delete "$\alpha_1=$" and insert -- $\alpha_i=$ --, therefor.

In Column 13, Line 42, delete "a9,i ,..., a1,i, a0,i" and insert -- $\alpha_{9,i}$, ..., $\alpha_{1,i}$, $\alpha_{0,i}$ --, therefor.

In Column 13, Line 44, delete "aj,i" and insert -- $\alpha_{j,i}$ --, therefor.

In Column 13, Line 45, delete "aj,i£3<22)" and insert -- $\alpha_{j,i} \leq 3<2^2)$ --, therefor.

In Column 13, Line 46, delete "a0,i" and insert -- $\alpha_{0,i}$ --, therefor.

In Column 13, Line 47, delete "a1,i" and insert -- $\alpha_{1,i}$ --, therefor.

In Column 14, Line 22, delete "ai=(a4,i,..., a1,i, a0,i)" and insert
-- $\alpha_i=(\alpha_{4,i}, ..., \alpha_{1,i}, \alpha_{0,i})$ --, therefor.

In Column 14, Line 26, delete "a4,i, a1,i, a0,i" and insert -- $\alpha_{4,i}$, ..., $\alpha_{1,i}$, $\alpha_{0,i}$ --, therefor.

In Column 14, Line 26, delete "p=7=2m-1" and insert -- $p=7=2^m-1$ --, therefor.

In Column 14, Line 29, delete "aj,i" and insert -- $\alpha_{j,i}$ --, therefor.

In Column 14, Line 29, delete "a0,i" and insert -- $\alpha_{0,i}$ --, therefor.

In Column 14, Line 31, delete "a1, i" and insert -- $\alpha_{1,i}$ --, therefor.

In Column 14, Line 61, delete "$\alpha_{J,i}$," and insert -- $\alpha_{j,i}$ --, therefor.

In Column 17, Line 3, after "approach for" delete "$p=2^m+d$" and insert -- $p=2^m\pm d$ --, therfor.

In Column 17, Line 3, after "general, for" delete "$p=2^m+d$" and insert -- $p=2^m\pm d$ --, therfor.

UNITED STATES PATENT AND TRADEMARK OFFICE

CERTIFICATE OF CORRECTION

PATENT NO. : 7,243,292 B1
APPLICATION NO. : 10/271945
DATED : July 10, 2007
INVENTOR(S) : Naslund et al.

It is certified that error appears in the above-identified patent and that said Letters Patent is hereby corrected as shown below:

In Column 17, Line 22, delete "$\alpha_1$=" and insert -- $\alpha_i$= --, therefor.

In Column 17, Line 25, delete "$\alpha_{0,1}$" and insert -- $\alpha_{0,i}$ --, therefor.

In Column 17, Line 30, delete "$\beta_J$" and insert -- $\beta_j$ --, therefor.

In Column 17, Lines 33-34, delete "$\alpha_{0,1}$, $\alpha_{1,1}$" and insert -- $\alpha_{0,i}$, $\alpha_{1,i}$ --, therefor.

In Column 17, Line 41, delete "$\alpha_{J,i}$," and insert -- $\alpha_{j,i}$ --, therefor.

In Column 17, Line 41, delete "$\alpha_{J,i} \leq 3<2^2$)" and insert -- $\alpha_{j,i} \leq 3<2^2$) --, therefor.

In Column 17, Line 49, delete "$M2=2^m+2^{m+1}+$" and insert -- $M2=2^m+2^{2m+1}+$ --, therefor.

In Column 18, Line 12, delete "$\alpha_{J+1,i}$" and insert -- $\alpha_{j+1,i}$ --, therefor.

In Column 20, Line 5, delete "or" and insert -- for --, therefor.

In Column 25, Line 52, delete "$\alpha_1$ and $\beta_J$" and insert -- $\alpha_i$ and $\beta_j$ --, therefor.

In Column 26, Line 7, delete "$g^x=\alpha_J$" and insert -- $g^x=\alpha_j$ --, therefor.

In Column 26, Line 23, delete "$\beta_{1-J}$" and insert -- $\beta_{i-j}$ --, therefor.

In Column 26, Line 65, delete "ANTILOG(X)=$g^{x}$" and insert -- ANTILOG(x)=$g^x$ --, therefor.

In Column 34, Line 1, delete "$\alpha_1$ and $\beta_1$" and insert -- $\alpha_i$ and $\beta_i$ --, therefor.

In Column 36, Line 31, delete "$(2t-1)_m$" and insert -- (2t-1)m --, therefor.

In Column 36, Line 40, delete "$\beta_J$" and insert -- $\beta_j$ --, therefor.

In Column 37, Lines 28-29, delete "$\alpha_i=(\alpha_{k-1,1}, ..., \alpha_{1,1}, \alpha_{0,1})$" and insert -- $\alpha_i=(\alpha_{k-1,i}, ..., \alpha_{1,i}, \alpha_{0,i})$ --, therefor.

In Column 38, Line 10, delete "$\alpha_1+\alpha_1$" and insert -- $\alpha_i+\alpha_i$ --, therefor.

UNITED STATES PATENT AND TRADEMARK OFFICE

CERTIFICATE OF CORRECTION

PATENT NO. : 7,243,292 B1
APPLICATION NO. : 10/271945
DATED : July 10, 2007
INVENTOR(S) : Naslund et al.

It is certified that error appears in the above-identified patent and that said Letters Patent is hereby corrected as shown below:

In Column 42, Line 43, delete "Sp=" and insert -- $Sp^{-}=$ --, therefor.

In Column 42, Line 55, Equation (35), delete "$=e-(2^{M}+d)(e \text{ div } 2^{m})=e-pr$" and insert -- $=e-(2^{m}+d)(e \text{ div } 2^{m})=e-pr$ --, therefor.

In Column 43, Line 20, delete "$GF(p^{5})$" and insert -- $GF(p^{k})$ --, therefor.

In Column 45, Line 36, delete "$c_J=(a_J+b_J)$" and insert -- $c_j=(a_j+b_j)$ --, therefor.

In Column 45, Line 59, delete "$0 \leq c_J \leq 2^{m}-1+p=2p-2$" and insert -- $0 \leq c_j \leq 2^{m}-1+p=2p-2$ --, therefor.

In Column 45, Line 59, delete "$0 \leq (a_J+b_j)$div" and insert -- $0 \leq (a_j+b_j)$div --, therefor.

In Column 45, Line 60, delete "$c_J$" and insert -- $c_j$ --, therefor.

In Column 45, Line 62, delete "$((c_J \text{ div } 2^{m})-1)p$" and insert -- $((c_j \text{ div } 2^{m})-1)p$ --, therefor.

In Column 47, Line 1, delete "(c=((a+b)&M2))" and insert -- (c1=((a+b)&M2)) --, therefor.

In Column 50, Line 3, delete "$\alpha_1$" and insert -- $\alpha_i$ --, therefor.

In Column 50, Line 7, delete "$\alpha_{J,i}$" and insert -- $\alpha_{j,i}$ --, therefor.

In Column 51, Line 57, delete "$a_J+b_J \leq 2^{m+1}+2d-2$" and insert -- $a_j+b_j \leq 2^{m+1}+2d-2$ --, therefor.

In Column 51, Line 64, delete "$0 \leq (a_j+b_J) \leq 2^{m}2d-2,$" and insert -- $0 \leq (a_j+b_j) \leq 2^{m+1}+2d-2,$ therefor.

In Column 51, Line 67, delete "$h(a_J+b_j) \leq 2^{m}+d-1$" and insert -- $h(a_j+b_j) \leq 2^{m}+d-1$ --, therefor.

In Column 51, Line 67, delete "$a_J+b_j$" and insert -- $a_j+b_j$ --, therefor.

In Column 52, Line 60, delete "$c_J>2^{m}$" and insert -- $c_j \geq 2^{m}$ --, therefor.

In Column 52, Line 63, delete "$c_J<2^{m}$" and insert -- $c_j<2^{m}$ --, therefor.

UNITED STATES PATENT AND TRADEMARK OFFICE

CERTIFICATE OF CORRECTION

PATENT NO. : 7,243,292 B1 
APPLICATION NO. : 10/271945
DATED : July 10, 2007
INVENTOR(S) : Naslund et al.

It is certified that error appears in the above-identified patent and that said Letters Patent is hereby corrected as shown below:

In Column 53, Line 9, delete "$a_J$" and insert -- $a_j$ --, therefor.

In Column 53, Lines 12-13, delete "$c_j - 2p \leq 2^{m+}1-2-2(2^m-d)=2d-2<2^m$" and insert -- $c_j - 2p \leq 2^{m+1}-2-2(2^m-d)=2d-2<2^m$ --, therefor.

In Column 53, Line 16, delete "$c_J \geq 2^m$" and insert -- $c_j \geq 2^m$ --, therefor.

In Column 53, Line 20, delete "$c_J \geq 2^m$" and insert -- $c_j \geq 2^m$ --, therefor.

In Column 53, Line 22, delete "$(c_J \& M2) \neq 0$" and insert -- $(c_j \& M2) \neq 0$ --, therefor.

In Column 55, Line 21, Equation (42), delete "$c_J \geq 2^{m+1}$" and insert -- $c_j \geq 2^{m+1}$ --, therefor.

In Column 55, Line 26, delete "c," and insert -- $c_j$ --, therefor.

In Column 57, Line 35, delete "$g_1$" and insert -- $g_i$ --, therefor.

In Column 59, Line 48, delete "$g'_j \neq g_i$" and insert -- $g'_j \neq g_j$ --, therefor.

In Column 59, Line 50, delete "a" and insert -- $\alpha$ --, therefor.

In Column 59, Line 59, delete "$S_1$" and insert -- $S_i$ --, therefor.

In Column 60, Line 21, Equation (45), delete "$S_J=e_1\eta_{i1}^j+ \ldots +e_r\eta_{ir}^j$" and insert -- $S_j=e_1\eta_{i1}^j+ \ldots +e_r\eta_{ir}^j$ --, therefor.

In Column 60, Line 23, delete "$GF(p^k)$" and insert -- $GF(p^{lk})$ --, therefor.

In Column 60, Line 23, delete "$\eta_{1k}$" and insert -- $\eta_{ik}$ --, therefor.

In Column 60, Line 29, Equation (46), delete "$S_{J+r}+S_{j+r-1}\tau_1+\ldots+S_J\tau_r=0$" and insert -- $S_{j+r}+S_{j+r-1}\tau_1+\ldots+S_j\tau_r=0$ --, therefor.

In Column 60, Line 54, delete "$\eta_J$" and insert -- $\eta_j$ --, therefor.

In Column 60, Line 60, delete "$g_i$" and insert -- $g_j$ --, therefor.

In Column 60, Line 61, delete "$g_J=g'_J-e_J$" and insert -- $g_j=g'_j-e_j$ --, therefor.

UNITED STATES PATENT AND TRADEMARK OFFICE

CERTIFICATE OF CORRECTION

PATENT NO. : 7,243,292 B1
APPLICATION NO. : 10/271945
DATED : July 10, 2007
INVENTOR(S) : Naslund et al.

It is certified that error appears in the above-identified patent and that said Letters Patent is hereby corrected as shown below:

In Column 61, Line 57, Equation (49), delete " $z=g(\cdot)\ g(x)\ \ldots\ (x)\ g.$ " and insert -- $z=g\otimes g\otimes\ldots\otimes g.$ --, therefor.

In Column 65, Line 17, delete "lk" and insert -- $l\cdot k$ --, therefor.

In Column 70, Lines 6-30, delete "The quantity g is an........ (the private key) secret." and insert the same on Line 5 after "is published" as a continuation of paragraph.

In Column 76, Line 48, Equation (53), delete " $Tr(x)=x+x^{p^l}+x^{p^{2l}}+\ldots+x^{p^{n-1}}$ " and insert -- $Tr(x)=x+x^{p^l}+x^{p^{2l}}+\cdots+x^{p^{n-l}}$ --, therefor.

In Column 76, Line 53, delete "$x_{i+1}=I(f(x_1))$" and insert -- $x_{i+1}=I(f(x_i))$ --, therefor.

In Column 78, Line 47, in Claim 11, delete "are processed" before "by parallel".

In Column 79, Line 67, in Claim 21, delete "are processed" before "by parallel".

Signed and Sealed this

Ninth Day of September, 2008

JON W. DUDAS
*Director of the United States Patent and Trademark Office*